(12) United States Patent
Ianelli et al.

(10) Patent No.: US 6,788,204 B1
(45) Date of Patent: Sep. 7, 2004

(54) SURFACE-WAVE TRANSDUCER DEVICE AND IDENTIFICATION SYSTEM WITH SUCH DEVICE

(75) Inventors: Zbigniew Ianelli, Berlin (DE); Manfred Koslar, Berlin (DE)

(73) Assignee: Nanotron Gesellschaft fur Mikrotechnik mbH, Berlin (DE)

( * ) Notice: Subject to any disclaimer, the term of this patent is extended or adjusted under 35 U.S.C. 154(b) by 0 days.

(21) Appl. No.: 09/517,339

(22) Filed: Mar. 2, 2000

(30) Foreign Application Priority Data

Mar. 15, 1999 (DE) .......................................... 199 11 369

(51) Int. Cl.$^7$ .............................................. G08B 13/14
(52) U.S. Cl. ............... 340/572.1; 340/5.25; 310/313 R; 333/154; 333/195
(58) Field of Search ................ 340/572.1, 572.2–572.9, 340/5.25, 5.8, 5.2, 5.7, 10.1; 310/313 R; 333/193, 195, 150, 151, 153, 156

(56) References Cited

U.S. PATENT DOCUMENTS 3,169,242 A * 2/1965 Davis et al. ............... 340/10.4

(List continued on next page.)

FOREIGN PATENT DOCUMENTS

AU         B-32537       7/1993

(List continued on next page.)

OTHER PUBLICATIONS

Abstract: F. Schmidt, et al., "Wireless Interrogator System for SAW–Identification Marks and SAW–Sensor Components", 1996 Proceedings IEEE International Frequency Control Symposium, pp. 208–215.

(List continued on next page.)

*Primary Examiner*—Benjamin C. Lee
(74) *Attorney, Agent, or Firm*—Christie, Parker & Hale, LLP

(57) ABSTRACT

The invention relates to a surface-wave transducer device—also called TAGs—and to identification systems with this device.

DE 42 17 049 discloses a passive surface sensor which can be interrogated in wireless mode. In this context, energy is transmitted by radio to the sensor using an interrogation device, the interrogation being done by means of chirped transmission signals. The sensor has transducers and reflectors. The reflectors reflect the chirp signal in a time-staggered sequence, so that the sensor returns a time-staggered chirp signal to the interrogation device. The reflection principle means that the surface-wave sensor described above (also called SAW—surface acoustic wave—sensor in the following text) has a very high insertion loss of the order of 50 dB, for example. When the chirp signal has been received by an SAW interdigital transducer as the input transducer, this transducer produces a surface wave which propagates on the substrate of the SAW arrangement in the direction of the reflectors. When an SAW is received, each individual reflector element returns a correspondingly reflected SAW to the SAW transducer, which for its part produces an electromagnetic signal from the SAW. However, since each reflector element returns not just one SAW to the SAW transducer, but rather the reflector elements also reflect signals amongst one another, the reflections are inevitably relatively small, and a large part of the energy coming from the SAW transducer is lost in the reflector arrangement, so that only a low output power can be achieved. The problem of "internal reflection" from the reflectors cannot be avoided in principle.

The object of the invention is to provide a surface-wave transducer device which has a low insertion loss, allows a considerably greater interrogation distance than with previously known TAGs, and has an increased bit capacity. The device should enable free programming that is simple to perform. The invention proposes a surface transducer device having the features according to claim 1. Advantageous developments are described in the subclaims.

Surface-wave transducer device comprising the combination of a first transmitter device of the dispersive type and a second transmitter device of the non-dispersive type, comprising a multiplicity of n non-dispersive transducers which can be coded or are coded with an identification code.

57 Claims, 56 Drawing Sheets

U.S. PATENT DOCUMENTS

| | | | | |
|---|---|---|---|---|
| 3,289,114 A | * | 11/1966 | Rowen | 333/150 |
| 3,551,837 A | * | 12/1970 | Speiser et al. | 333/154 |
| 3,706,094 A | * | 12/1972 | Cole et al. | 342/44 |
| 3,760,299 A | * | 9/1973 | Vasile | 333/51 |
| 3,883,831 A | * | 5/1975 | Williamson et al. | 333/153 |
| 3,961,290 A | * | 6/1976 | Moore | 333/150 |
| 4,059,831 A | | 11/1977 | Epstein | 342/44 |
| 4,096,977 A | | 6/1978 | Barville et al. | 224/148.6 |
| 4,399,441 A | | 8/1983 | Vaughan et al. | 342/50 |
| 4,468,639 A | * | 8/1984 | Green et al. | 333/153 |
| 4,604,623 A | | 8/1986 | Skeie | 342/51 |
| 4,860,017 A | * | 8/1989 | Grudkowski | 342/201 |
| 4,994,798 A | * | 2/1991 | McColl | 333/195 |
| 5,095,240 A | * | 3/1992 | Nysen et al. | 310/313 R |
| 5,237,235 A | * | 8/1993 | Cho et al. | 310/313 R |
| 5,359,250 A | * | 10/1994 | Toda | 310/313 R |
| 5,374,863 A | | 12/1994 | Mochizuki et al. | 310/313 D |
| 5,436,631 A | | 7/1995 | Magori et al. | 342/42 |
| 5,446,447 A | * | 8/1995 | Carney et al. | 340/572.4 |
| 5,469,170 A | | 11/1995 | Mariani | 342/51 |
| 5,536,989 A | * | 7/1996 | Skudera, Jr. | 310/313 R |
| 5,625,341 A | * | 4/1997 | Giles et al. | 340/10.34 |
| 5,668,431 A | * | 9/1997 | Saw et al. | 310/313 R |
| 5,691,698 A | * | 11/1997 | Scholl et al. | 340/572.5 |
| 5,734,326 A | | 3/1998 | Skudera, Jr. | 340/572.1 |
| 5,815,055 A | * | 9/1998 | Eguchi et al. | 333/193 |
| 5,841,214 A | | 11/1998 | Schmidt et al. | 310/313 D |
| 6,144,288 A | * | 11/2000 | Jahn et al. | 340/10.33 |

FOREIGN PATENT DOCUMENTS

| | | |
|---|---|---|
| DE | 31 02 334 | 12/1981 |
| DE | 34 38 051 | 4/1986 |
| DE | 34 38 052 | 4/1986 |
| DE | 34 38 053 | 4/1986 |
| DE | 42 00 076 | 8/1993 |
| DE | 42 17 049 | 11/1993 |
| DE | 43 10 610 | 10/1994 |
| DE | 43 36 504 | 3/1995 |
| DE | 43 36 897 | 3/1995 |
| DE | 44 05 647 | 8/1995 |
| GB | 2165 411 A | 4/1986 |
| GB | 2165 423 A | 4/1986 |
| GB | 2165 425 A | 4/1986 |

OTHER PUBLICATIONS

Abstract: L. Reindl, et al., "Programmable Reflectors for SAW–ID–Tags" 1993 Ultrasonics Symposium Proceedings, pp. 125–130, vol. 1 of 2 vol. 1270 pp. 6 refs.

Abstract: K. Yamanouchi, et al., "2.5 GHz–Range SAW Propagation and Reflection Characteristics and Application to Passive Electronic Tag and Matched Filtered", IEEE 1993 Ultrasonics Symposium Proceedings, pp. 1267–1270 vol. 2 of 2 vol.

Abstract: W. Buff, et al., "On–Chip Correlation—A New Approach to Narrow band SAW Identification Tags" 1998 IEEE Ultrasonics Symposium Proceedings, vol. 1, pp. 385–388.

Abstract: "Saw Delay Lines for Wireless Requestable Conventional Sensors", IEEE Ultrasonics Symposium, Japan, Oct. 1998, AN 1999:6396395.

* cited by examiner

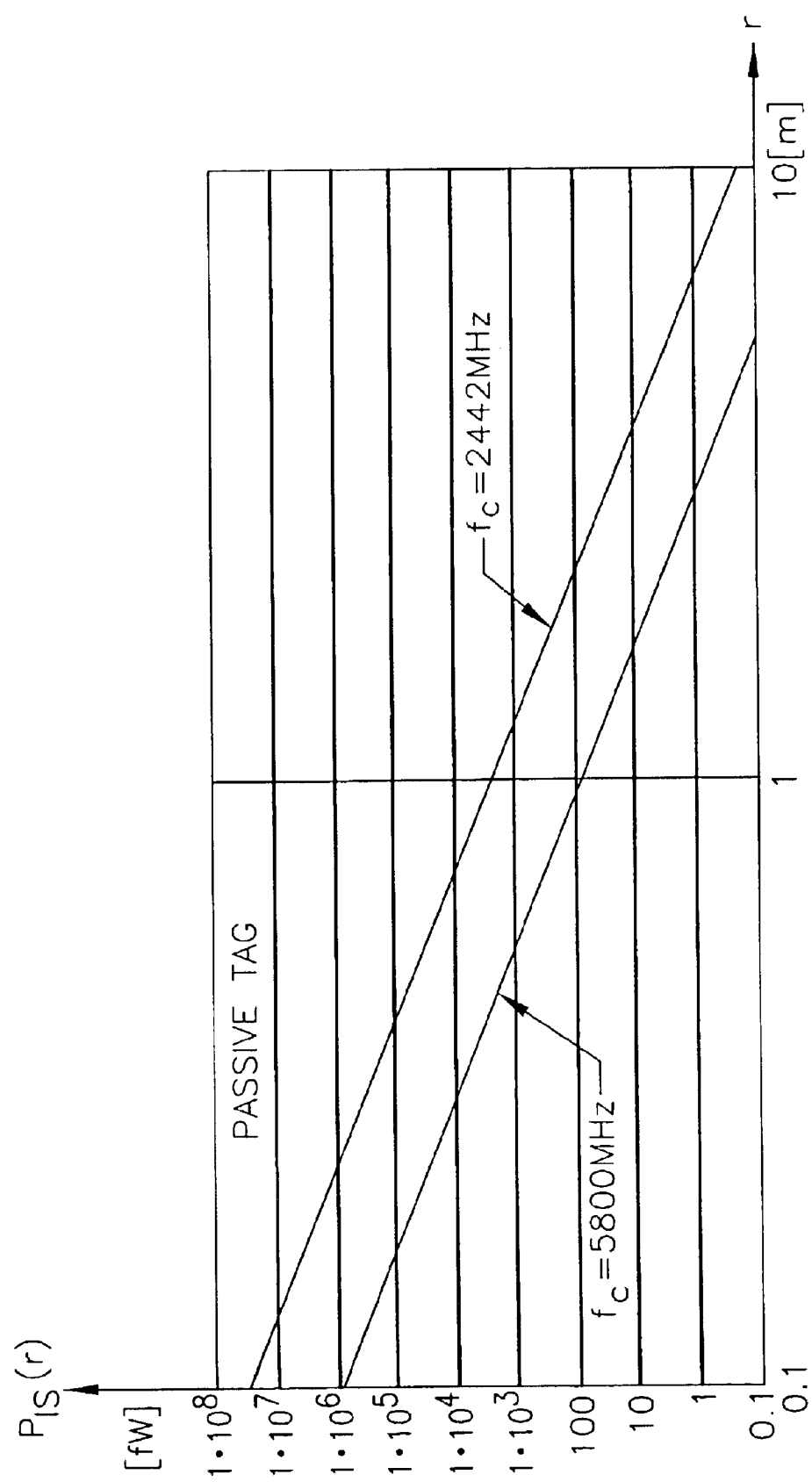

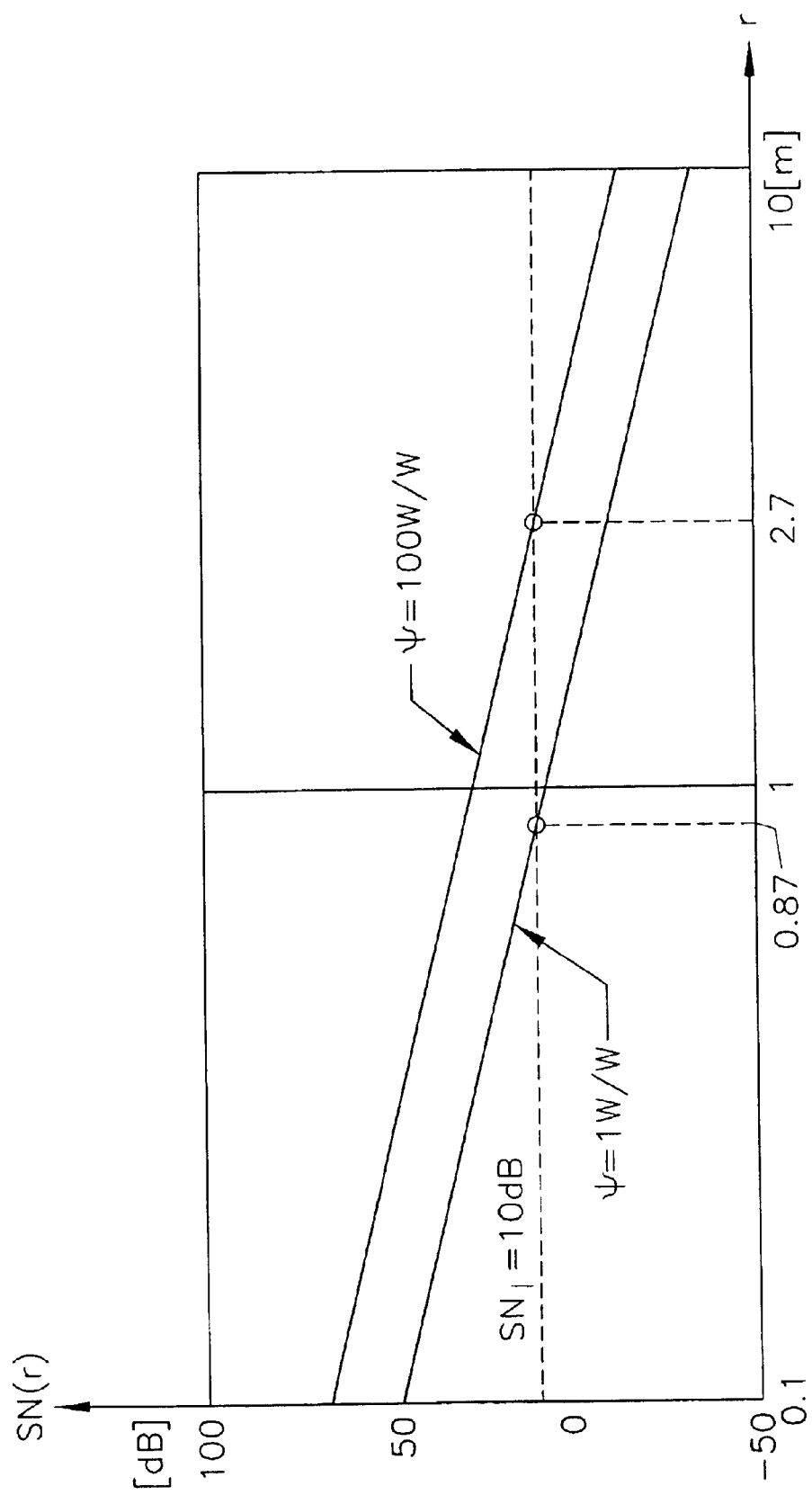

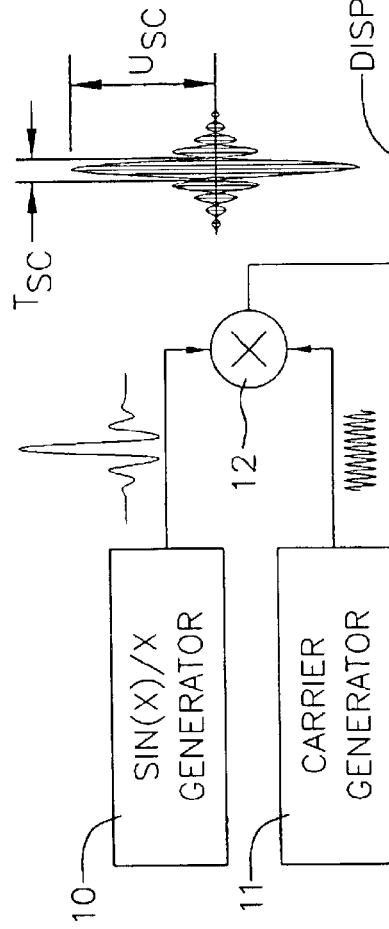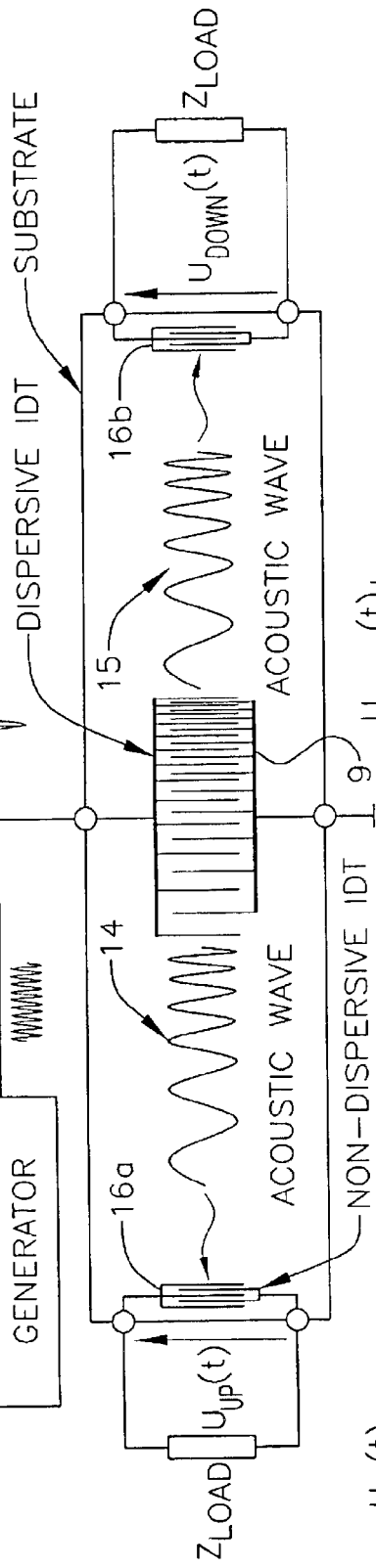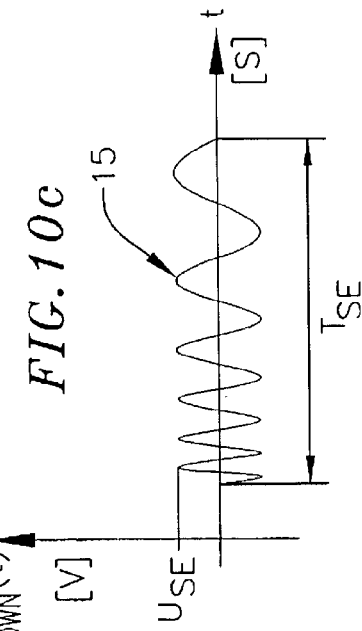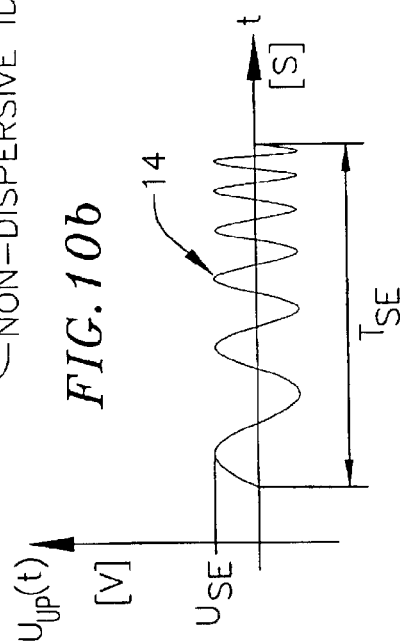
FIG. 10
FIG. 10a
FIG. 10b
FIG. 10c

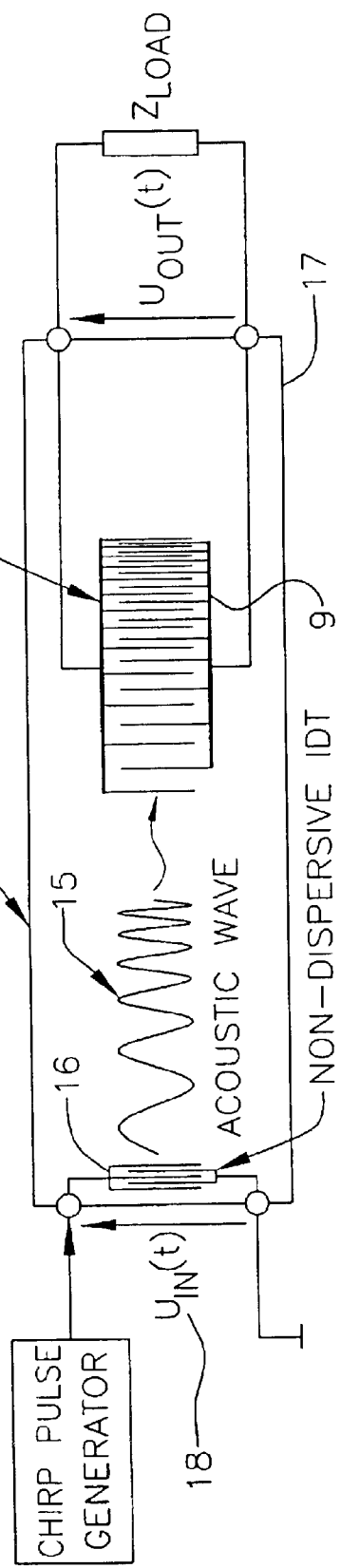
FIG. 11
FIG. 11a
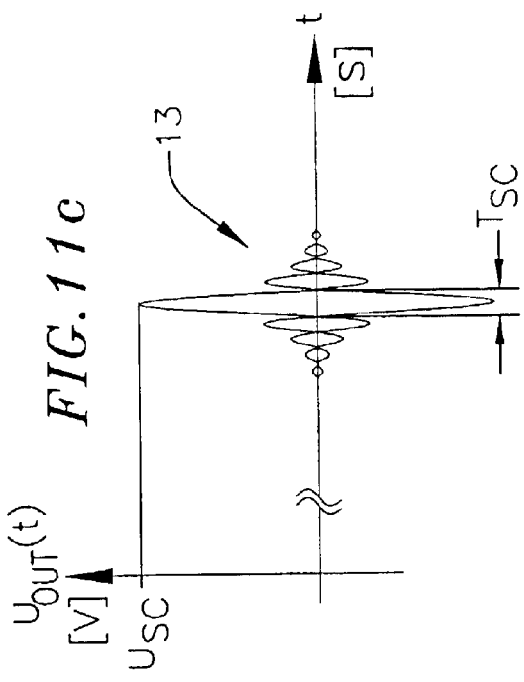
FIG. 11c
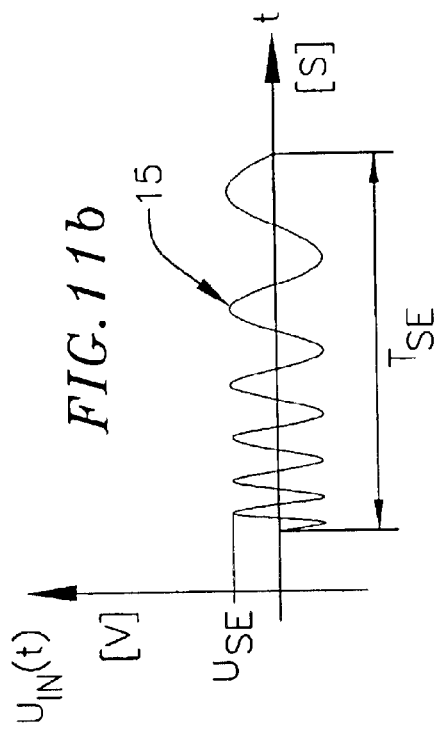
FIG. 11b

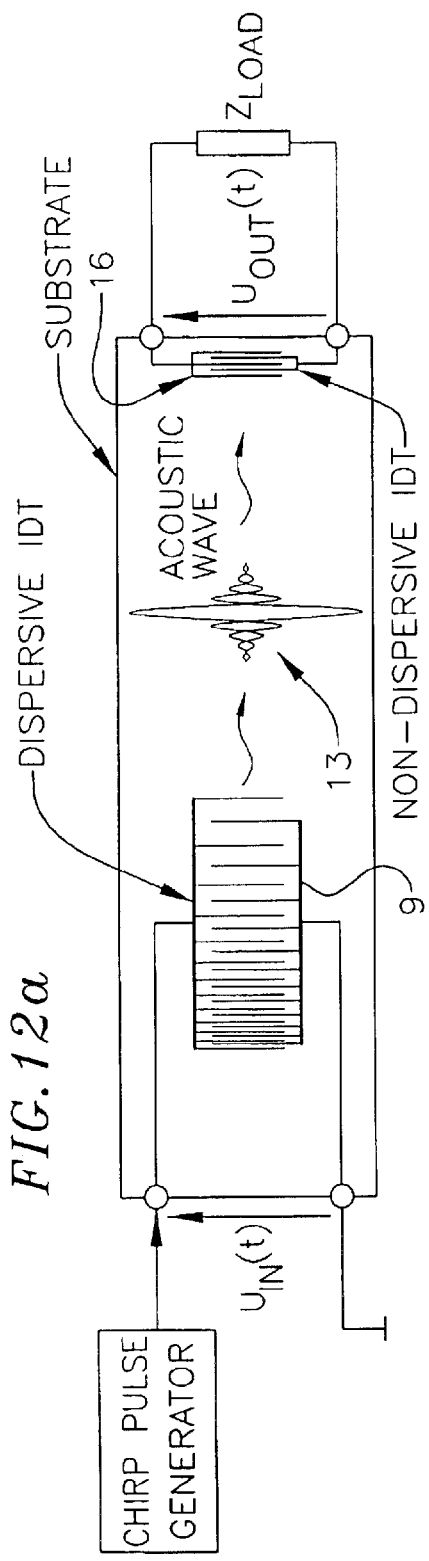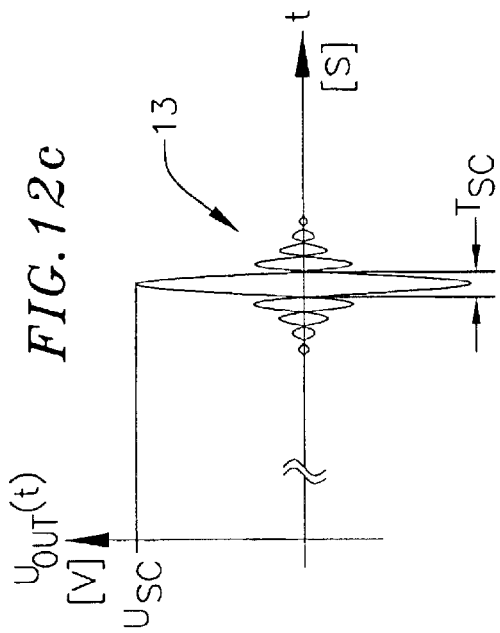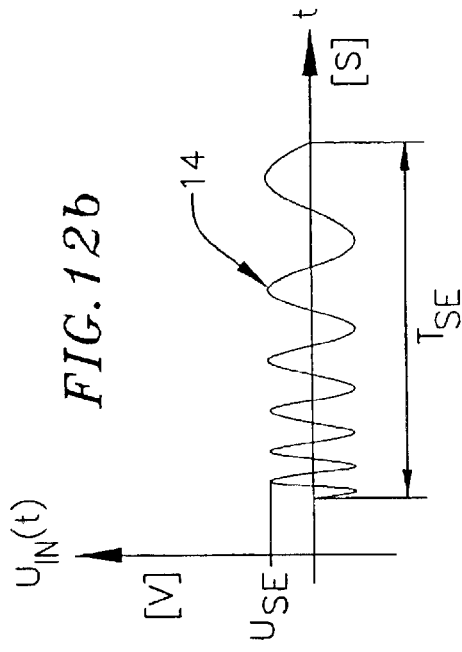
FIG. 12
FIG. 12a
FIG. 12b
FIG. 12c

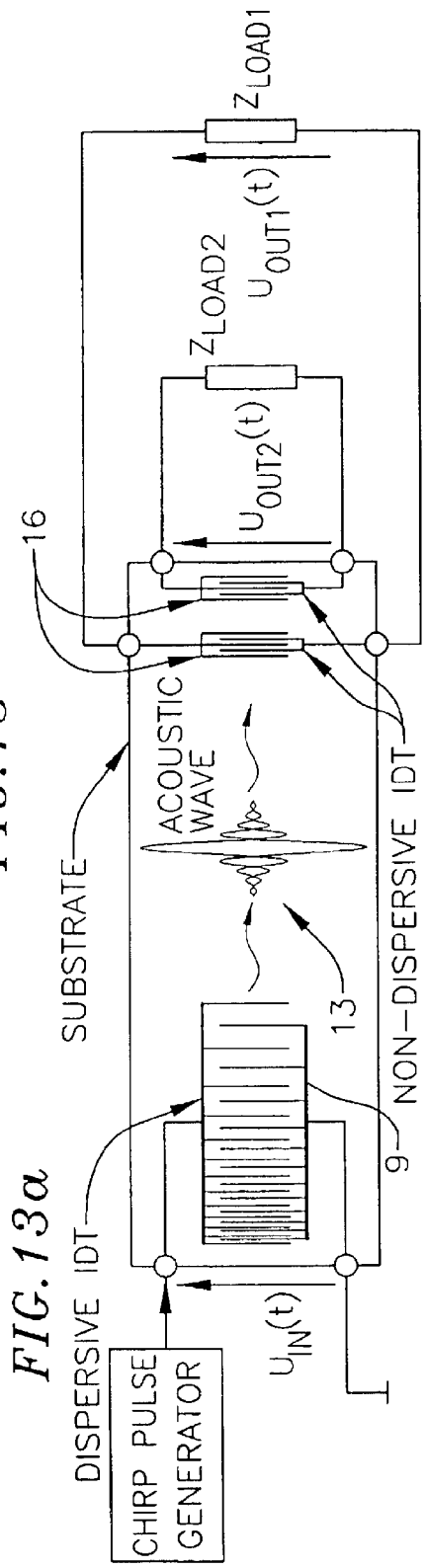
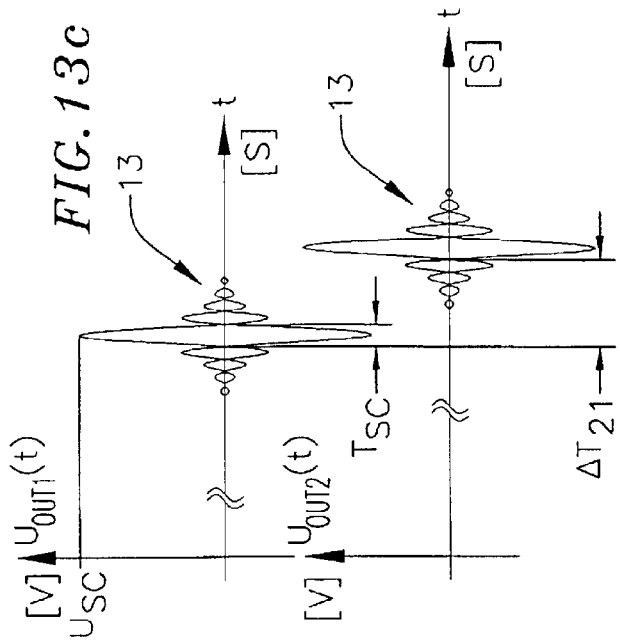
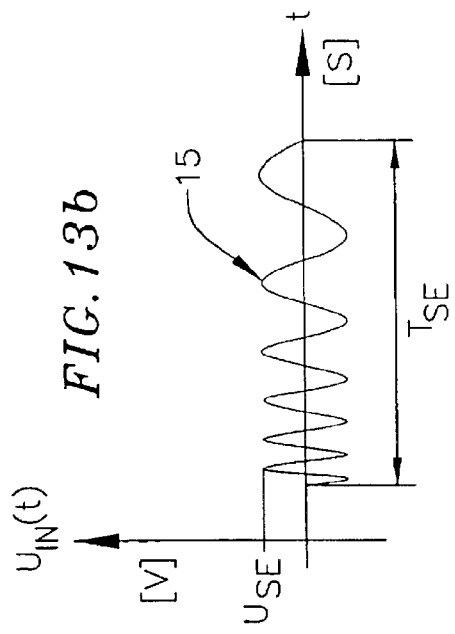
FIG. 13
FIG. 13a
FIG. 13b
FIG. 13c

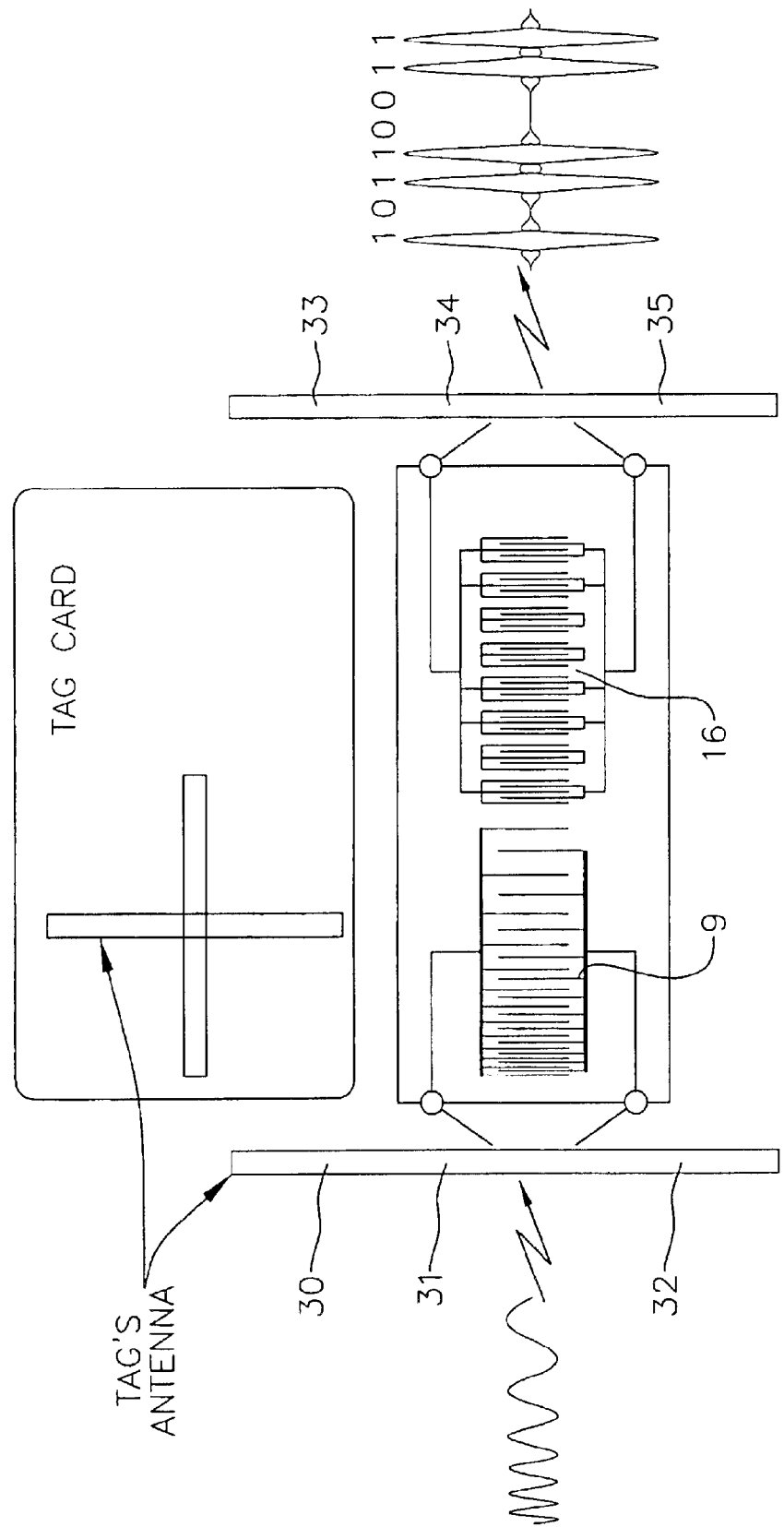

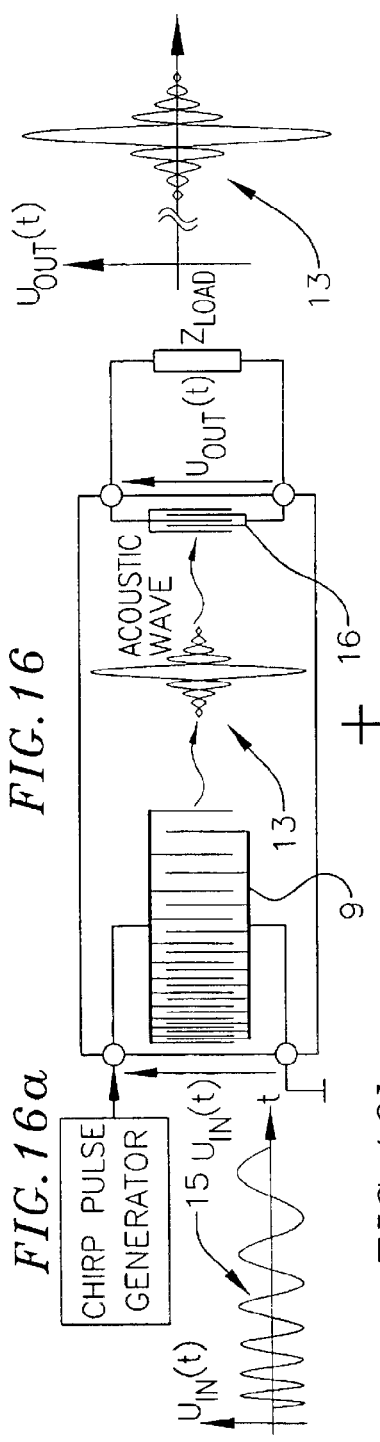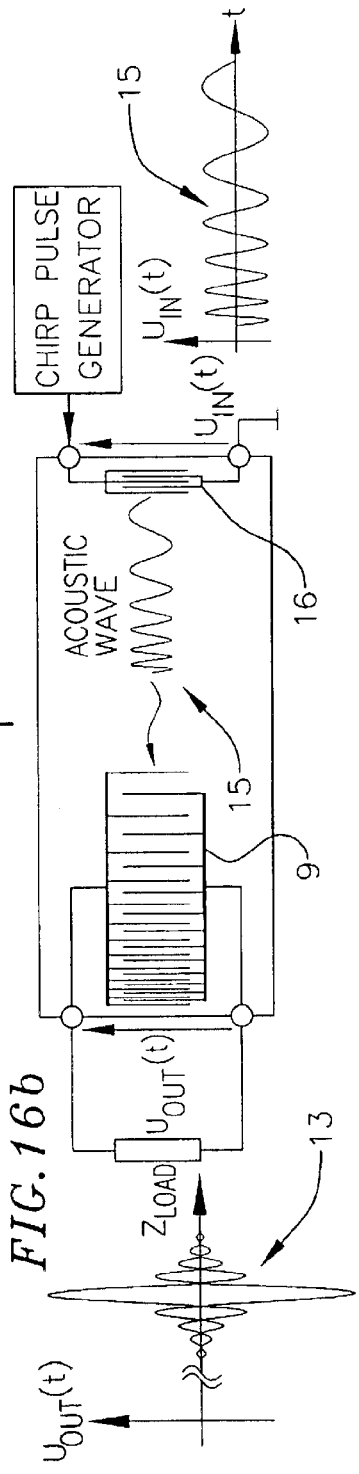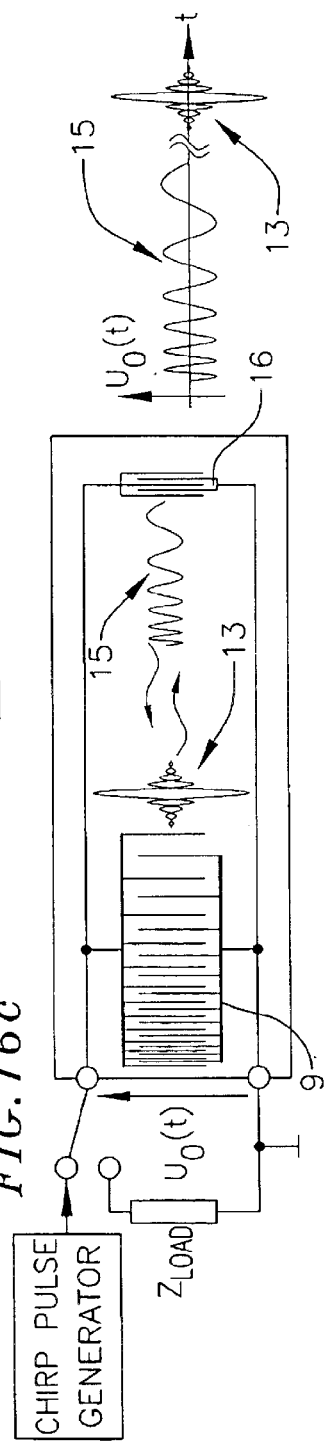

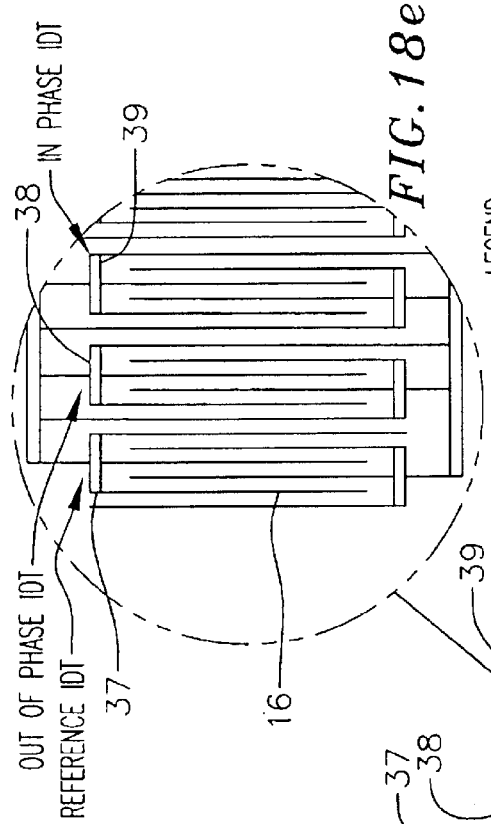
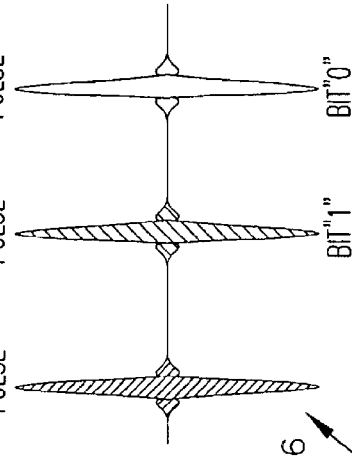
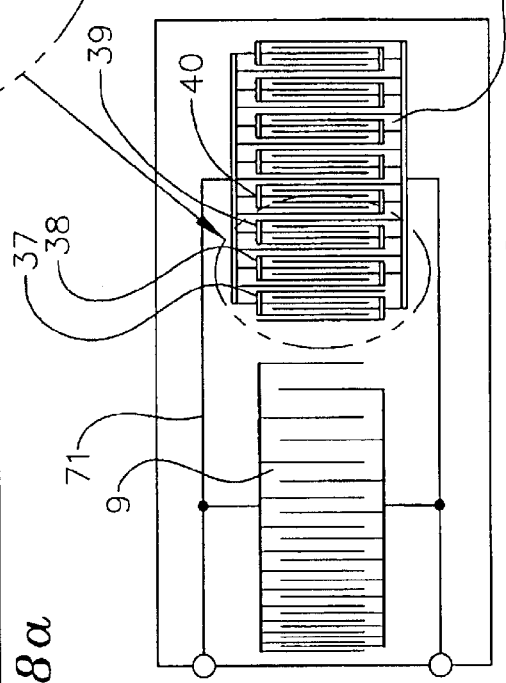
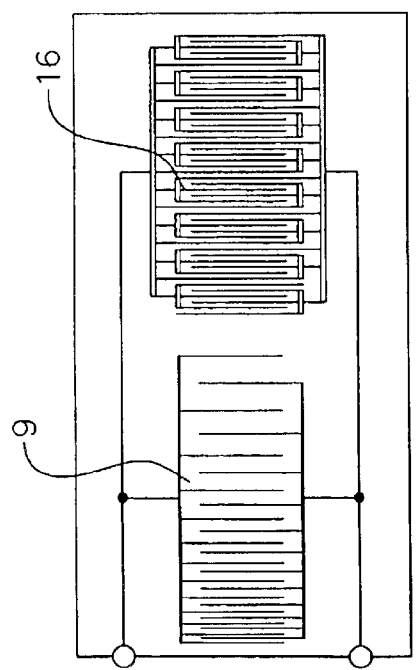
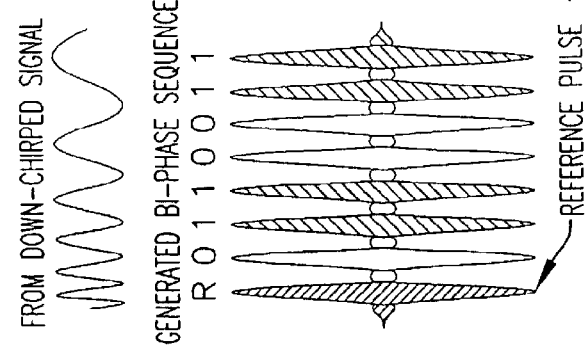
FIG. 18

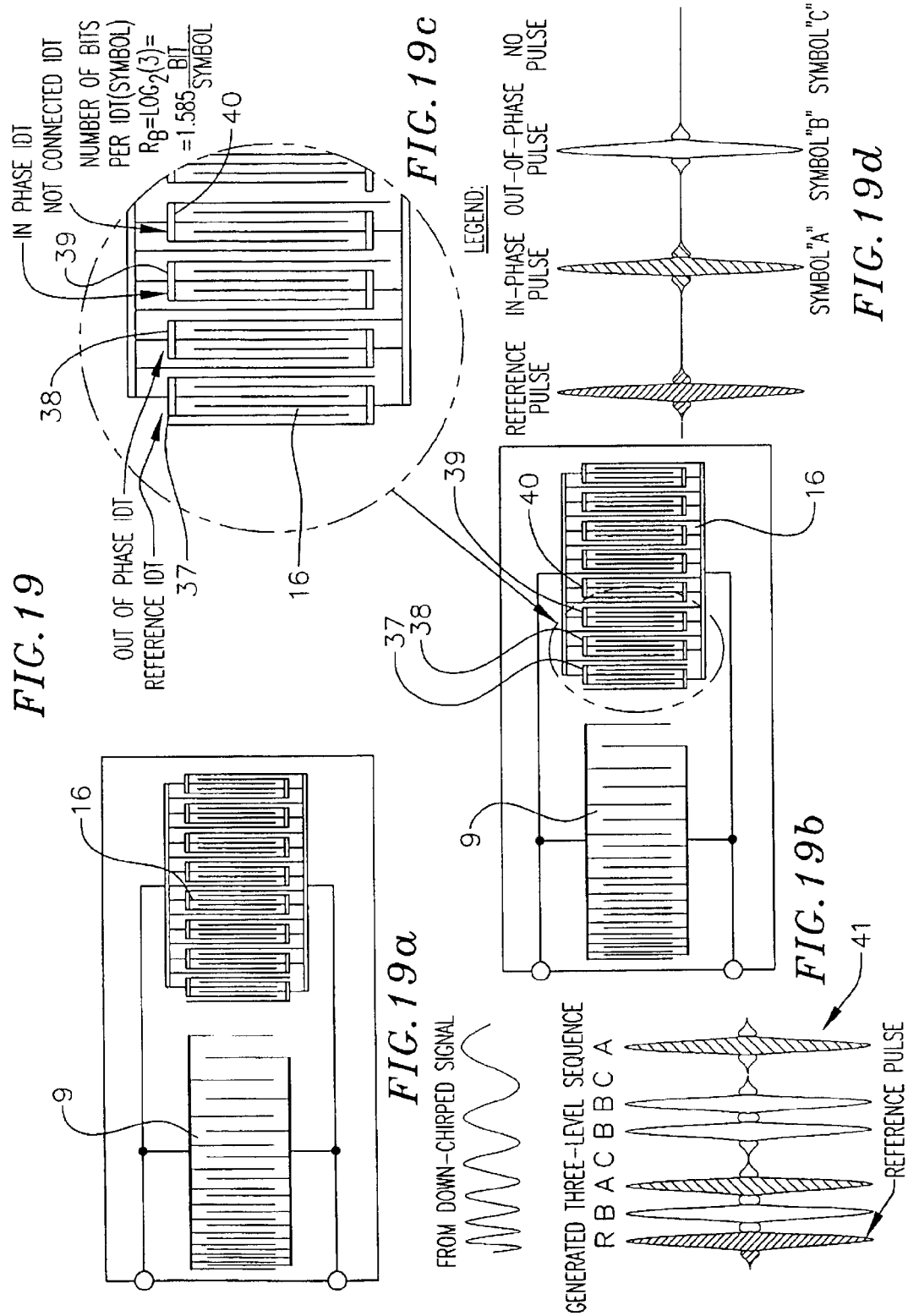

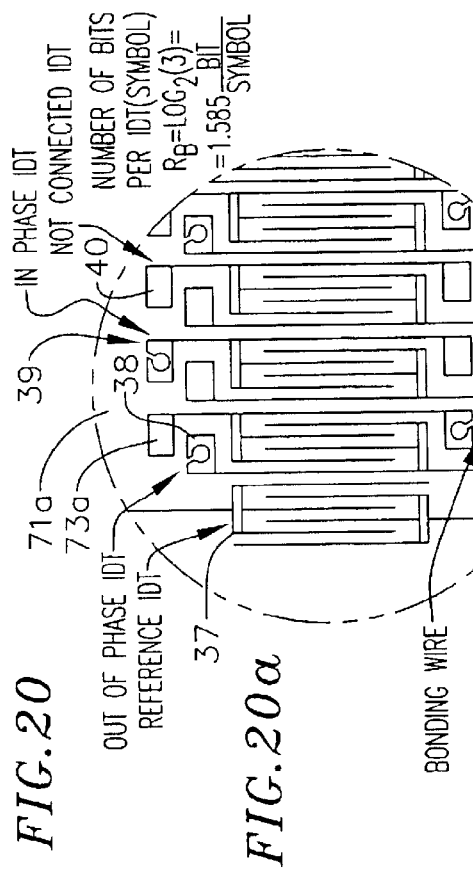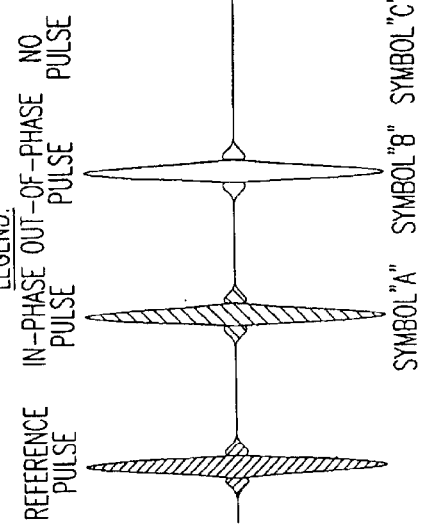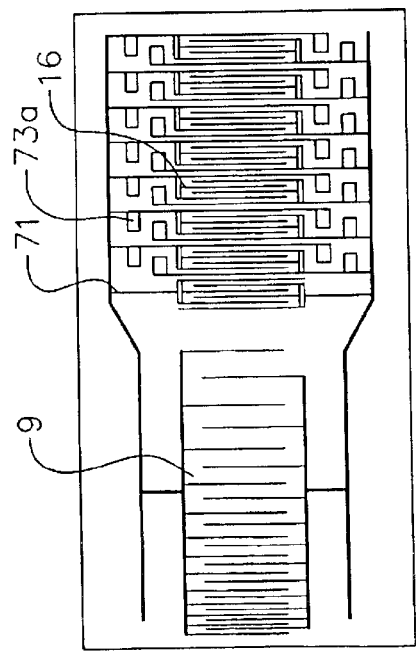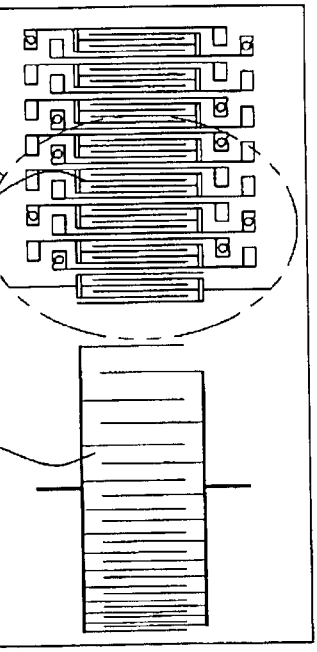

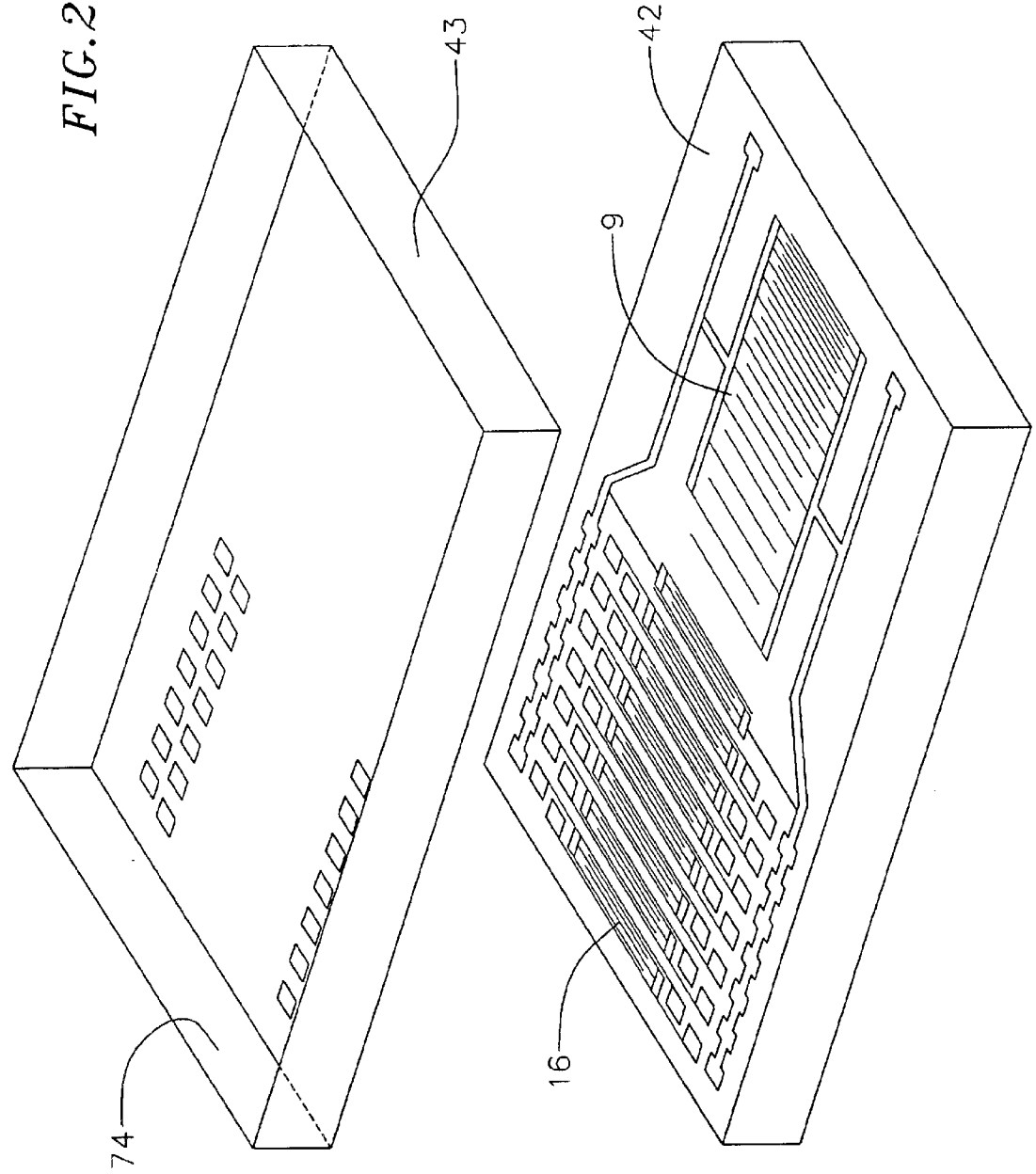

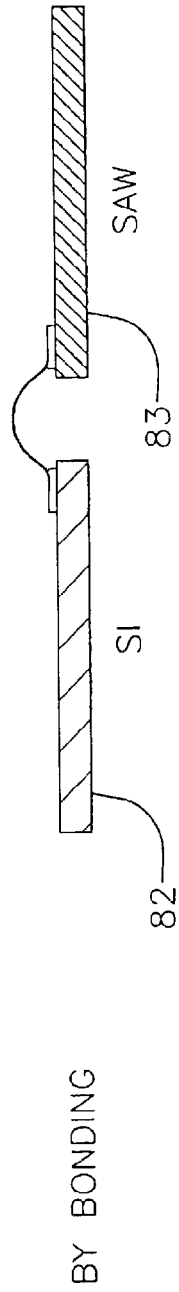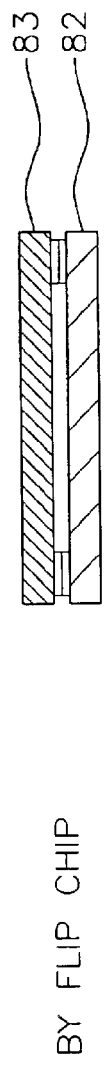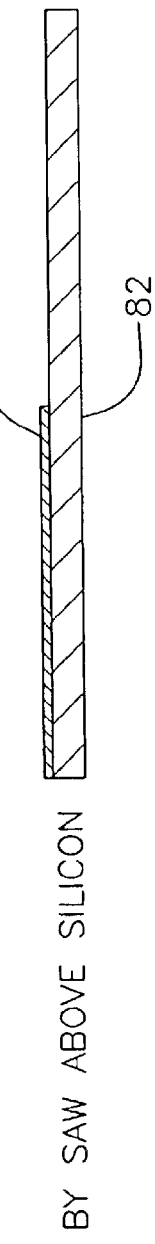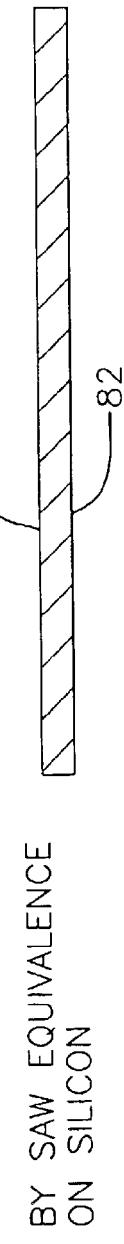
FIG. 30

SURFACE-WAVE TRANSDUCER DEVICE AND IDENTIFICATION SYSTEM WITH SUCH DEVICE

The invention relates to a surface-wave transducer device—also called TAGs—and to identification systems in which it is used.

DE 42 17 049 discloses a passive surface sensor which can be interrogated in wireless mode. In this context, energy is transmitted by radio to the sensor from an interrogation device, the interrogation being done by means of chirped transmission signals. The sensor has transducers and reflectors. The reflectors reflect the chirp signal in a time-staggered sequence, so that the sensor returns a time-staggered chirp signal to the interrogation device. The reflection principle means that the surface-wave sensor described above (also called SAW—surface acoustic wave—sensor in the following text) has a very high insertion loss of the order of 50 dB, for example. When the chirp signal has been received by an SAW interdigital transducer as the input transducer, this transducer produces a surface wave which propagates on the substrate of the SAW arrangement in the direction of the reflectors. When an SAW is received, each individual reflector element returns a correspondingly reflected SAW to the SAW transducer which, for its part, produces an electromagnetic signal from the SAW. However, since each reflector element returns not just one SAW to the SAW transducer, but rather the reflector elements also reflect signals amongst one another, the reflections are inevitably relatively small, and a large part of the energy coming from the SAW transducer is lost in the reflector arrangement, so that only a low output power can be achieved. The problem of "internal reflection" from the reflectors cannot be avoided, in principle.

U.S. Pat. No. 5,734,326 discloses an SAW arrangement which comprises a synchronisation transducer and a multiplicity of tap transducers. When excited by a radio-frequency pulse signal, this SAW arrangement transmits a specific identification signal, so that the receiver in the interrogation unit can receive and process the transmitted TAG signal. A prerequisite of this processing, however, is that a filter in the interrogation unit is tuned exactly to the TAG from which the TAG signal is received. Accordingly, a prerequisite of the processing of a TAG signal is that the interrogation unit already knows which TAG identifier it has to search for, so that the filter in the interrogation unit can be preset accordingly for utilising the TAG signal. Hence, U.S. Pat. No. 5,734,326 discloses a TAG system which has very restricted options for application. If the interrogation unit does not know the identification of the TAG, it is impossible in practice to tune the filter in the interrogation unit to the TAG, because it would take too long to interrogate every conceivable variant.

A further disadvantage of the TAG disclosed in U.S. Pat. No. 5,734,326 is that the tap transducers are not programmable, which makes them considerably more complicated and expensive to manufacture.

If the TAG were intended to be capable of long interrogation range, the energy of the RF pulse signal would have to be increased considerably. To do this, however, the signal would have to have such a high output level that it would infringe the normal conditions of licensing authorities, which limit the signal forms and power spectra of transmitters to a specific level so that no undesirable interference is produced, such as is known from radar technology, although these are permitted there in a specific frequency range owing to important monitoring functions (air traffic monitoring).

Furthermore, "1996 IEEE International Frequency Control Symposium", pages 208–215 "Wireless Integrated System for SAW-Identification Marks and SAW-Sensor Components", and 1993 "Ultrasonic Symposium", pages 125–130, "Programmable Reflectors for SAW-ID-Tags", and "IEEE Ultrasonics Symposium", October 1998, "SAW Delay Lines for Wirelessly Requestable Conventional Sensors", and 1993 "Ultrasonics Symposium", pages 1267–1270 "2.5 GHz-Range SAW Propagation and Reflections Characteristics and Application to Passive Electronic Tag and Matched Filter" and, in addition, IEEE "Ultrasonics Symposium 1998" "On-Chip Correlation—A New Approach to Narrowband SAW Identification Tags" disclose further SAW TAG arrangements which likewise have a very high insertion loss (TAG attenuation) and accordingly also permit only a very short distance of 1.3 m that can lie between an interrogation device and the TAG in order that any communication at all is possible between the interrogation unit and the TAG. Furthermore, the known SAW TAG devices are characterised by a low bit capacity of approximately 20 bits.

In addition, various identification systems with coded passive transponders or SAW structures are disclosed in the following publications: DE 44 05 647 A1, DE 42 00 076 A1, DE 34 38 050 A1, U.S. Pat. No. 4,059,831, DE 34 38 053 C2, DE 43 36 504 C1, DE 43 10 610 A1, DE 34 38 052 C2, DE 43 36 897 C1, DE 31 02 334 C2, U.S. Pat. No. 4,096,977, U.S. Pat. No. 5,734,326, U.S. Pat. No. 5,374,863, U.S. Pat. No. 4,604,623, DE 34 38 051 A1 and DE 34 38 051 C2. However, all these publications disclose systems which have certain disadvantages; for example, either the interrogation distances are too short (<1.3 m), the insertion losses are correspondingly too high or the solutions illustrated are virtually infeasible from the point of view of cost or permit only poor flexibility on account of a low bit capacity.

The object of the invention is to provide a surface-wave transducer device which has a low insertion loss, allows a considerably greater interrogation distance than with previously known TAGs, and has an increased bit capacity. The device should enable free programming that is simple to perform. The invention proposes a surface transducer device having the features according to claim 1. Advantageous developments are described in the subclaims.

The invention is based on the idea of providing a surface-wave transducer device with a combinational arrangement of a dispersive transducer device having a non-dispersive transducer device. A dispersive transducer device is capable of using a chirp signal to produce a surface-wave pulse signal, which is received by the non-dispersive transducer device, comprising n transducers, and is converted by this non-dispersive transducer device into a pulse code signal sequence which identifies the surface-wave transducer device. The pulse signal sequence is then transmitted by the surface-wave transducer device via an antenna and can be received by an interrogation unit within an identification system and evaluated on the basis of the identifier.

An SAW transducer device according to the invention is characterised by interrogation distances which are significantly longer than those known hitherto, has a very high bit capacity available and is very simple to program. The reason for the long interrogation distance and the correspondingly low insertion loss is that, once a signal is received from an interrogation device (interrogator), the SAW transducer device according to the invention converts the interrogation signal in the dispersive SAW transducer device into a time-compressed surface-wave signal which is received by the non-dispersive transducer device.

The non-dispersive transducer device also receives the interrogation signal and produces corresponding SAW signals which are received by the dispersive transducer. After receiving the signals, the said dispersive transducer converts the surface waves into corresponding electromagnetic signals. The identical transit times of the signals from the dispersive transducer device to the non-dispersive transducer device and vice versa mean that two identical signals are superimposed on one another at the output, so that the code signal to be transmitted by the TAG can have a higher signal power. Accordingly, the TAG's response signal to an interrogation signal comprises two components; since both components are transmitted synchronously by the TAG, however, and both signal components can have the identical signal form, the TAG according to the invention can have a higher power efficiency and the TAG transmission signal has a considerably higher output level than the TAG signal in comparative SAW arrangements, the output level always being referred to comparable interrogator interrogation signals.

The surface-wave transducer device according to the invention advantageously does not have any reflectors, so that the insertion loss is considerably lower than with reflector arrangements. The insertion loss in known SAW TAGs with a reflector arrangement is about 50 dB. A surface-wave transducer device according to the invention and hence a TAG according to the invention allows the insertion loss to be reduced to a range of between approximately 30 and 35 dB, which drastically increases the interrogation range. The interrogation signal used is expediently a chirp signal which is converted into a time-compressed pulse signal on the SAW TAG according to the invention. In the case of a chirp interrogation signal, the TAG response signal comprises time-compressed pulse signals which are shifted in time, the modulation of the response signals depending on the programming of the n transducers within the non-dispersive transducer arrangement. If, by way of example, an individual transducer from the n transducers is not connected to the common bus lines, then this transducer also produces no response signal. Such a response can be regarded as being a logic "zero".

The advantages of the invention and particularly expedient embodiments are explained below with reference to various exemplary embodiments in the drawings, in which:

FIG. 1 shows a block diagram of an identification system having an identification device according to the invention;

FIG. 2 composed of FIGS. 2a, 2b, and 2c shows various diagrams with measurements for the signal-to-noise ratio under different conditions;

FIG. 3 not used

FIG. 4 not used

FIG. 5 composed of FIGS. 5a, 5b and 5c shows an illustration of the reception power in the TAG as a function of the range between the TAG and the interrogator;

FIG. 6 compose of FIGS. 6a and 6b shows an illustration of the reception power in the interrogation device as a function of the TAG range;

FIG. 7 composed of FIGS. 7a, 7b, 7c, 7d, 7e and 7f shows an illustration of a chirp signal and of a pulse signal generated from it;

FIG. 8 not used

FIG. 9 composed of FIGS. 9a and 9b shows an illustration of the signal-to-noise ratio under various conditions and using several measurements;

FIG. 10 composed of FIGS. 10a, 10b and 10c shows an illustration of a complementary dispersive delay line for producing chirp pulse;

FIG. 11 composed of FIGS. 11a, 11b and 11c shows an illustration of a dispersive delay line for producing a chirp pulse compression;

FIG. 12 composed of FIGS. 12a, 12b and 12c shows an illustration of a dispersive delay line with a method reciprocal to FIG. 11 for producing a chirp pulse compression;

FIG. 13 composed of FIGS. 13a, 13b and 13c shows an illustration of a surface-wave transducer device having a dispersive transducer device and having a transducer device with two non-dispersive transducers;

FIG. 14 composed of FIGS. 14a and 14b shows an illustration of a surface-wave transducer arrangement according to the invention before and after programming/coding with a dispersive transducer and several non-dispersive transducers;

FIG. 15 shows an illustration of the basic operation of a TAG having a dispersive transducer at the input and a coded non-dispersive transducer device at the output;

FIG. 16 composed of FIGS. 16a, 16b and 16c shows a basic illustration of the operation of a dispersive SAW transducer device having a common input and output line;

FIG. 17 shows a basic illustration of an SAW TAG according to the invention;

FIG. 18 composed of FIGS. 18a, 18b, 18c, 18d and 18e shows an illustration of a dual-phase coded SAW transducer device according to the invention;

FIG. 19 composed of FIGS. 19a, 19b, 19c and 19d shows an illustration of a programmed TAG with a response signal having three logic states A, B, C;

FIG. 20 composed of FIGS. 20a, 20b and 20c shows an illustration of a TAG programmed using a connecting link (bonding);

FIG. 21 shows an illustration of an SAW transducer device according to the invention programmed using a silicon chip;

Figure 31:
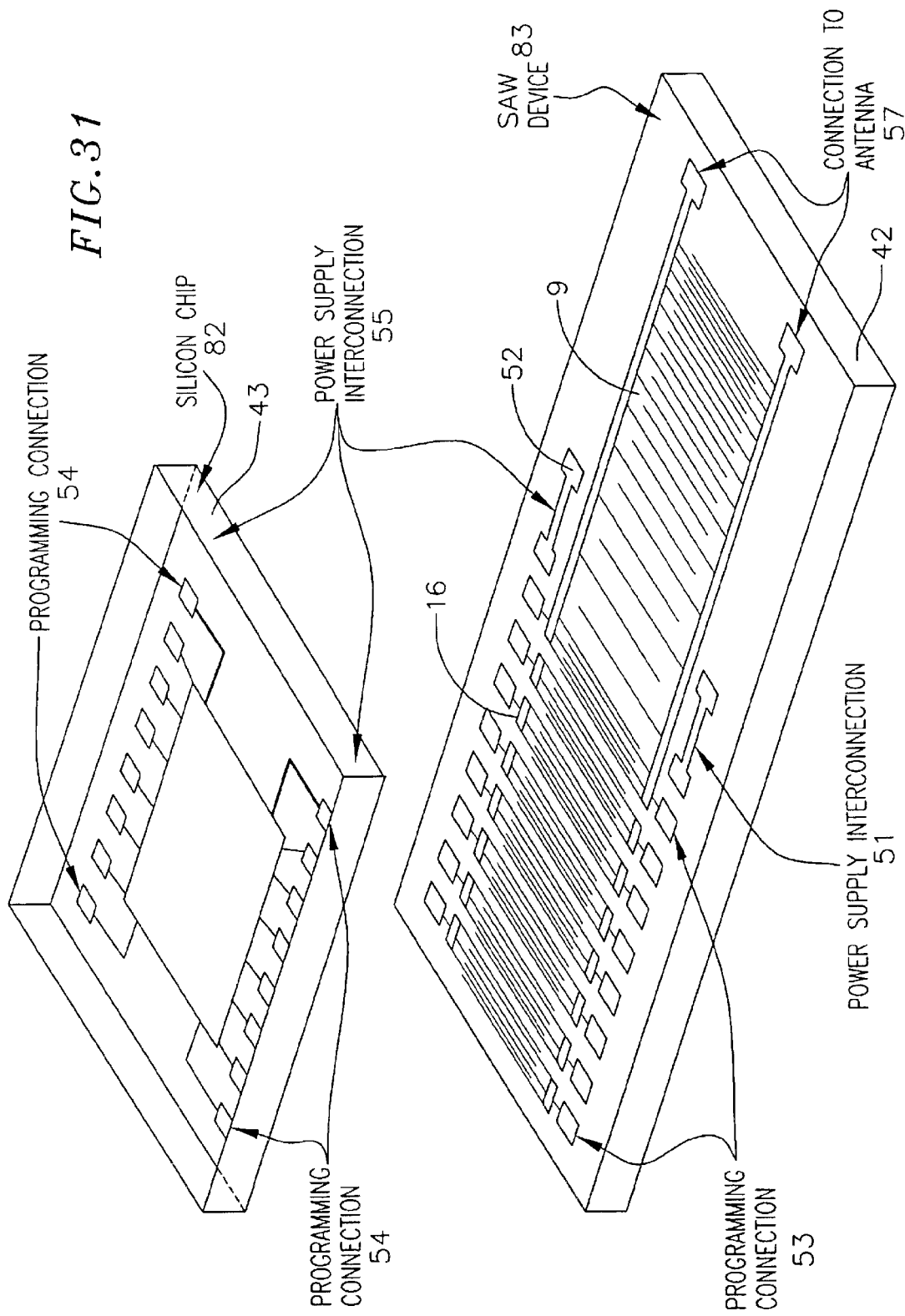
Figure 32:
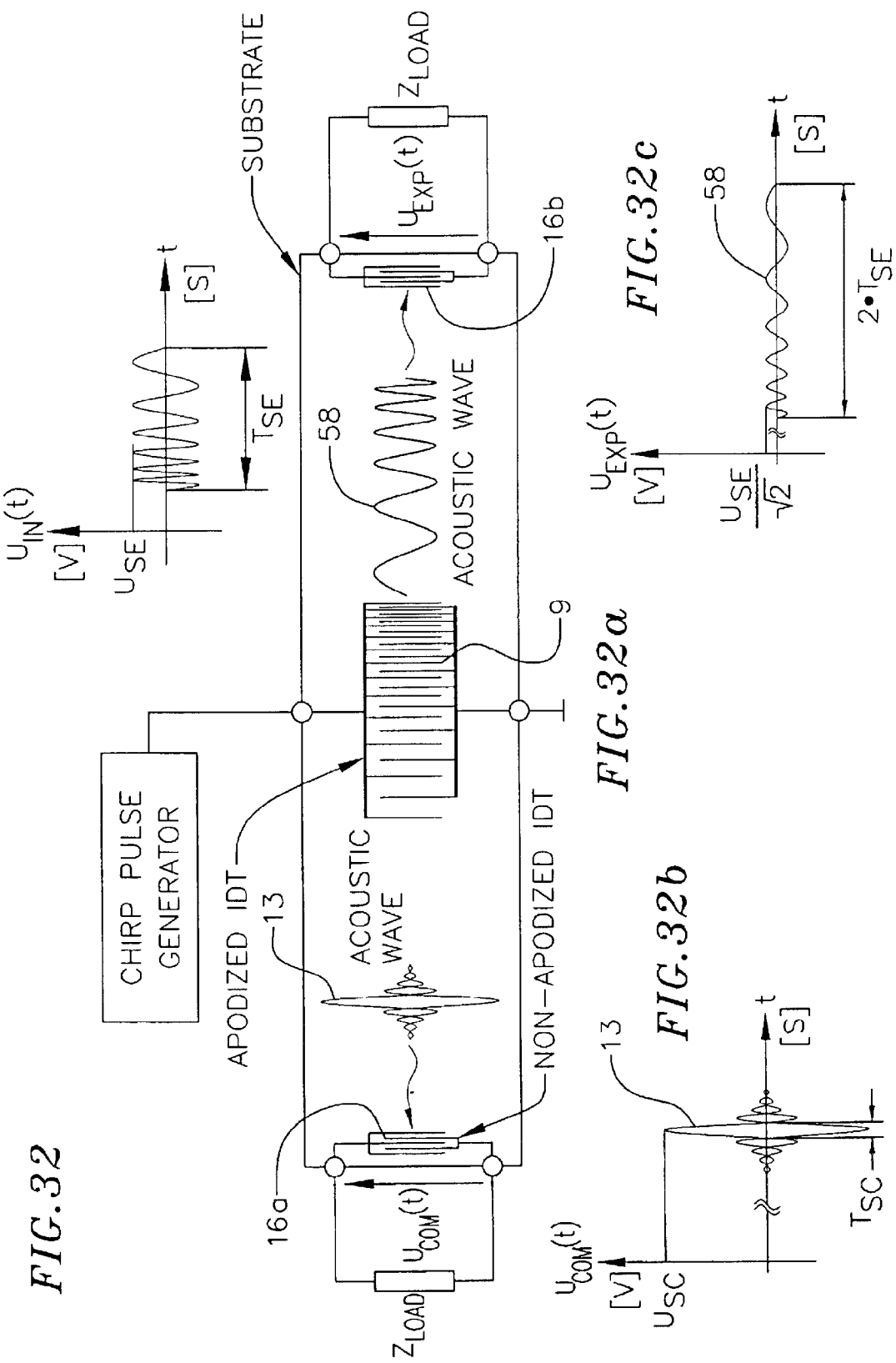
Figure 33:
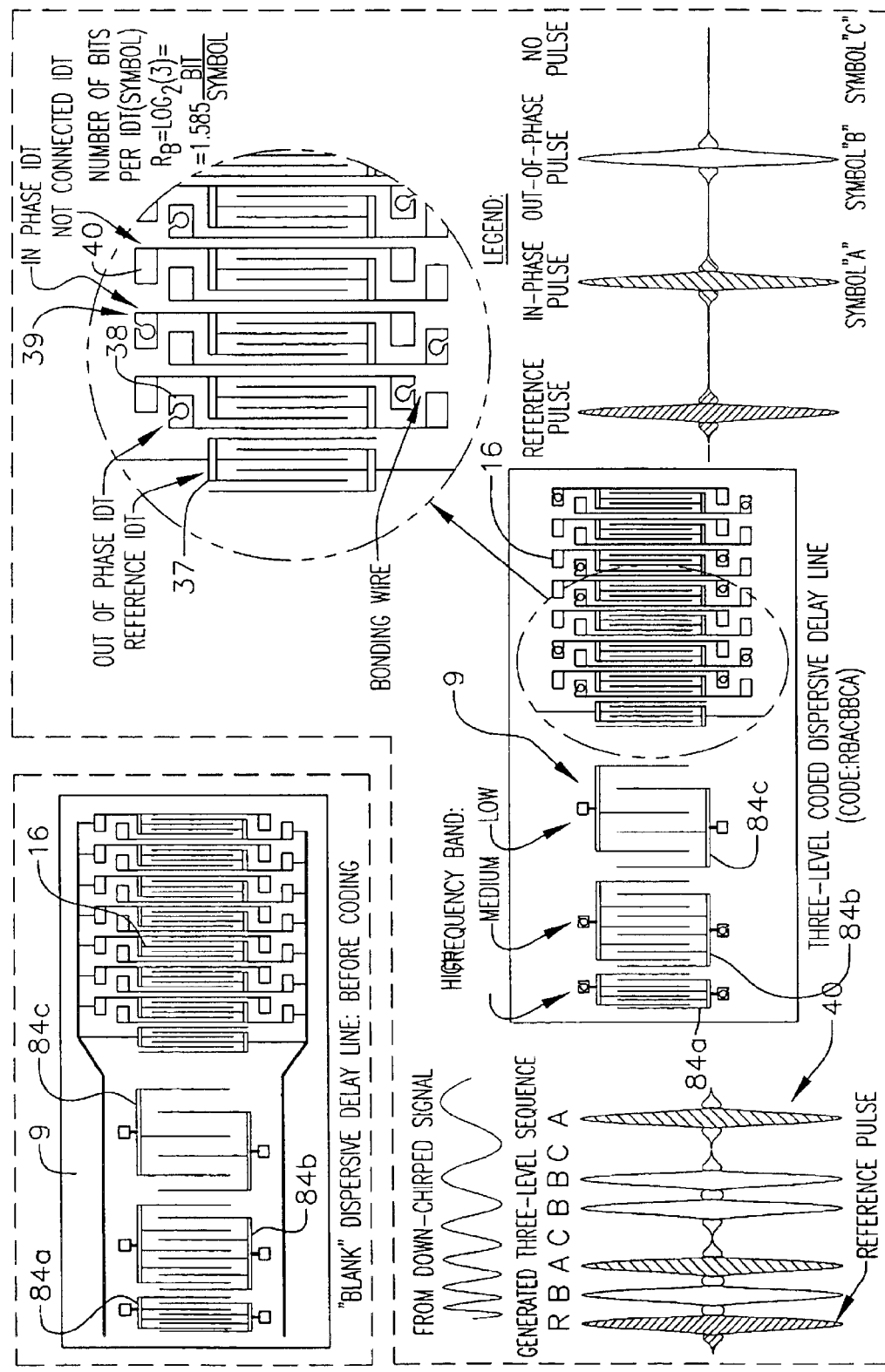
Figure 34:
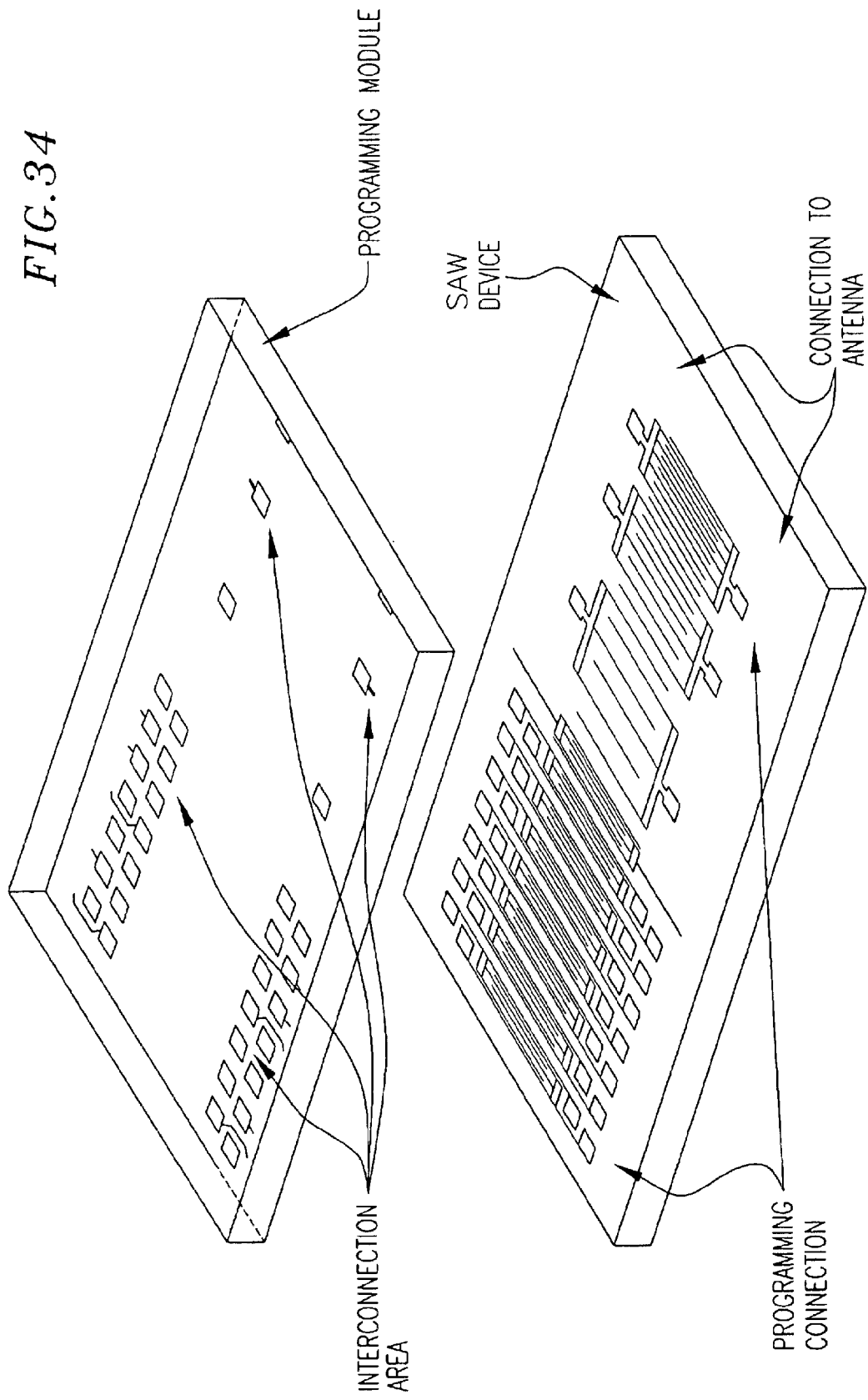
Figure 35:
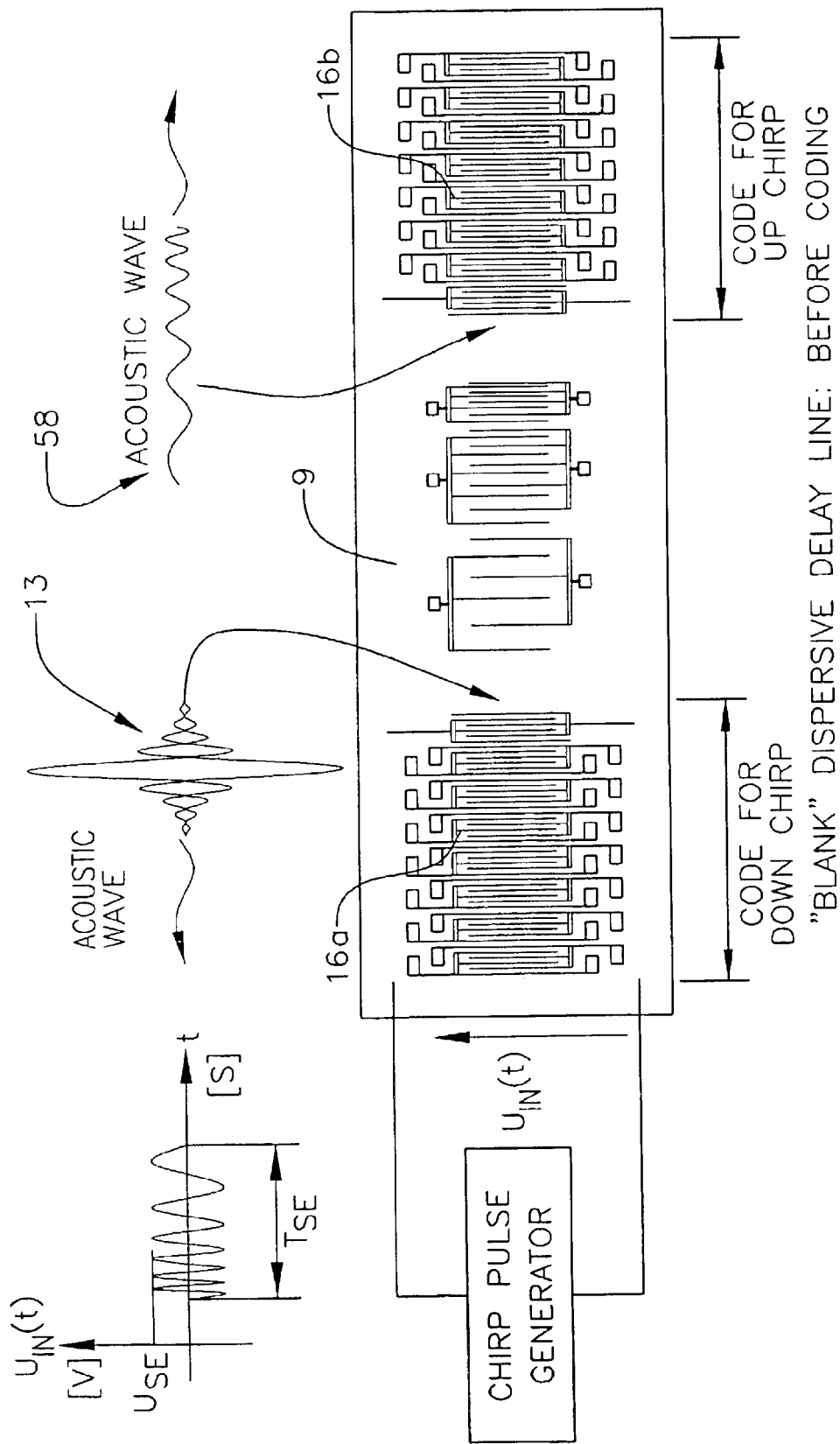
Figure 36:
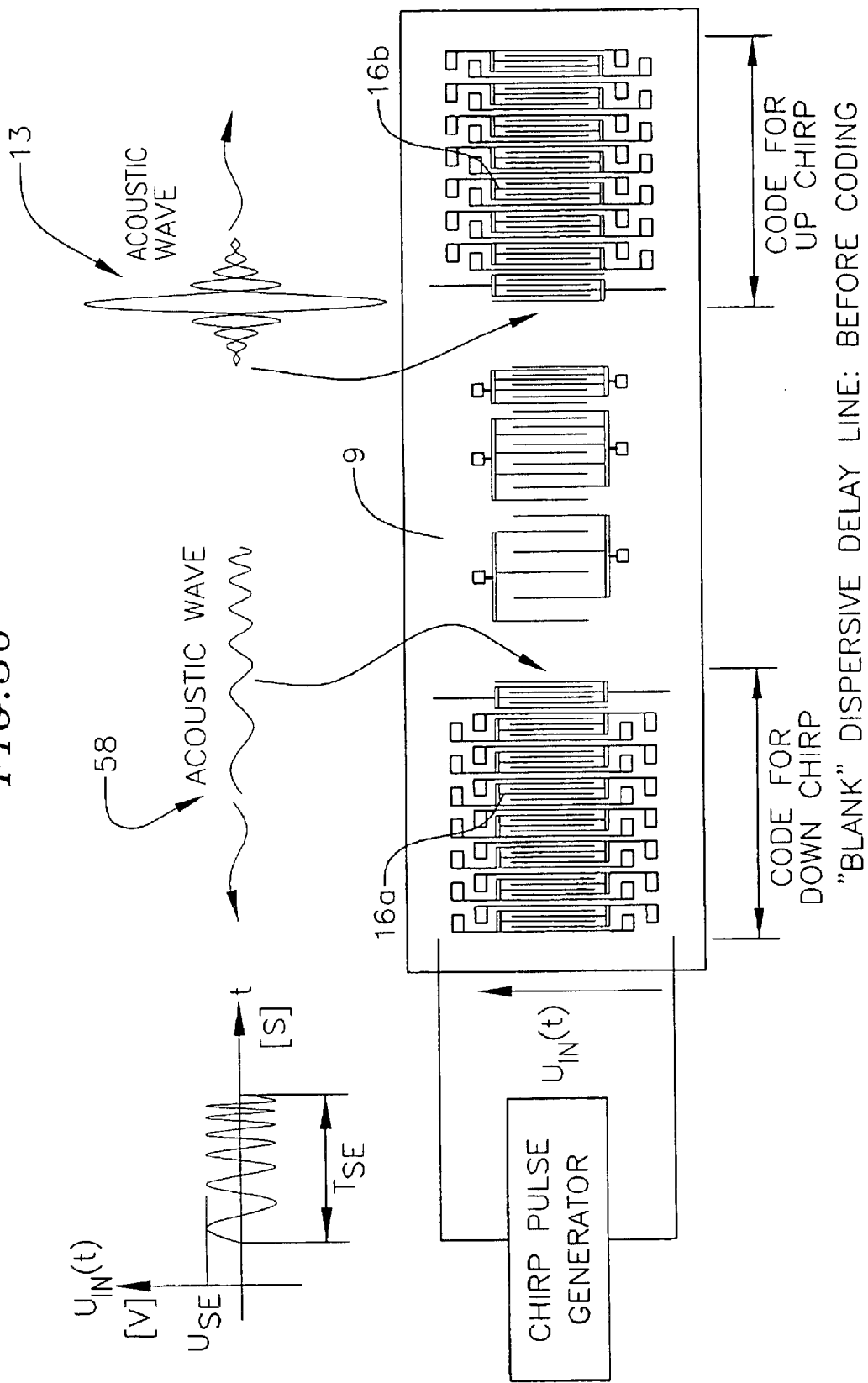
Figure 37:
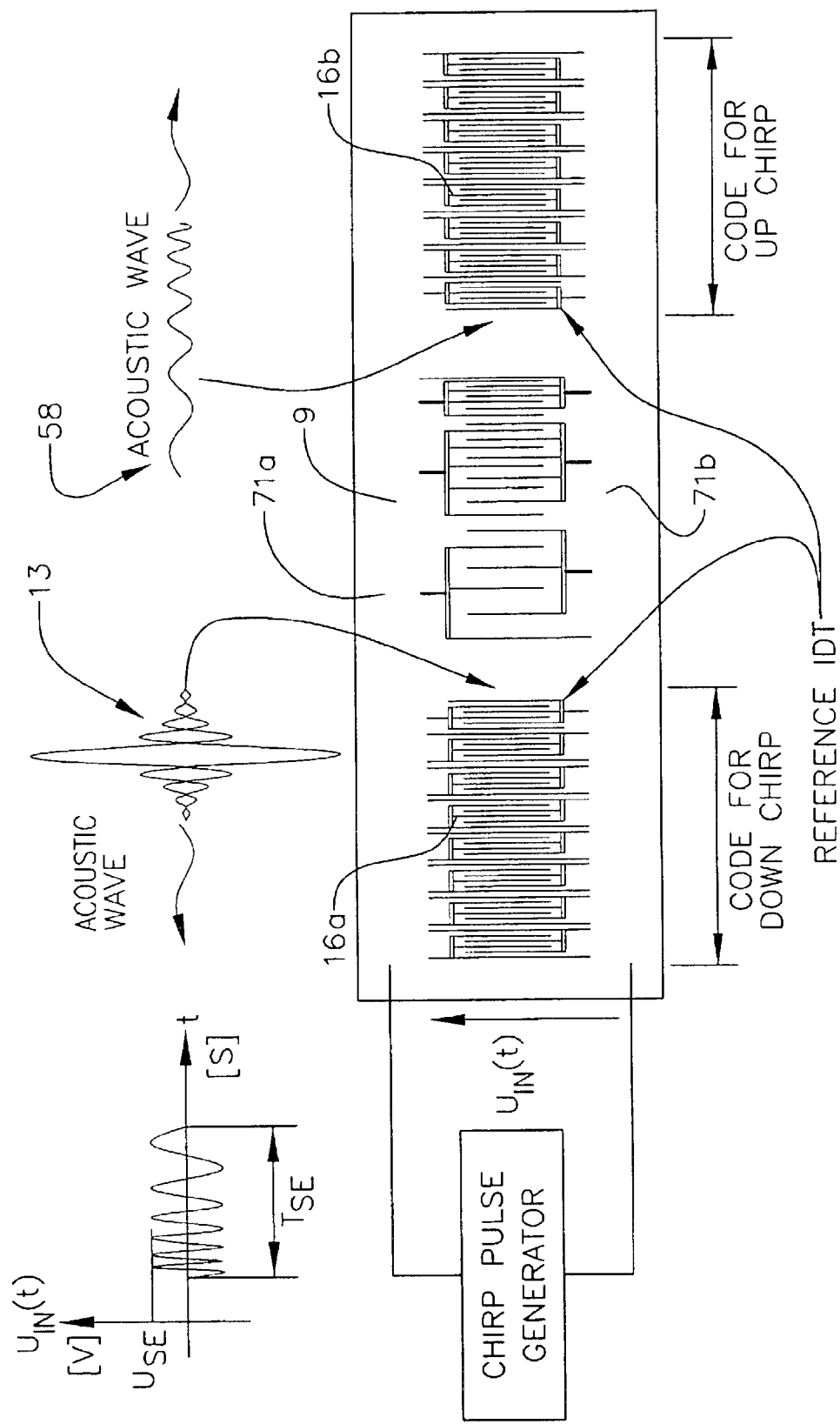
Figure 38:
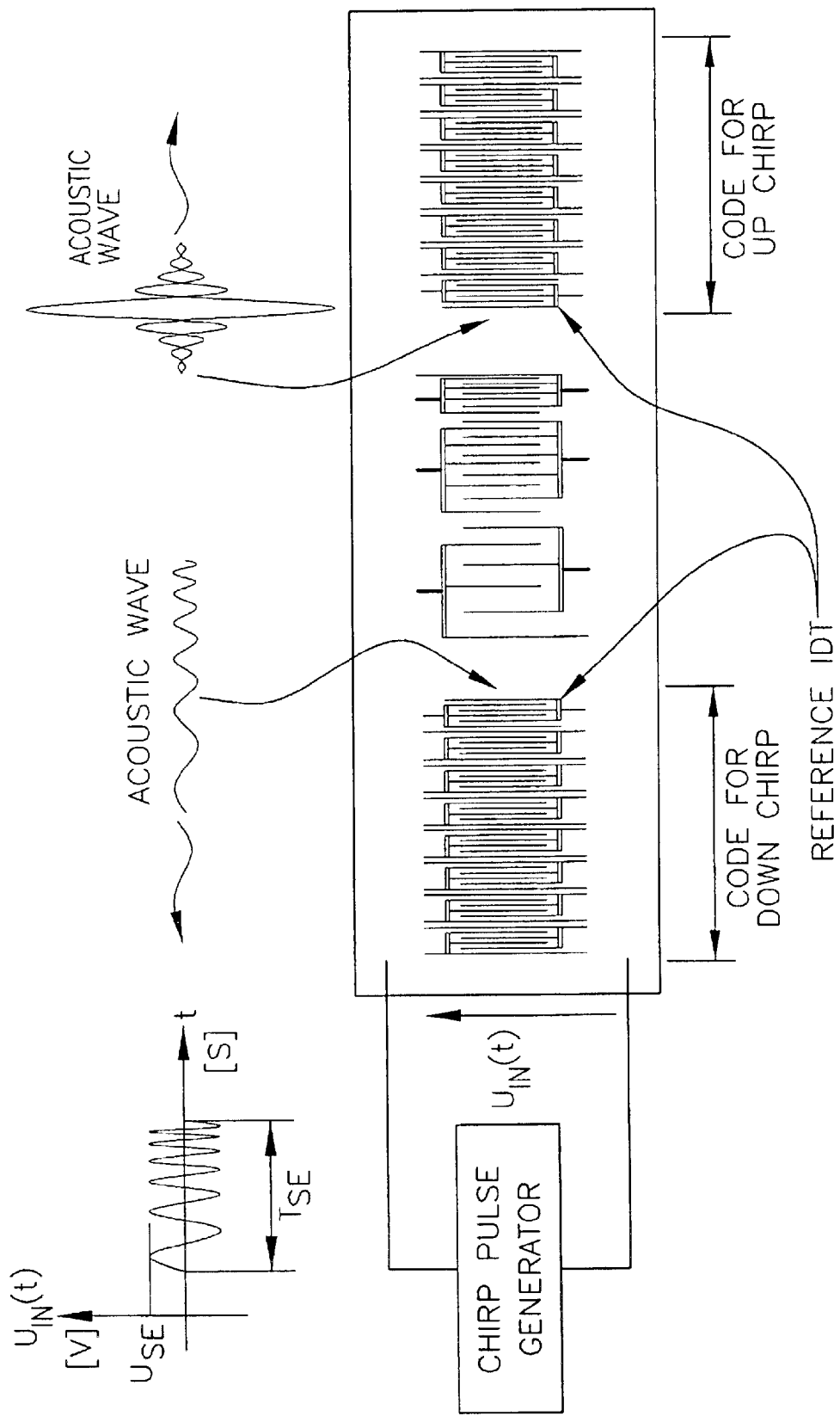
Figure 39:
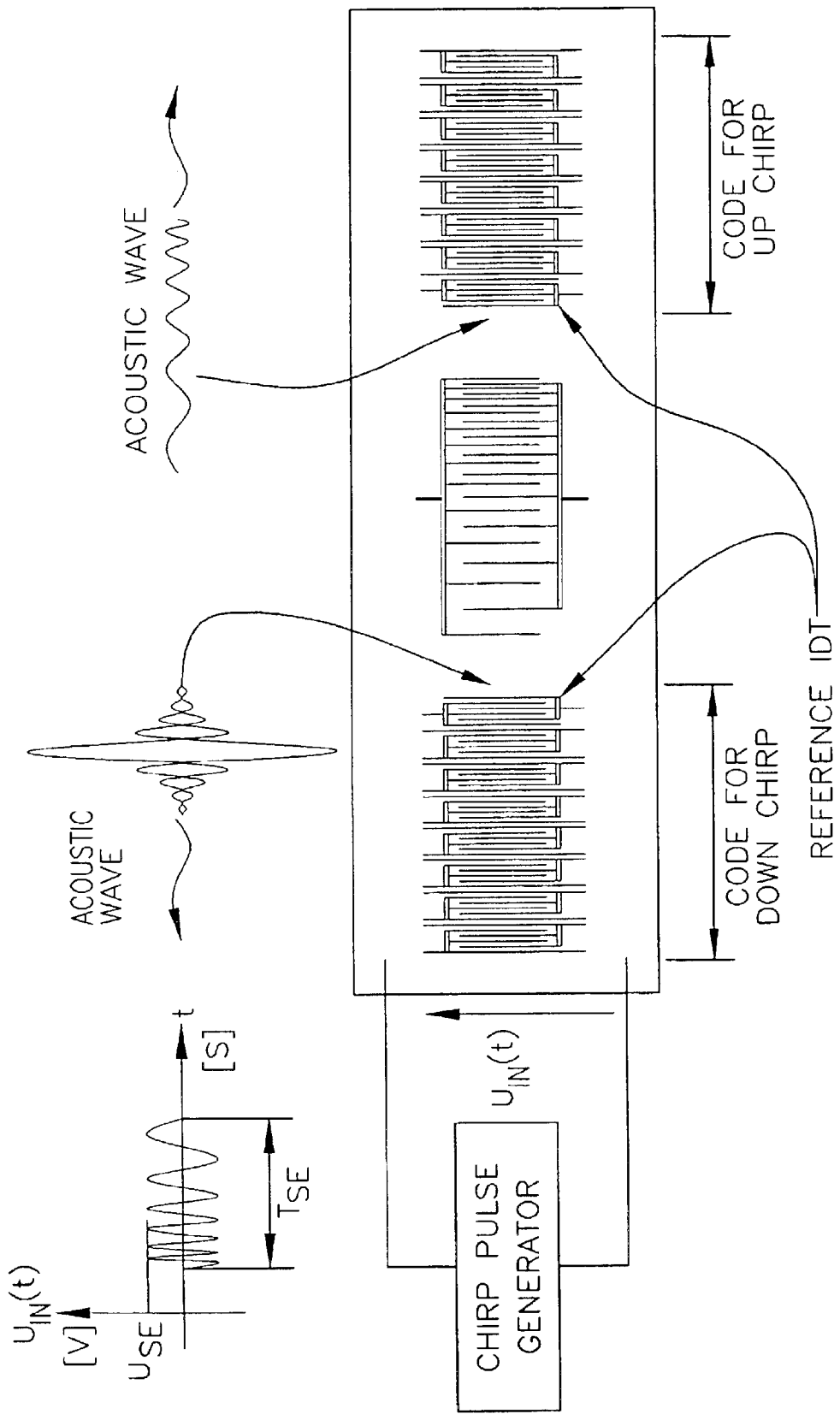
Figure 40:
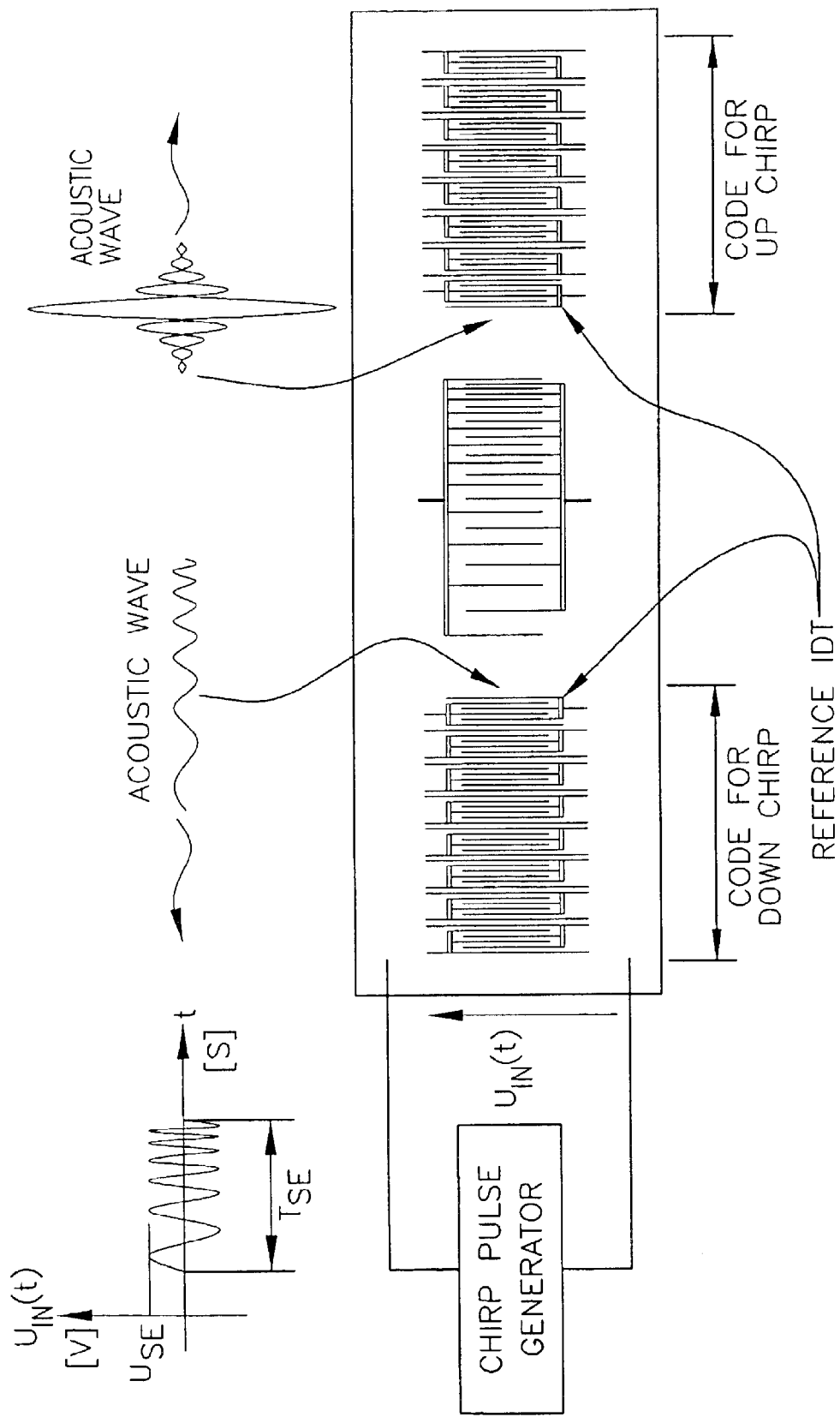
Figure 42:
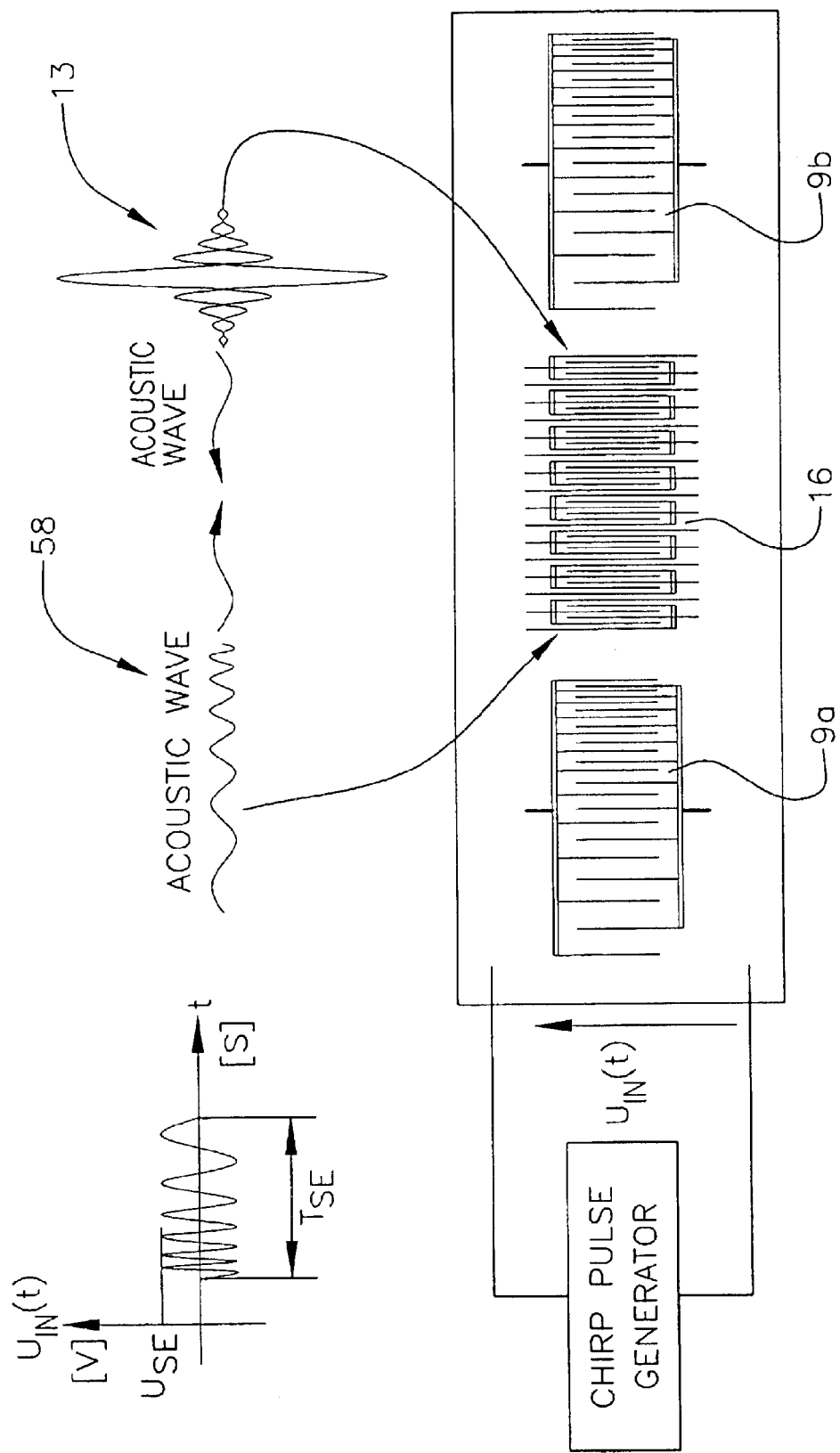
Figure 43:
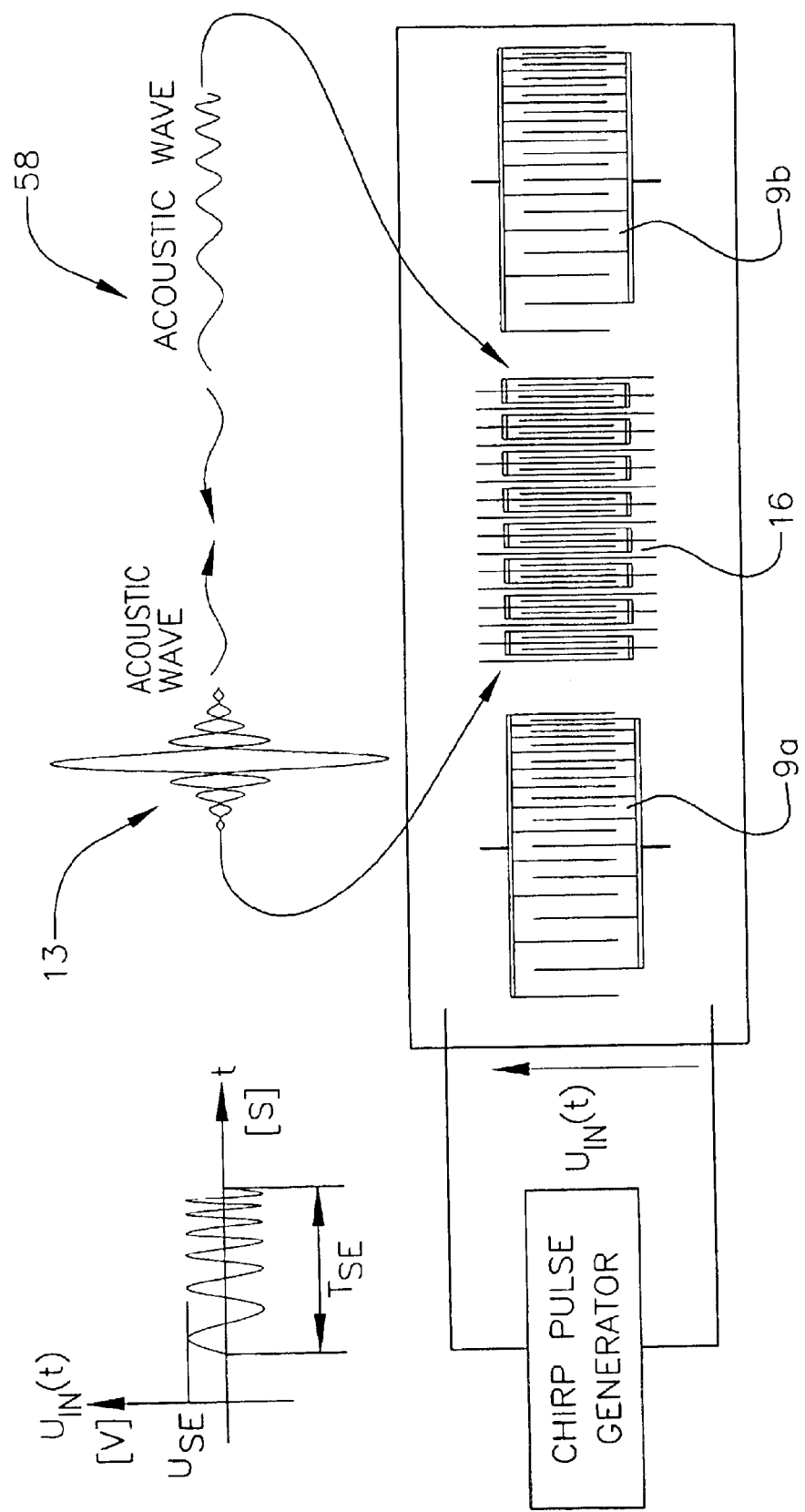
Figure 44:
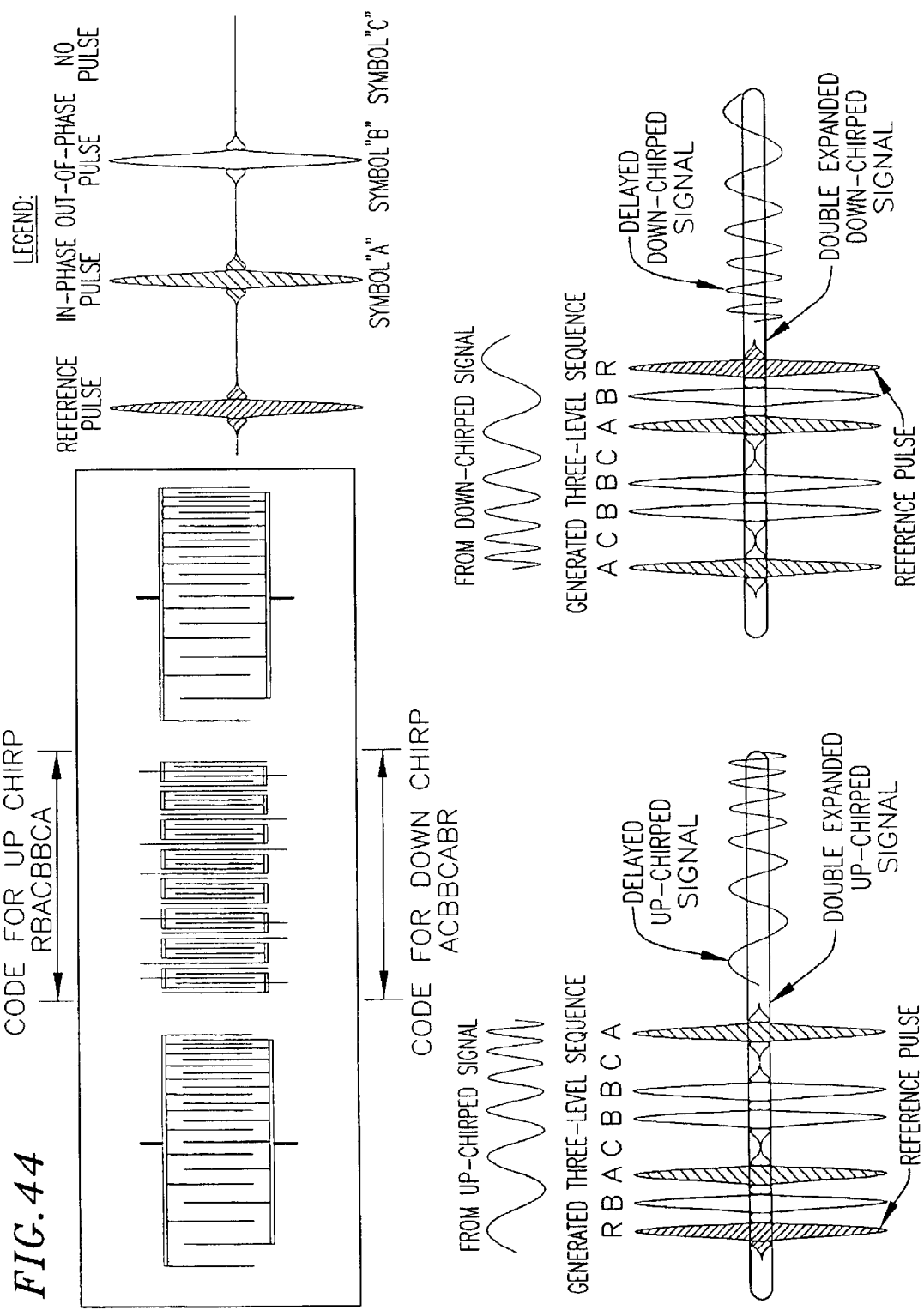
Figure 45:
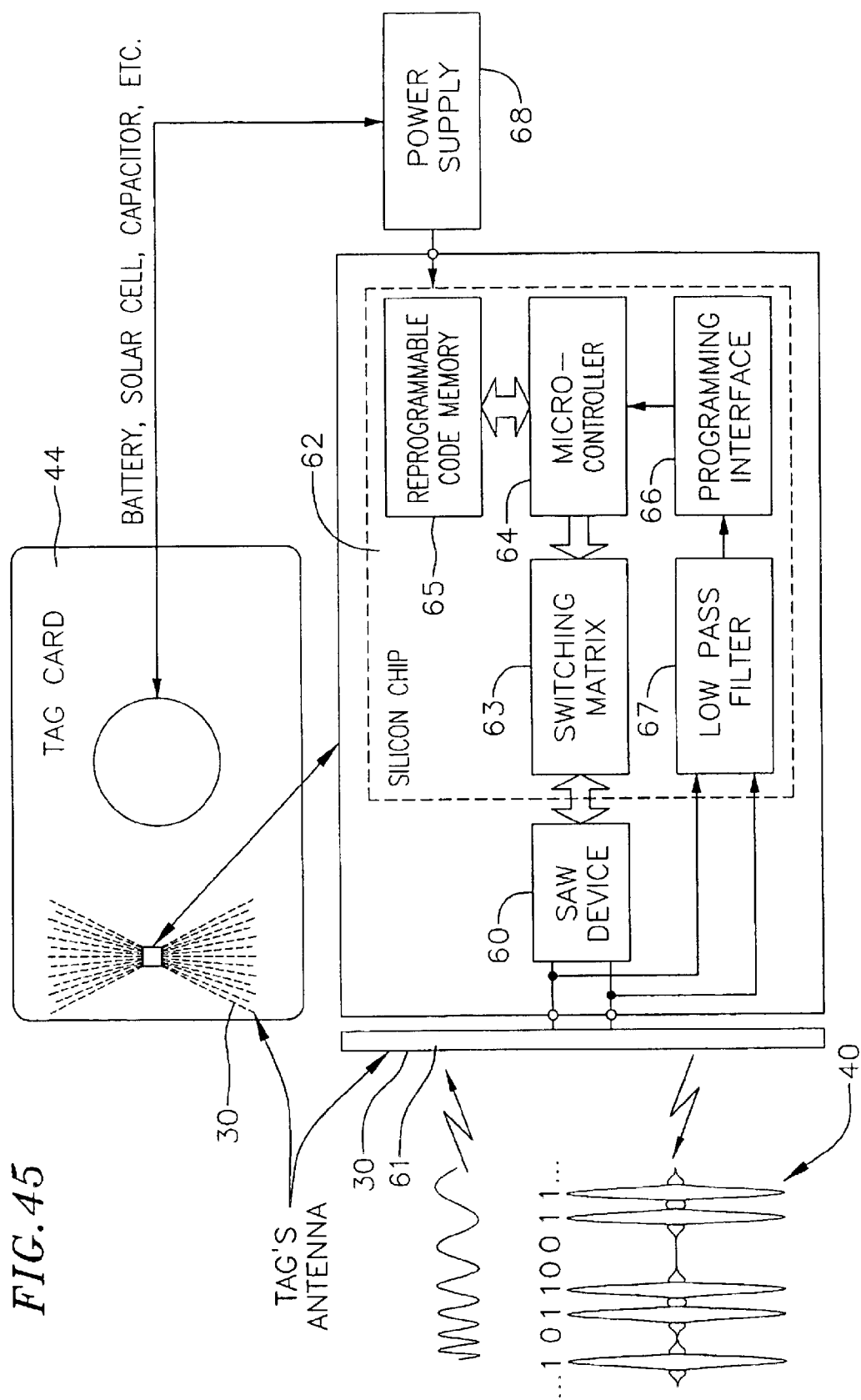
Figure 46:
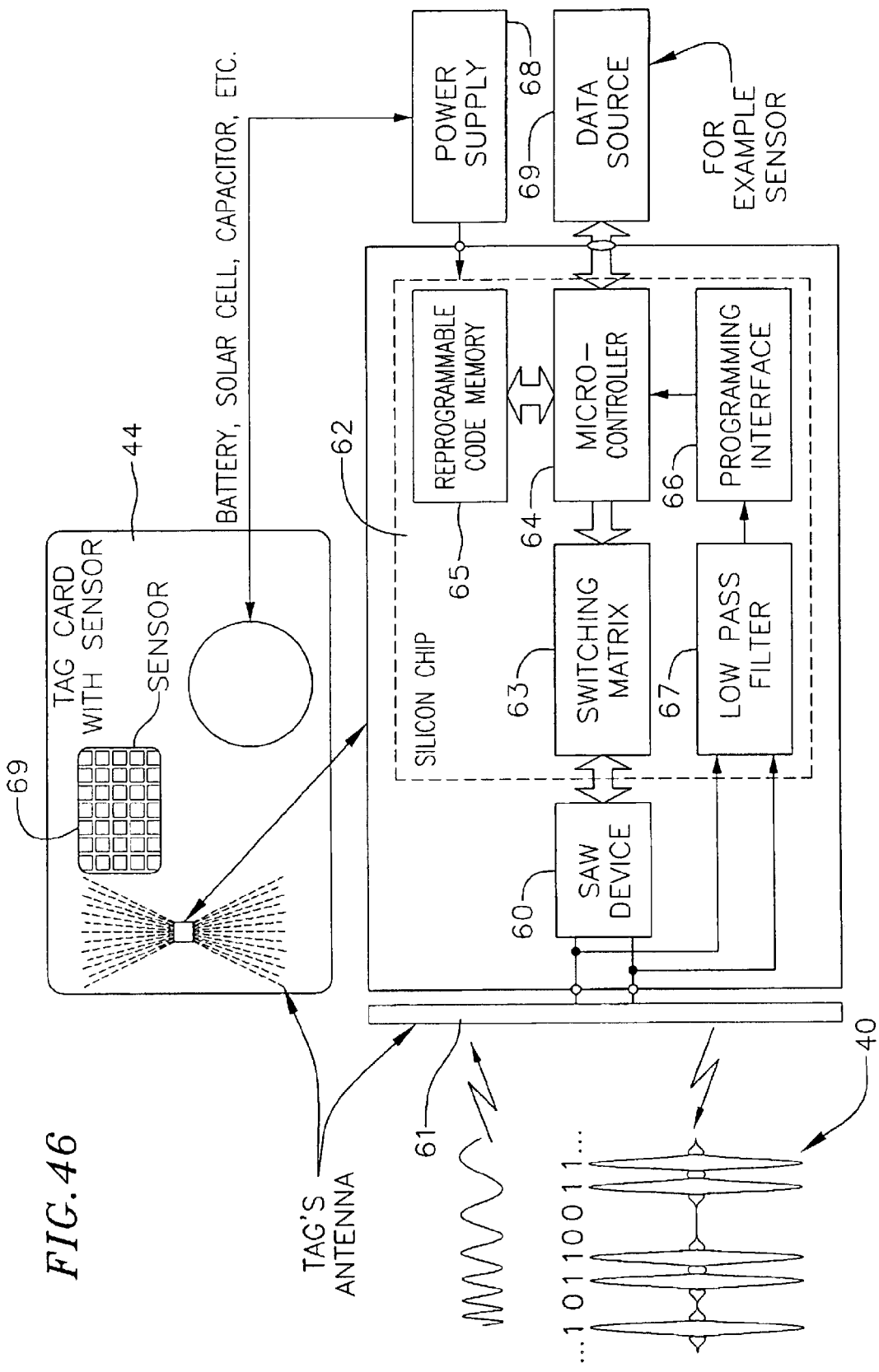
Figure 47:
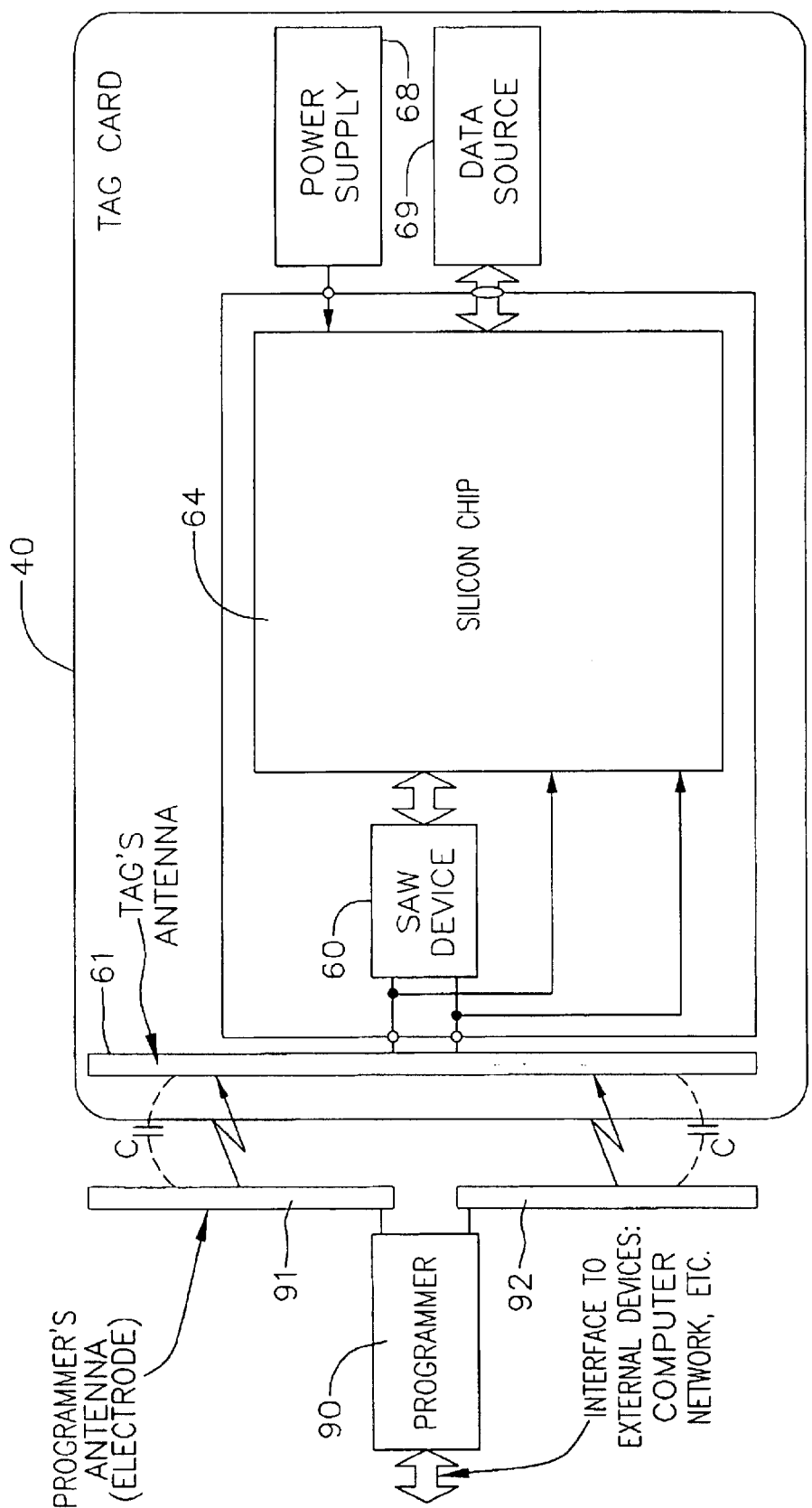
Figure 48:
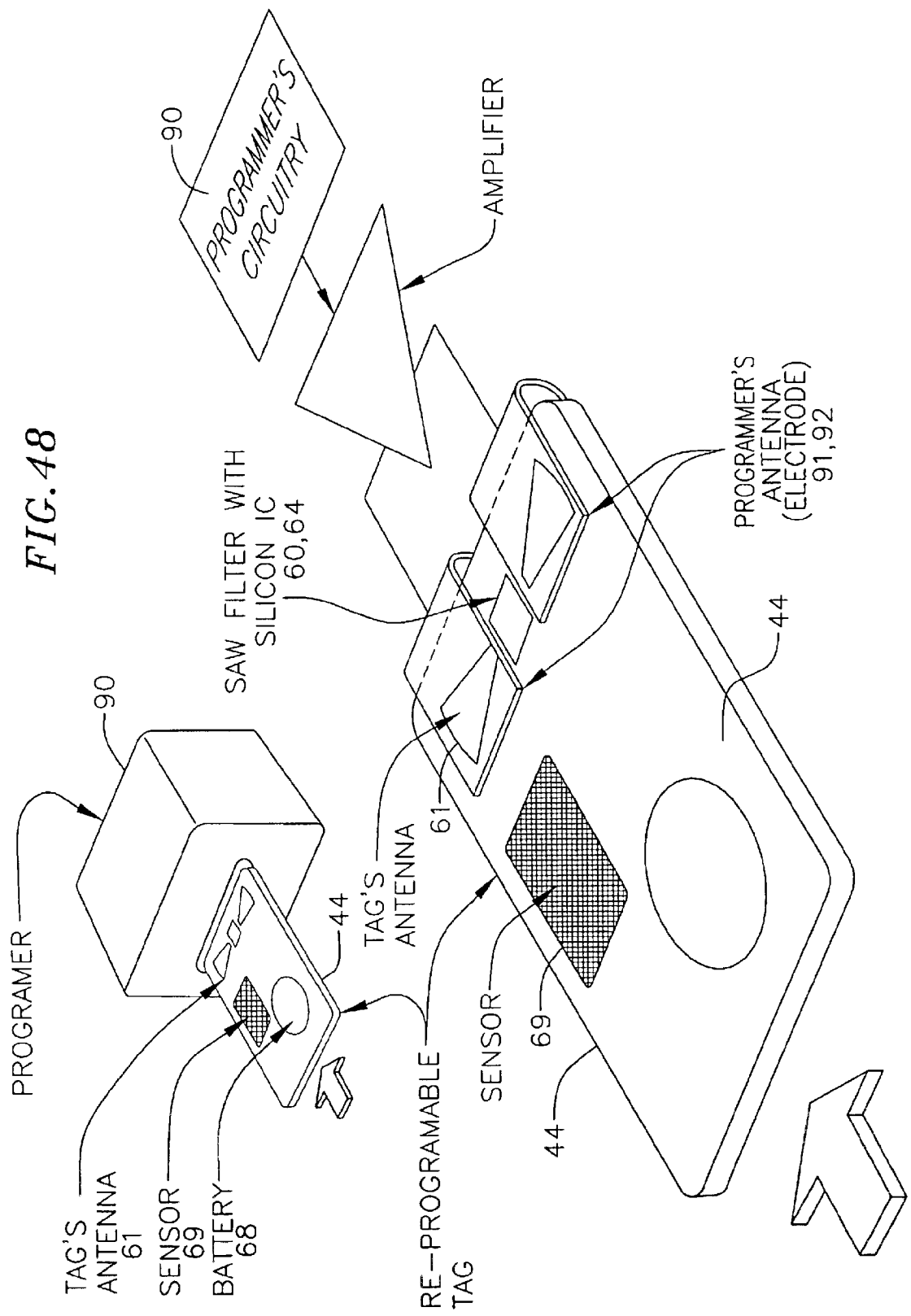

FIG. 30 composed of FIGS. 30a, 30b, 30c and 30d shows an illustration of the different methods of connecting an SAW with silicon;

FIG. 31 shows an illustration of the connection of an SAW structure with a silicon chip for programming the TAG;

FIG. 32 composed of FIGS. 32a, 32b and 32c shows an illustration of an SAW structure with a complementary dispersive transducer device (DDL) for producing compressed and expanded pulse signals;

FIG. 33 composed of FIGS. 33a and 33b shows an illustration of the structure of a programmable dispersive transducer device (DDL);

FIG. 34 shows an illustration of the connection between an SAW structure and a program module;

FIG. 35 shows an illustration of a programmable dispersive transducer device with the production of two independent codes (case of a down chirp signal);

FIG. 36 shows an illustration as in FIG. 35 (case of an up chirp signal);

FIG. 37 shows an illustration of an SAW structure with a programmable dispersive transducer device and two non-dispersive transducer devices (case of a down chirp signal);

FIG. 38 is as FIG. 37 (case of an up chirp signal);

FIG. 39 shows an illustration of a dispersive transducer device between two non-dispersive transducer devices (case of a down chirp signal);

FIG. 40 is as FIG. 39 (case of an up chirp signal);

Figures 41, 41B, 41C:
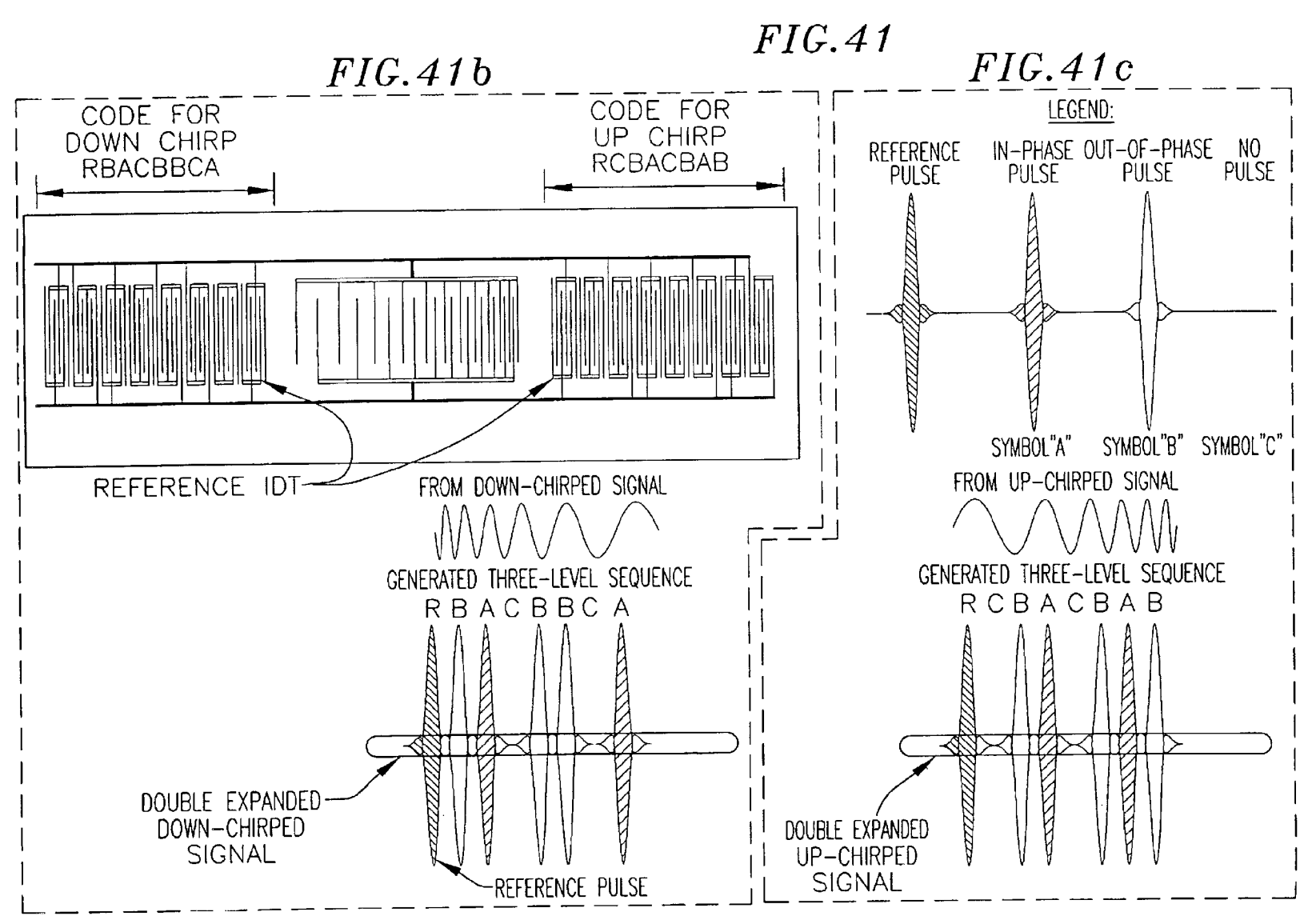

FIG. 41 shows an illustration of a programmed SAW structure with a dispersive transducer device between two non-dispersive transducer devices;

FIG. 42 shows an illustration of an SAW structure with two dispersive transducer devices which enclose a non-dispersive transducer device (case of a down chirp signal);

FIG. 43 is as FIG. 42 (case of an up chirp signal);

FIG. 44 shows an illustration of an SAW structure with two dispersive transducer devices which enclose a non-dispersive transducer device, and the signal waveforms for a programmed SAW structure;

FIG. 45 shows a block diagram of a reprogrammable TAG;

FIG. 46 shows an illustration of a reprogrammable TAG when connected to an external data source;

FIG. 47 shows a block diagram of a reprogrammable TAG with a programming device;

FIG. 48 shows an illustration of a reprogrammable TAG and of the basic illustration for the programming.

Figure 1:
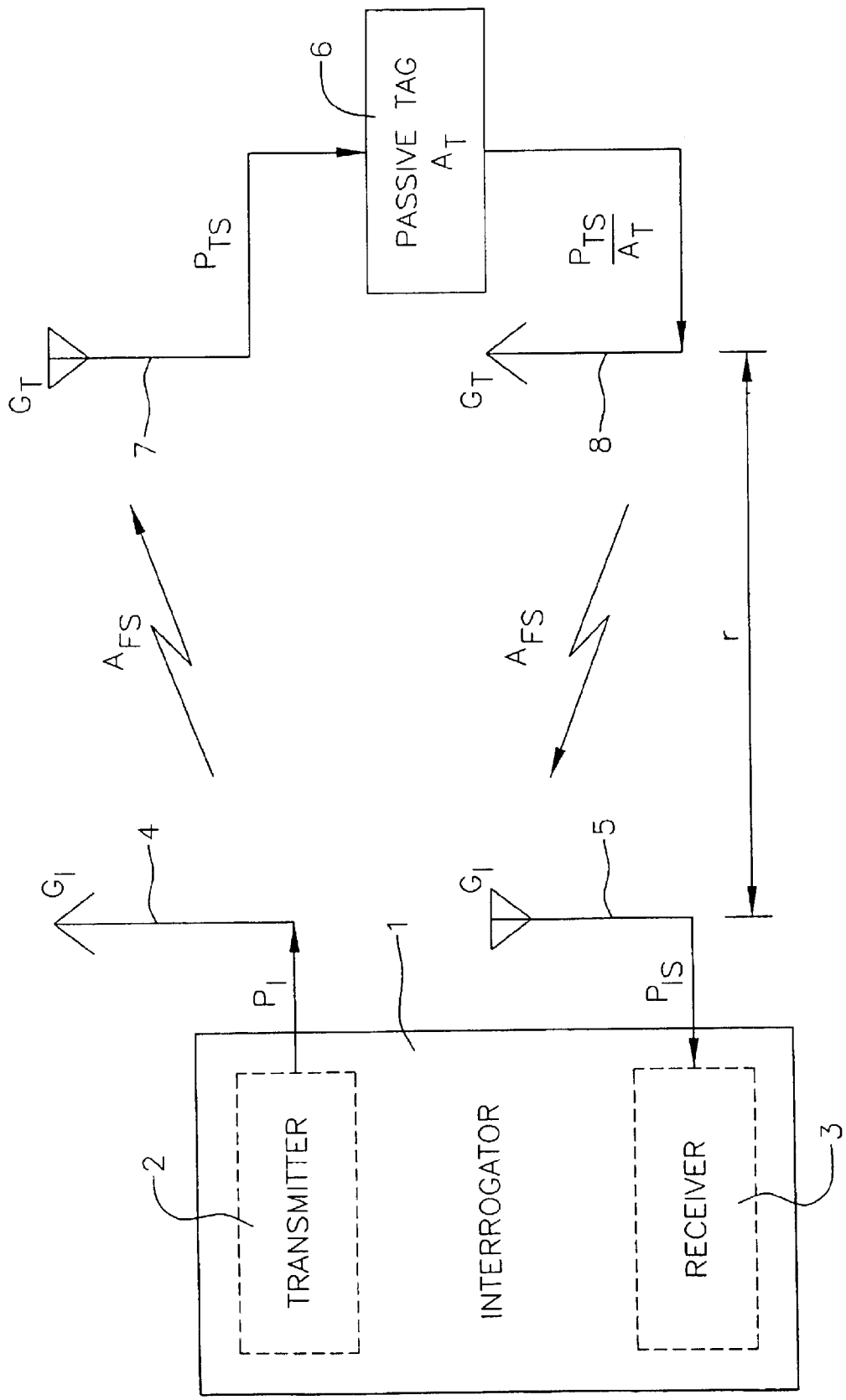

FIG. 1 is a block diagram showing an interrogation unit 1 (interrogator) comprising a transmitter unit 2 and a receiver unit 3. The transmitter unit 2 is allocated an antenna 4 and the receiver unit 3 is allocated an antenna 5. In addition, the diagram shows an identification unit 6 (TAG), which is also called a passive TAG. This TAG 6 has a receiving antenna 7 and a transmitting antenna 8 at its disposal.

The antennae 4 and 5 of the interrogation unit 1, as well as the antennae 7 and 8, can be of integral design, that is to say the transmitting and receiving antennae are each produced in a single antenna unit.

The interrogation unit 1 generates a signal in the transmitter unit 2 and transmits this signal via the antenna 4. The signal transmitted by the antenna 4 is received by means of the TAG antenna 7, and, in response to the reception signal, the TAG transmits a TAG-specific (identification) signal which is in turn received by the receiver unit 3 in the interrogation unit 1. In order for such question/response communication to be possible between the interrogation unit 1 and the TAG 6, there is a maximum possible range for a limited transmission power. If this distance is exceeded, disturbances arise in the question/response communication between the interrogation unit and the TAG.

Figure 2A:
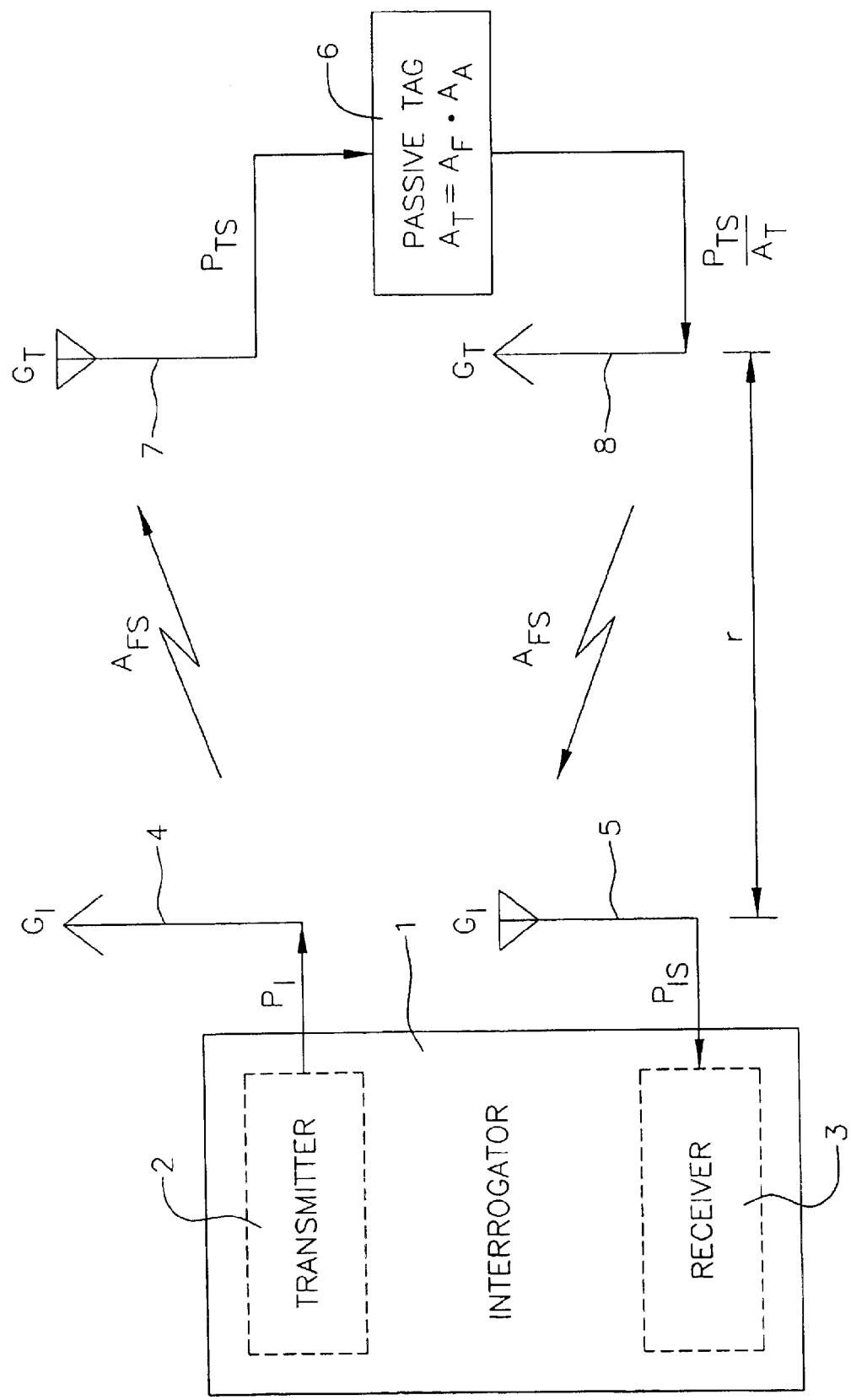
Figure 2B:
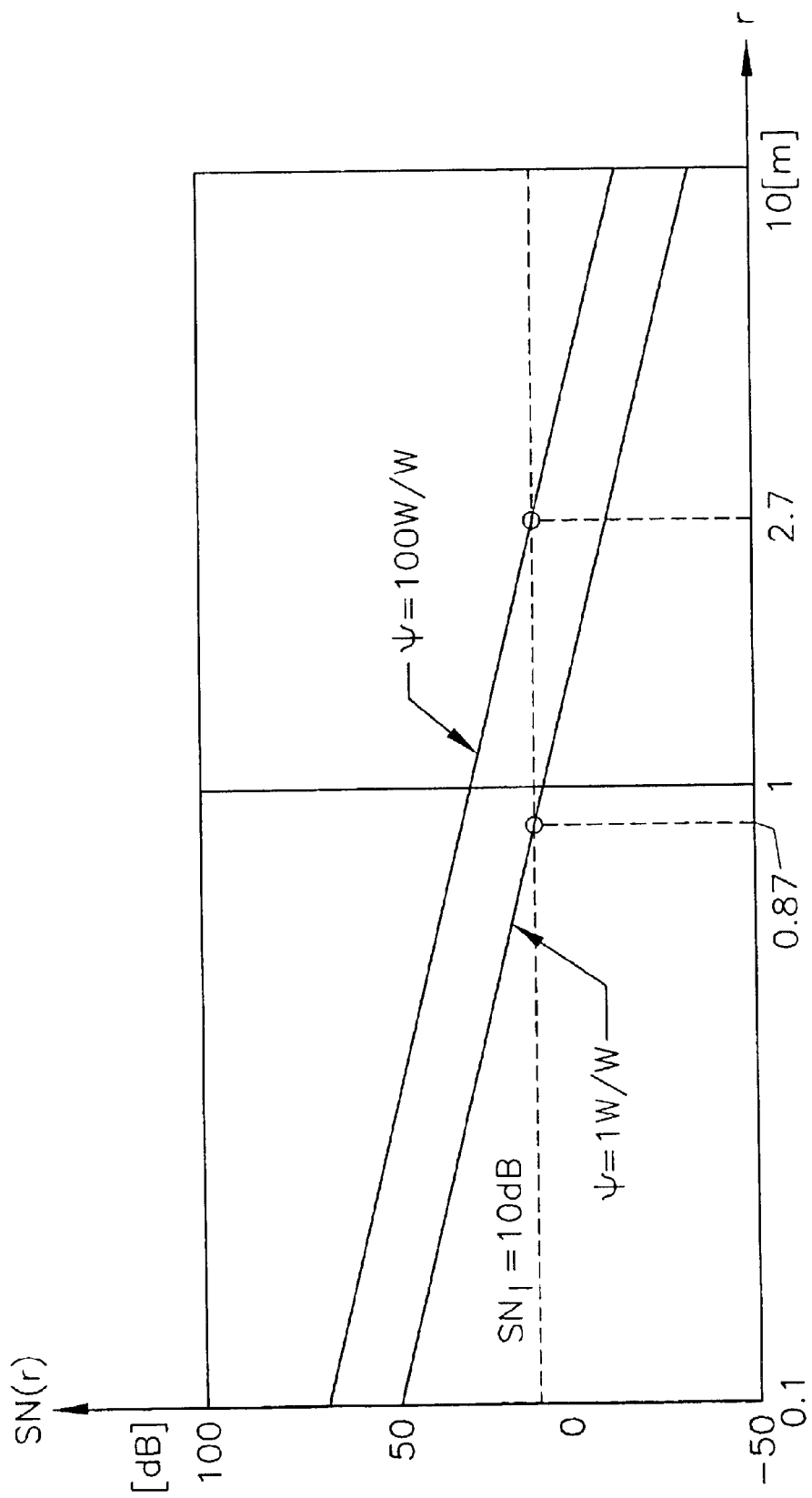

FIG. 2 shows, in FIG. 2a, the identification system already illustrated in FIG. 1. FIG. 2b shows the signal-to-noise factor SN(r) plotted against the range r between the TAG and the interrogation unit. By way of example, the following conditions apply here to the whole system:

$A_A$=10 W/W (10 dB), Total Additional Losses;

$A_F$=1000 W/W (30 dB), Insertion Losses of the Filter/DDL;

$B_N$=100 MHz, Equivalent System Noise Bandwidth;

$B_S$=80 MHz, Frequency Bandwidth of the Signal;

F=1 (3 dB), System Noise Figure $f_c$=2.443 GHz, Carrier Frequency;

$G_I$ 16 W/W (12 dBi), Antenna Gain of the Interrogator;

$G_T$=1 W/W (0 dBi), Antenna Gain of the Tag k=1.38 $10^{-23}$ J/K, Boltzmann's Constant:

$P_I$=10 mW, Power of the Interrogator;

$R_O$=50 Ω, Nominal Impedance;

$SN_I$=10 W/W (10 dB), Required SIN ratio for Interrogator's Receiver;

$T_O$=297 K (+25° C.), Ambient Temperature;

$T_{SE}$=1.25 µs, Expanded Signal Time Duration.

FIG. 2b shows the signal-to-noise ratio of the receiver in the interrogation unit for a passive TAG. In this instance, the character ψ shows the expansion factor for a dispersive delay line, measured in [W/W]. With an expansion factor of ψ=1 W/W, the SNI limit of 10 dB is reached as early as at 0.87 m, whereas with an expansion factor of ψ=100 W/W, the signal-to-noise ratio (SN ratio) for the receiver in the interrogation unit is only reached at 2.7 m. The TAG identification system according to the invention has a ψ of 100 W/W, for example.

Figure 2C:
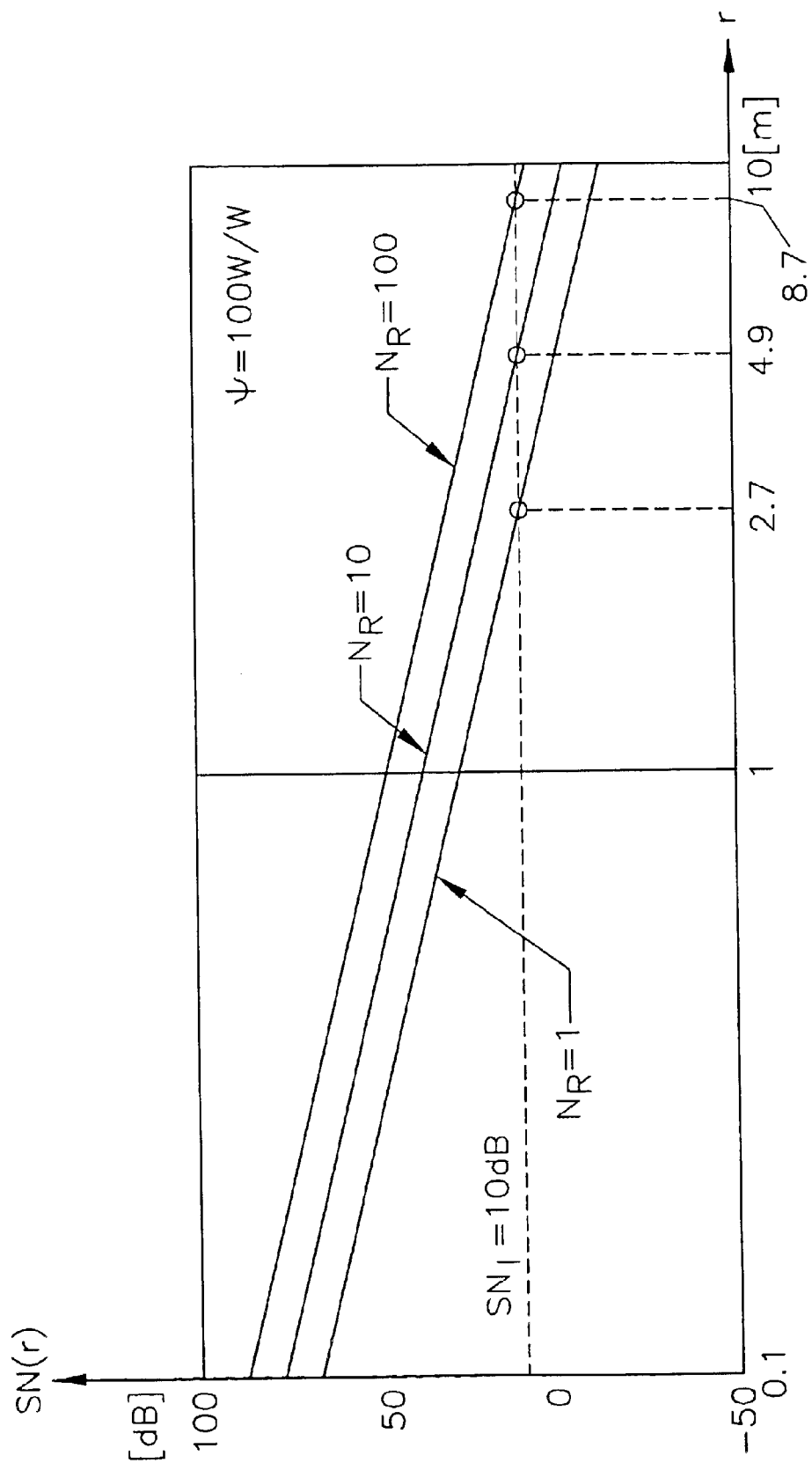

FIG. 2c shows how the interrogation range r (=range between the TAG and the interrogation unit) can be increased if not only a single interrogation is employed but rather if the number $N_R$ of interrogations is increased within a specific unit of time and if the response signals of the TAG are correlated over $N_R$ interrogations. In this case, the number of interrogations is indicated by the variable $N_R$. When $N_R$=1, the interrogation range which is still feasible is 2.7 m again, as in the top curve in FIG. 2b. Keeping the same expansion factor ψ (in the example=100 W/W), if the number of interrogations is increased to $N_R$=100, for example, then the maximum interrogation range is increased to 8.7 m.

Figure 5A:
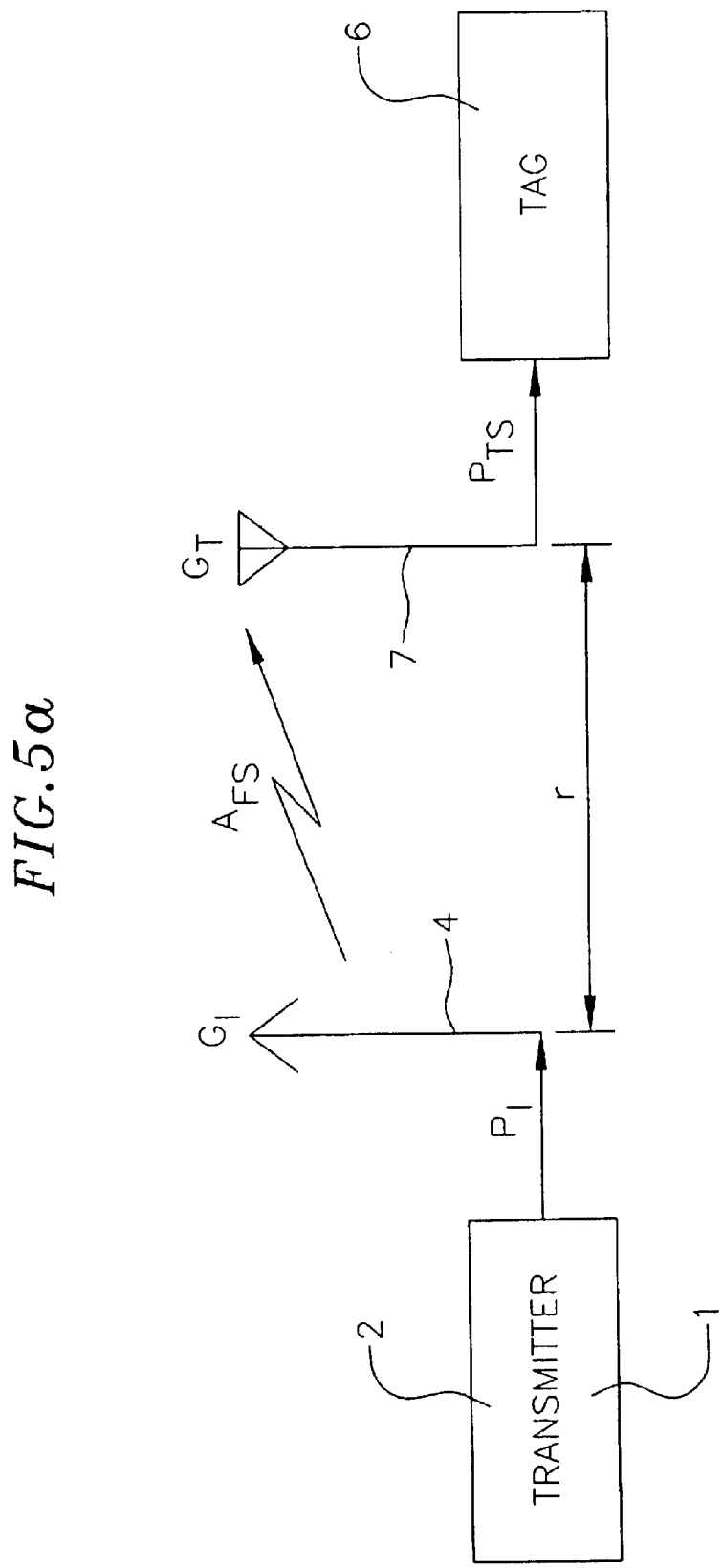
Figure 5B:
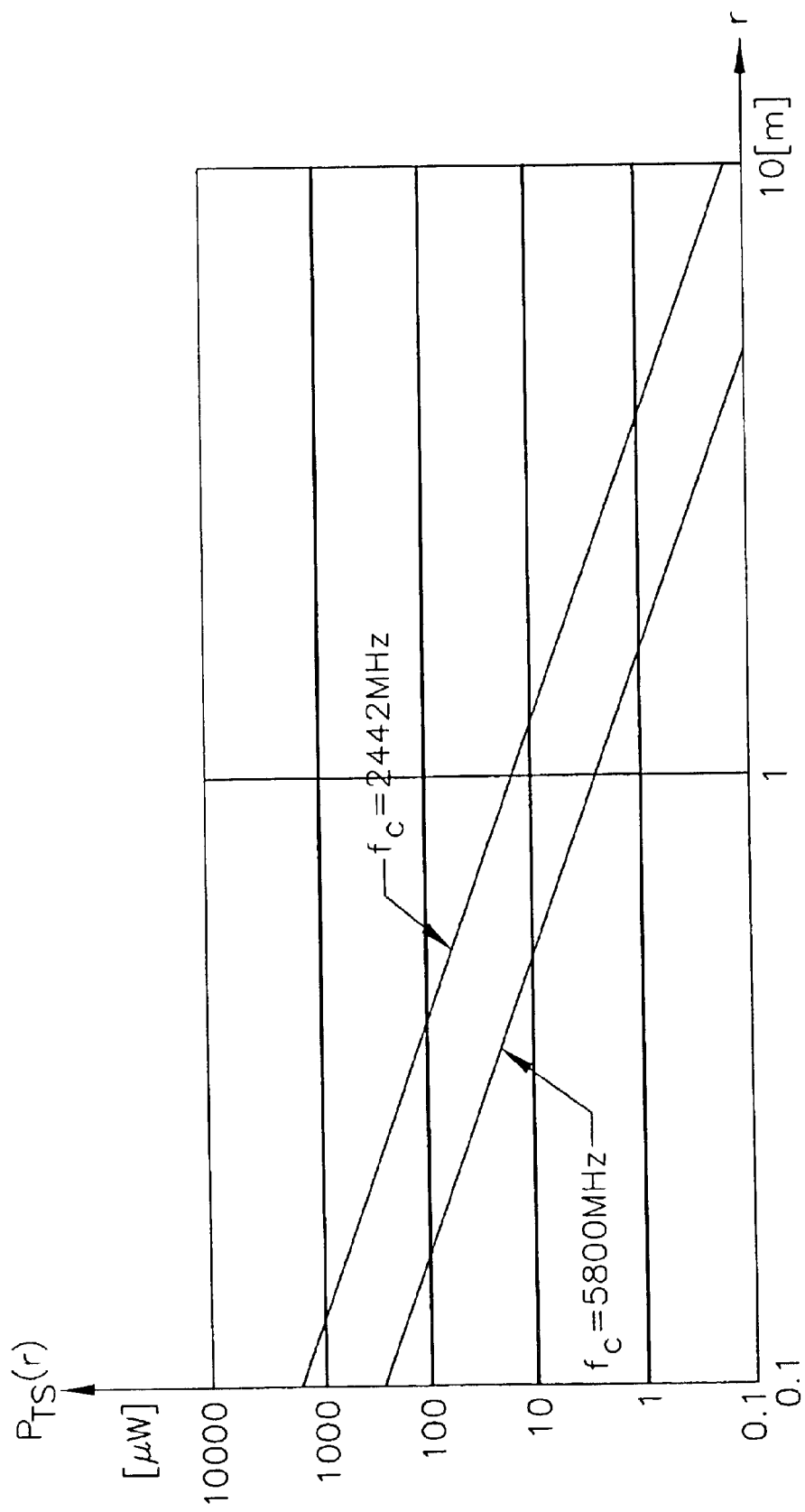
Figure 5C:
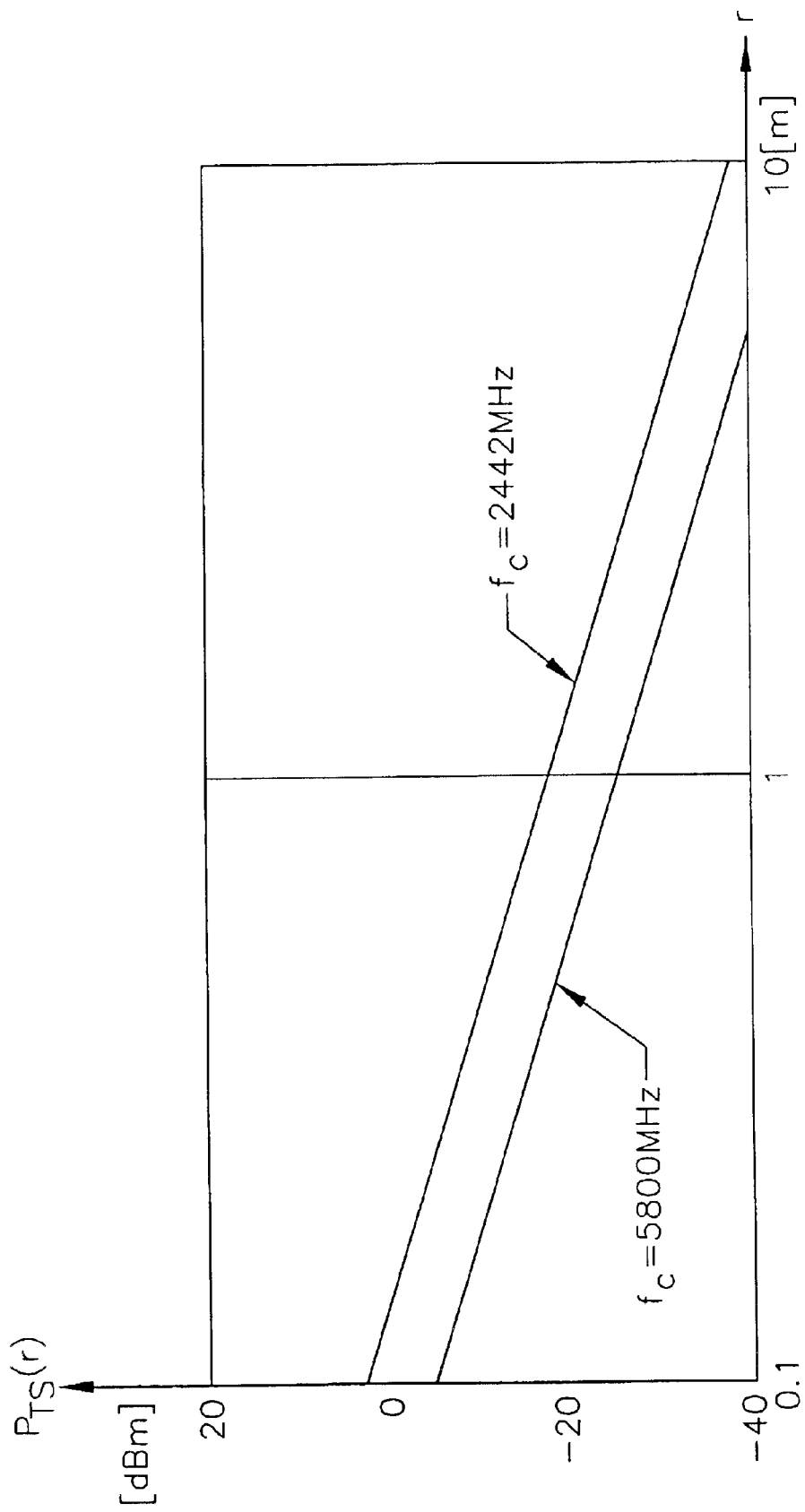

In turn, FIG. 5 shows a part of FIG. 1 (FIG. 5a). FIGS. 5b and 5c show the power $P_{TS}$(r) received by a TAG, as a function of the range r of the transmitter. FIGS. 5b and 5c clearly show that the power $P_{TS}$ at a carrier frequency of 2442 MHz, for example, is considerably—in relation to a specific point in the range—higher than at a carrier frequency of 5800 MHz.

Figure 6B:
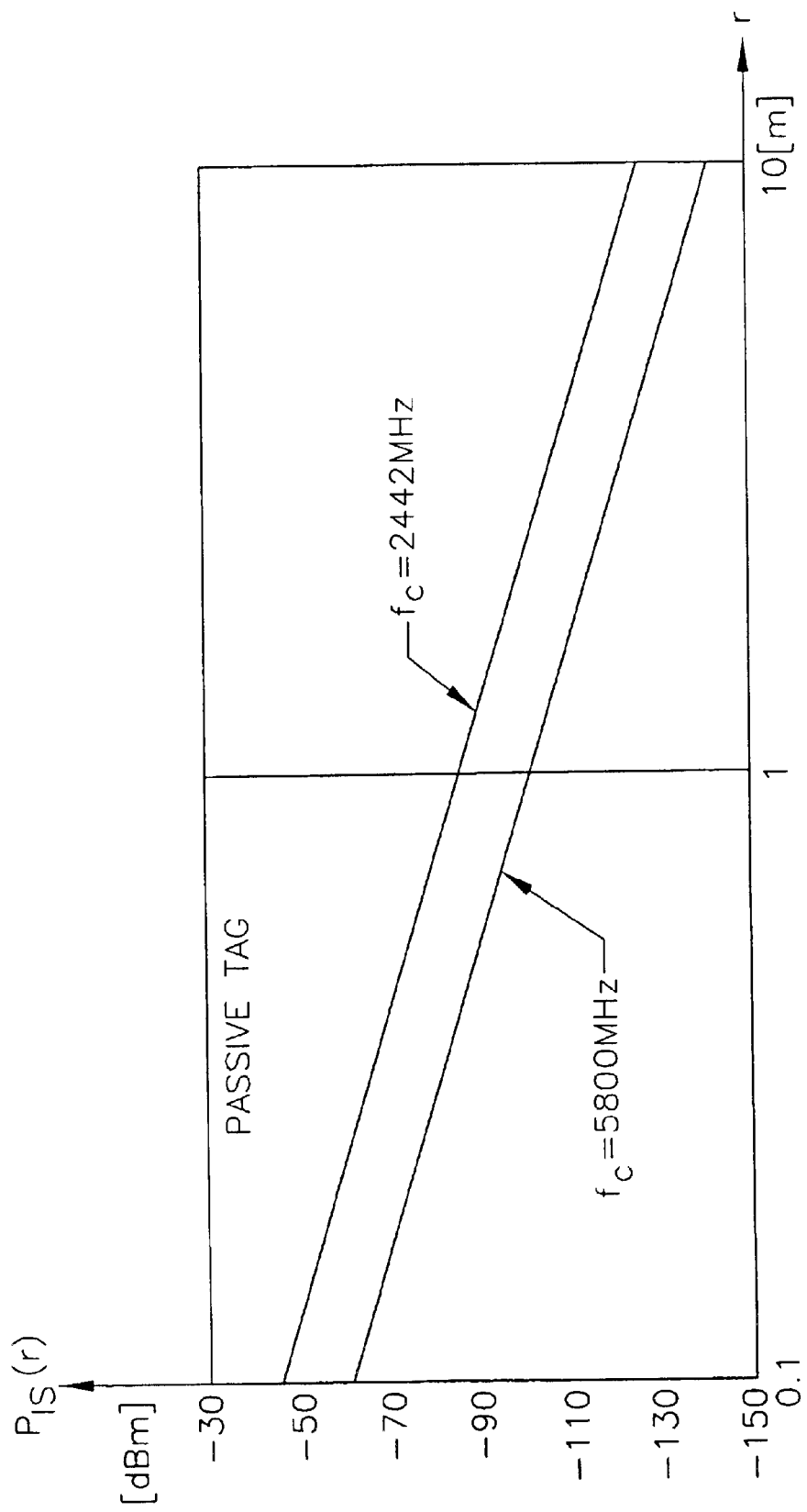

FIG. 6 shows, in FIGS. 6b and 6c, an illustration of the power curve for the signal power $P_{IS}$(r) received in the interrogation unit. Here too, it can clearly be seen that the power with reference to a specific reception location at the carrier frequency of 2442 MHz, for example, is considerably higher than at a carrier frequency of 5800 MHz.

Figure 7A:
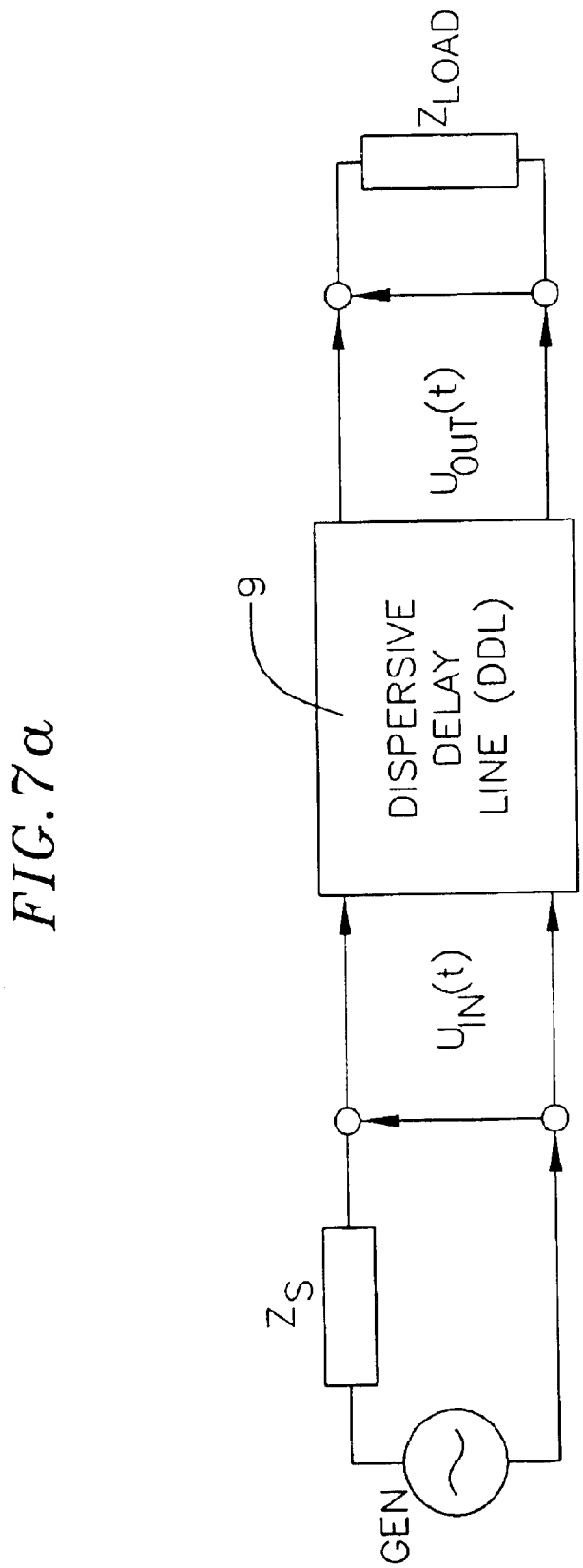

FIG. 7 shows, in FIG. 7a, a block diagram of a dispersive transducer device 9 (dispersive delay line DDL). In this arrangement, a generator (Gen) having a source impedance $Z_S$ is used to produce an input signal $U_{IN}$(t) across the input terminals of the dispersive transducer device. The input signal $U_{IN}$(t) here is a chirp signal—FIG. 7b and FIG. 7d—to be more precise an up-chirped signal with an amplitude $U_{SE}$ of 1 V and a duration $T_{SE}$ of one microsecond. The carrier frequency in this case is 1000 MHz and the bandwidth of the chirp signal is approximately 100 MHz.

The chirp signal shown takes the form of a linearly frequency-modulated pulse of duration $T_{SE}$, within which the frequency changes from a lower to an upper frequency, rising (up chirp) or falling (down chirp) in constant linear fashion. The difference between the upper and lower frequency represents the bandwidth $B_S$ of the chirp pulse. The total duration $T_{SE}$ of the pulse, multiplied by the bandwidth $B_S$ of the pulse, is called the expansion or spreading factor $\psi$, where:

$$\psi = B_S \times T_{SE}$$

With linearly frequency-modulated pulses, in which the frequency within the bandwidth $B_S$ changes constantly over the time $T_{SE}$, the modulation index $\mu$ is given as the quotient of bandwidth and time, that is $$\mu = 2*\pi*B_S/T_{SE}[1/s^2];$$

accordingly, $\mu$ may also be regarded as frequency acceleration.

If t[s] is the time, where $t=t_0=0$ is intended to represent the time-based centre of a chirp pulse, $T_{SE}$[s] is the duration of the linearly modulated pulse, $\omega_0$[rad/s] is the reference frequency at time $t_0$, $\Delta\omega$[rad/s] is the deviation of the angular frequency; $\mu$[rad/s$^2$] is the frequency acceleration and $U_{SE}$ [V] is the amplitude of the frequency-modulated pulse, then the two linearly frequency-modulated pulses upchirp(+) and downchirp(−) can be defined as follows:

$$U_{in}(t) = U_{SE} \cdot \cos\left(\omega_0 \cdot t \pm \frac{\mu \cdot t^2}{2}\right), \text{ for } |t| \le \frac{T_{SE}}{2}$$

$$U_{in}(t) = 0, \text{ for } |t| > \frac{T_{SE}}{2}$$

If a signal of this type is passed to an appropriately designed dispersive delay line (DDL) which has a parabolic phase response and a linear group delay-time response, then the output signal $U_{OUT}(t)$ produced is a compressed signal with the form:

$$U_{OUT}(t) = U_{SE} \cdot \sqrt{\frac{2}{\pi \cdot \mu}} \cdot \frac{\sin(\pi \cdot B_S \cdot t)}{t} \cdot \cos(\omega_o t)$$

or alternatively:

$$U_{OUT}(t) = U_o \cdot \sqrt{B_S \cdot T} \cdot \frac{\sin(\pi \cdot B_S \cdot t)}{\pi \cdot B_S \cdot t} \cdot \cos(\omega_o t).$$

Figure 7C:
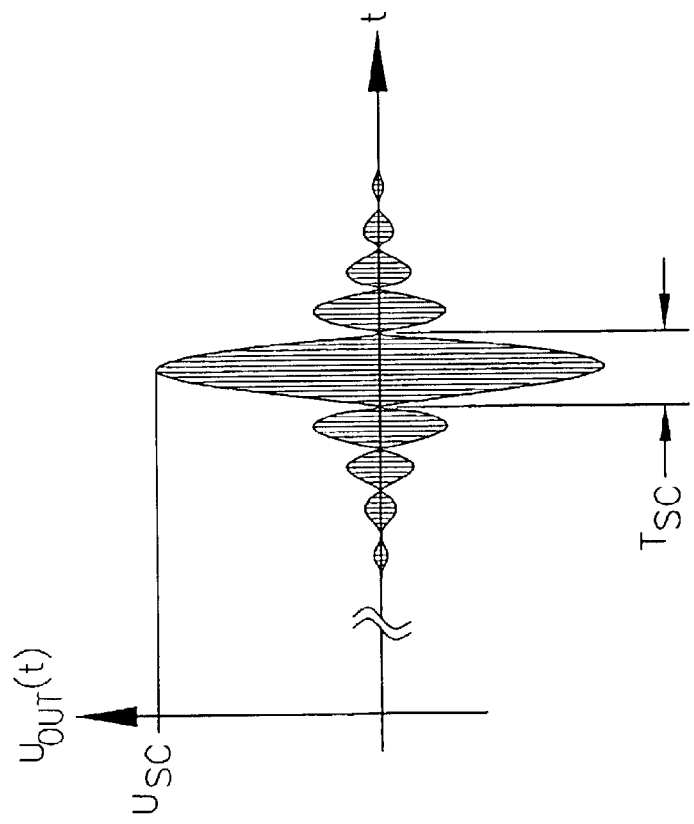
Figure 7B:
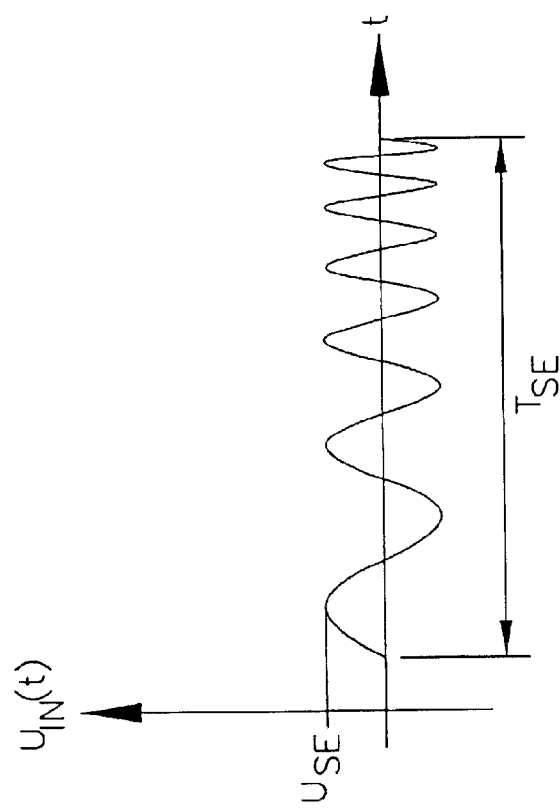

Whilst the signal $U_{IN}(t)$ is illustrated diagrammatically in FIG. 7b, FIG. 7c shows (also diagrammatically) the signal waveform for the output signal $U_{OUT}(t)$ In this case, $T_{SC}$ denotes the length of time between the two zero positions of the main peak of $U_{OUT}(t)$. $T_{SC}$ is determined as:

$$T_{SC} = 2/B_S$$

Figure 7D:
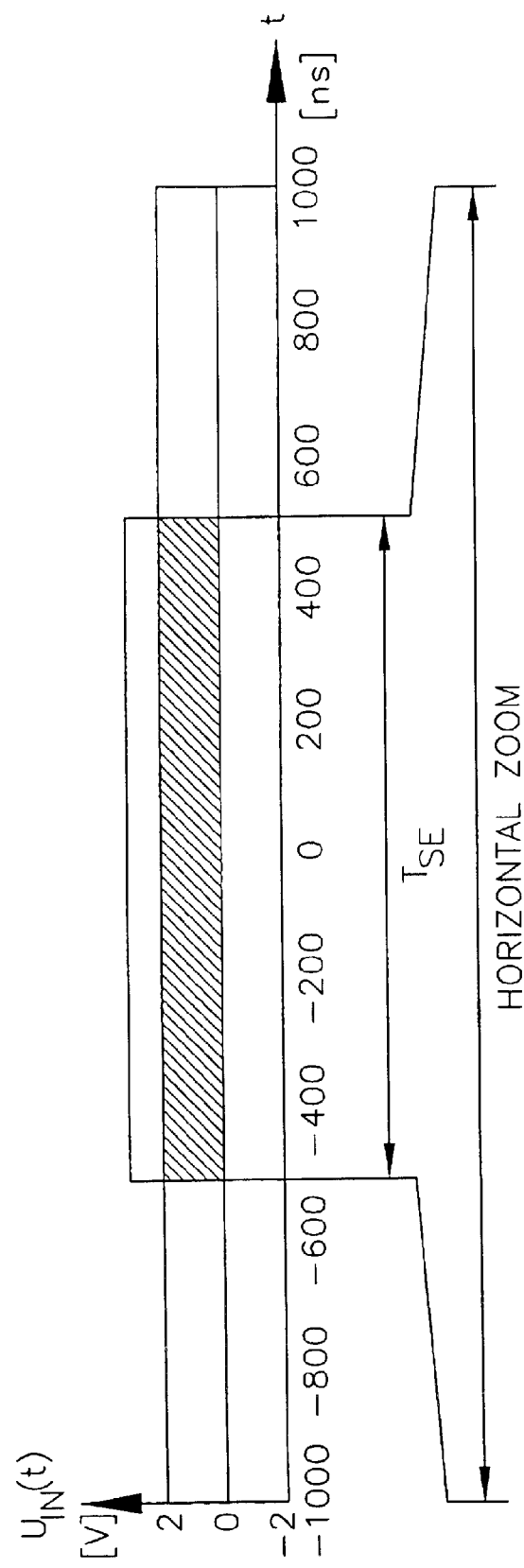

FIG. 7d shows a somewhat different illustration of the chirp signal shown in FIG. 7b. The chirp signal has a duration of one microsecond with a signal amplitude of 1 V.

Figure 7E:
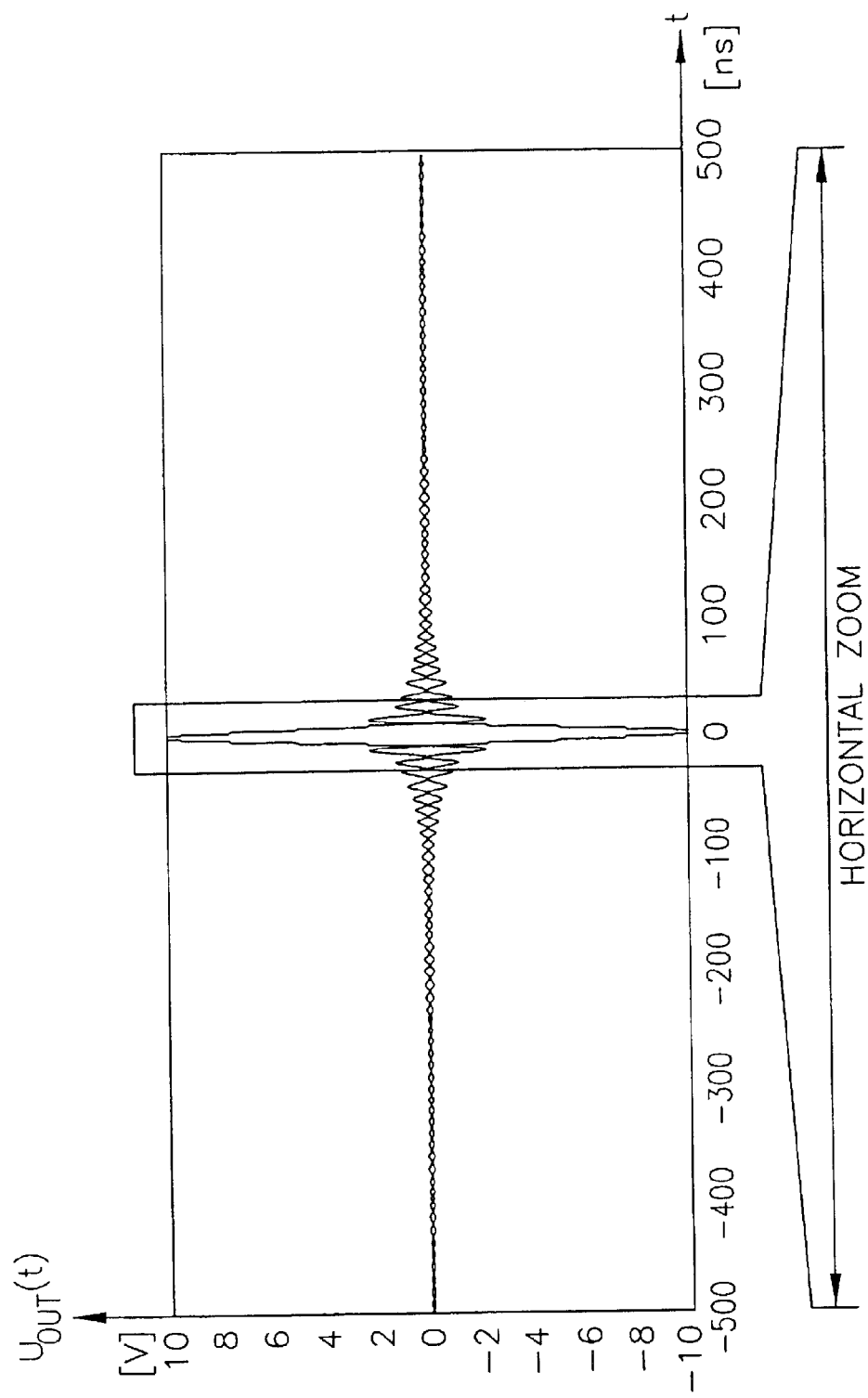
Figure 7F:
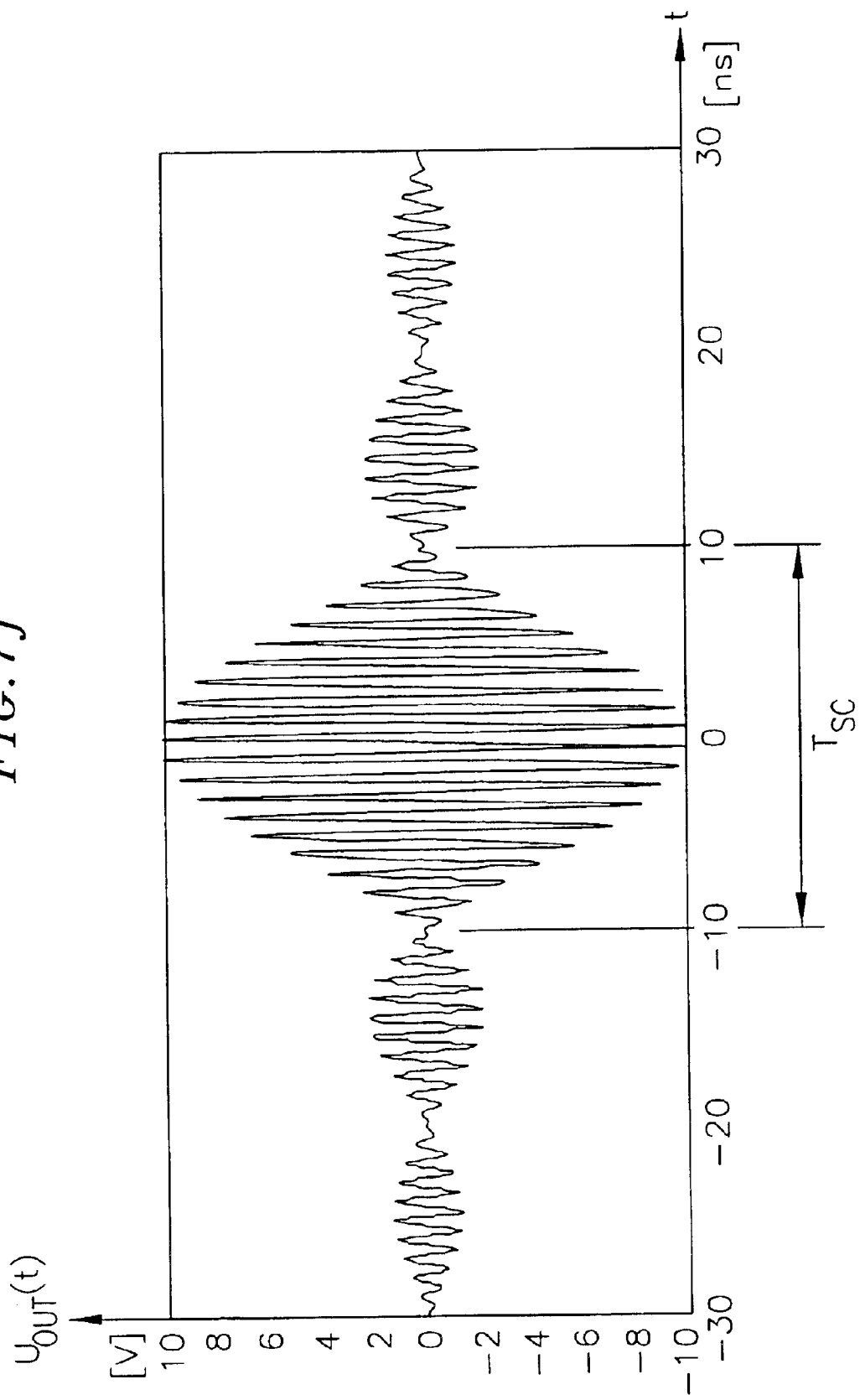

FIG. 7e shows the output pulse signal of the DDL 9 (FIG. 7a) and shows the same output pulse signal for the DDL expanded over time (horizontal zoom).

Figure 9B:
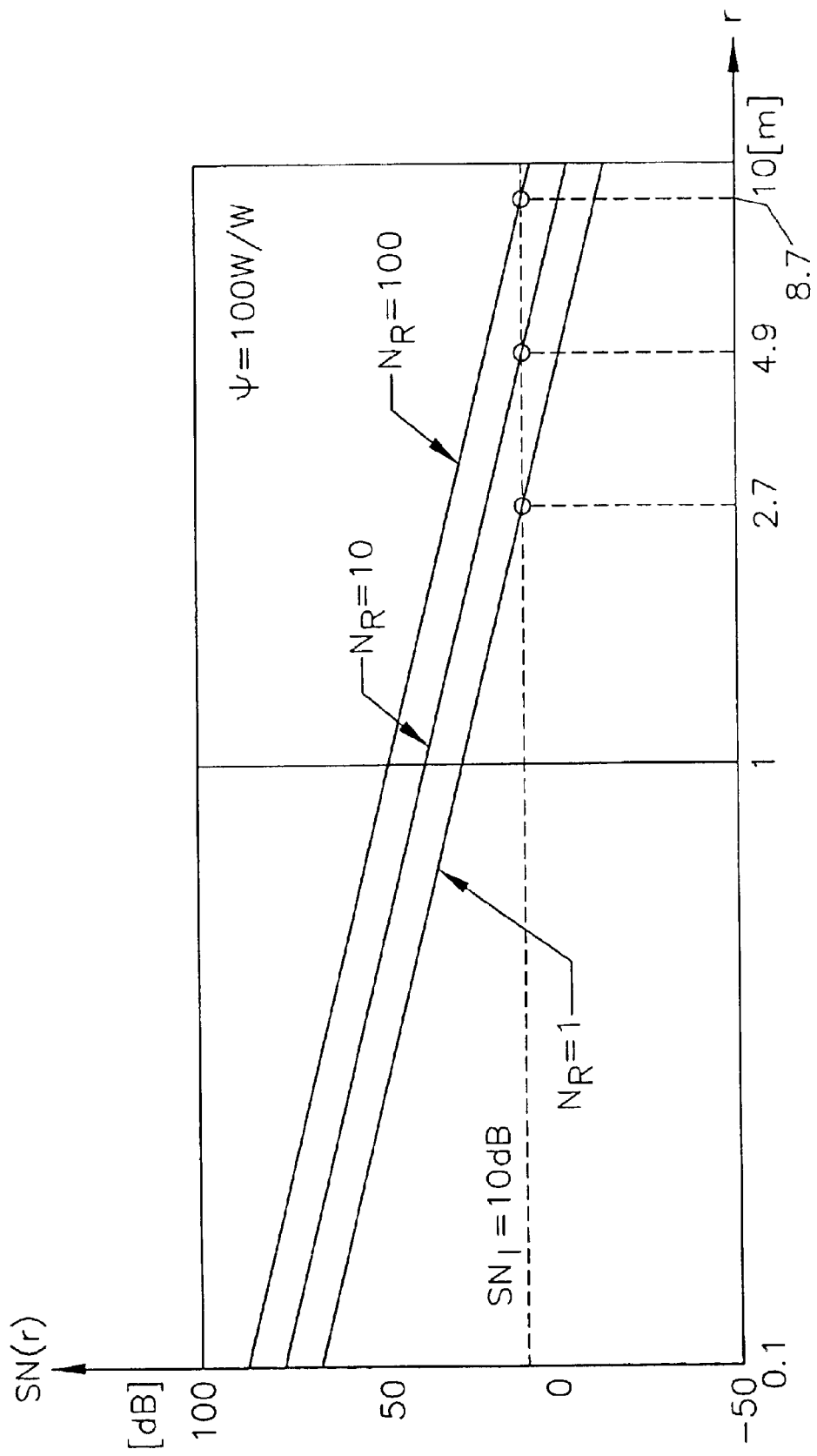

FIGS. 9a and 9b show the response of the signal-to-noise factor SN(r), based on the range r between the TAG and the interrogation unit, as a function of different expansion factors $\psi$ and different interrogation cycles $N_R$.

FIG. 10 shows an example of a surface-wave substrate which has a dispersive delay line (DDL) in the form of a weighted interdigital transducer (IDT) arranged on it for producing a surface-wave chirp signal.

The signal for exciting the dispersive transducer is produced as follows: the sinx/x-type signal from the generator 10 and the carrier frequency signal produced in the carrier frequency generator 11 are fed to the inputs of a four-quadrant multiplier 12. The pulse signal 13 previously described above is formed at the output of the multiplier 12.

If this pulse signal 13 is passed to the dispersive transducer 9, then two surface waves 14, 15 are produced which propagate on the substrate in opposite directions. The two surface waves have chirp characteristics which are complementary to one another. The Figure illustrates a first surface wave 14 with an up-chirp characteristic on the left-hand side and a second surface wave 15 with a down-chirp characteristic on the right-hand side of the dispersive transducer.

When the surface waves 14 and 15 reach the non-dispersive transducers 16a and 16b, electrical signals are again produced at the terminals of these transducers, the said electrical signals having an up-chirp characteristic $U_{UP}(t)$ through the transducer 16a and having a down-chirp characteristic $U_{DOWN}(t)$ through the transducer 16b. The waveforms for these two signals are shown in FIGS. 10b and 10c.

FIG. 11a shows an SAW transducer arrangement in which a chirp signal $U_{IN}(T)$ 18 is initially supplied to a non-dispersive transducer 16. This transducer then produces a corresponding "chirped" acoustic wave which is received in a dispersive transducer 9, so that the known time-compressed pulse signal $U_{OUT}(T)$ which has already been described and is shown in FIG. 11c is again produced at the output. The signal functions of the input signal and of the output signal are illustrated in the Figure sections 11b and 11c.

The same result is achieved if the chirp-type input signal $U_{IN}(t)$ is applied to the dispersive transducer 9 and the output signal $U_{OUT}(t)$ is tapped off across the non-dispersive transducer 16. This context is illustrated in FIG. 12.

FIG. 13a shows an arrangement similar to that of FIG. 12; here, however, two non-dispersive transducers 16 are arranged one behind the other, that is to say staggered in space, on the opposite side of the substrate to the dispersive transducer 9. When the dispersive transducer is excited with a chirp signal $U_{IN}(t)$—FIG. 13b—two compressed pulse signals $U_{OUT1}(t)$, $U_{OUT2}(t)$ are formed at the output, having the same signal profile—FIG. 13c—but being shifted in time with respect to one another by a separation $\Delta T_{21}$ because of the transit time of the acoustic wave on the substrate.

In order to simplify the interpretation of the response signal, the time shift $\Delta T_{21}$ should be at least equal to $T_{SC}$; the time shift, however, is preferably about three to ten times larger than the separation of the zero positions of the major maxima of $U_{OUT1}(t)$ and $U_{OUT2}(t)$. The time shift between the two pulsed output signals is necessary so that the interrogator unit, upon receiving the signal, can then reliably detect and examine them.

Figure 14A:
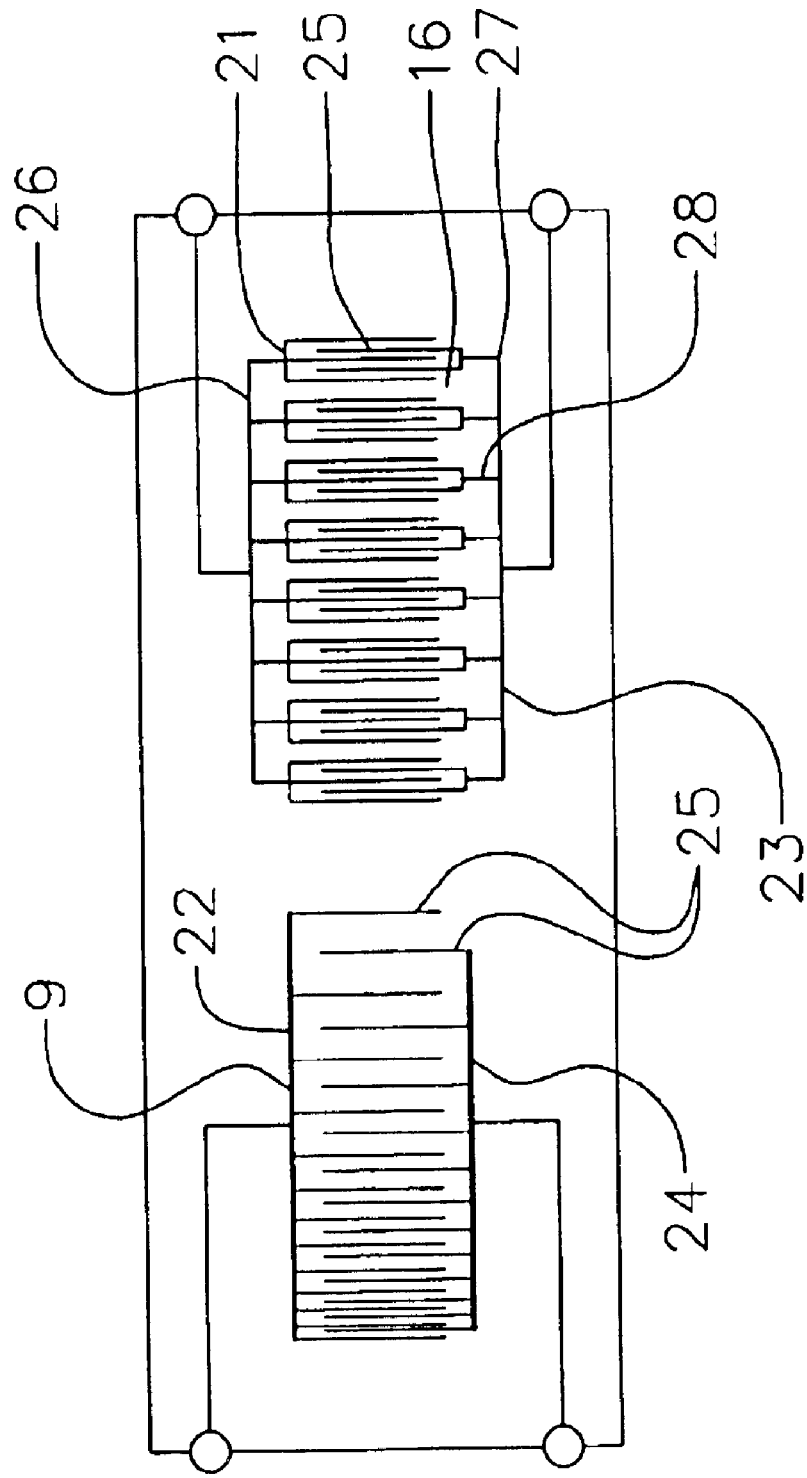

FIG. 14, in an illustration according to FIG. 14a, shows an SAW transducer device with a dispersive transducer 9 and a non-dispersive transducer device 20 consisting of eight non-dispersive transducers 16. In its implementation on the SAW substrate, dispersive and non-dispersive transducers are comparable. Both exhibit a positive electrode 21 and 22 respectively, and a negative electrode 23 and 24 respectively. The electrodes point at each other with the free ends of their conductors 25 (fingers), and the free ends of the conductors 25 are clasped within one another, without touching, however. The positive electrodes of the non-dispersive transducers 16 are linked in FIG. 14 via a common bus line 26—from now on known as the positive bus line. The negative electrodes 23 of the non-dispersive transducers 16 are connected to each other in FIG. 14a via a negative bus line 27. As can be seen in FIG. 14a, dispersive transducer 9 and non-dispersive transducer device 20 are electrically separated from one another, and their coupling consists solely of the surface acoustic wave coupling. In FIG. 14a all non-dispersive transducers are connected in the same way to the respective positive and negative bus lines. This means that, when excited by an SAW pulsed signal, generated by the dispersive transducer 9, they will react with a pulsed sequence, each pulse being shifted in time by comparison with the previous ones, but each having the same form. These amount to a coding or programming of eight logic ones "11111111".

Figure 14B:
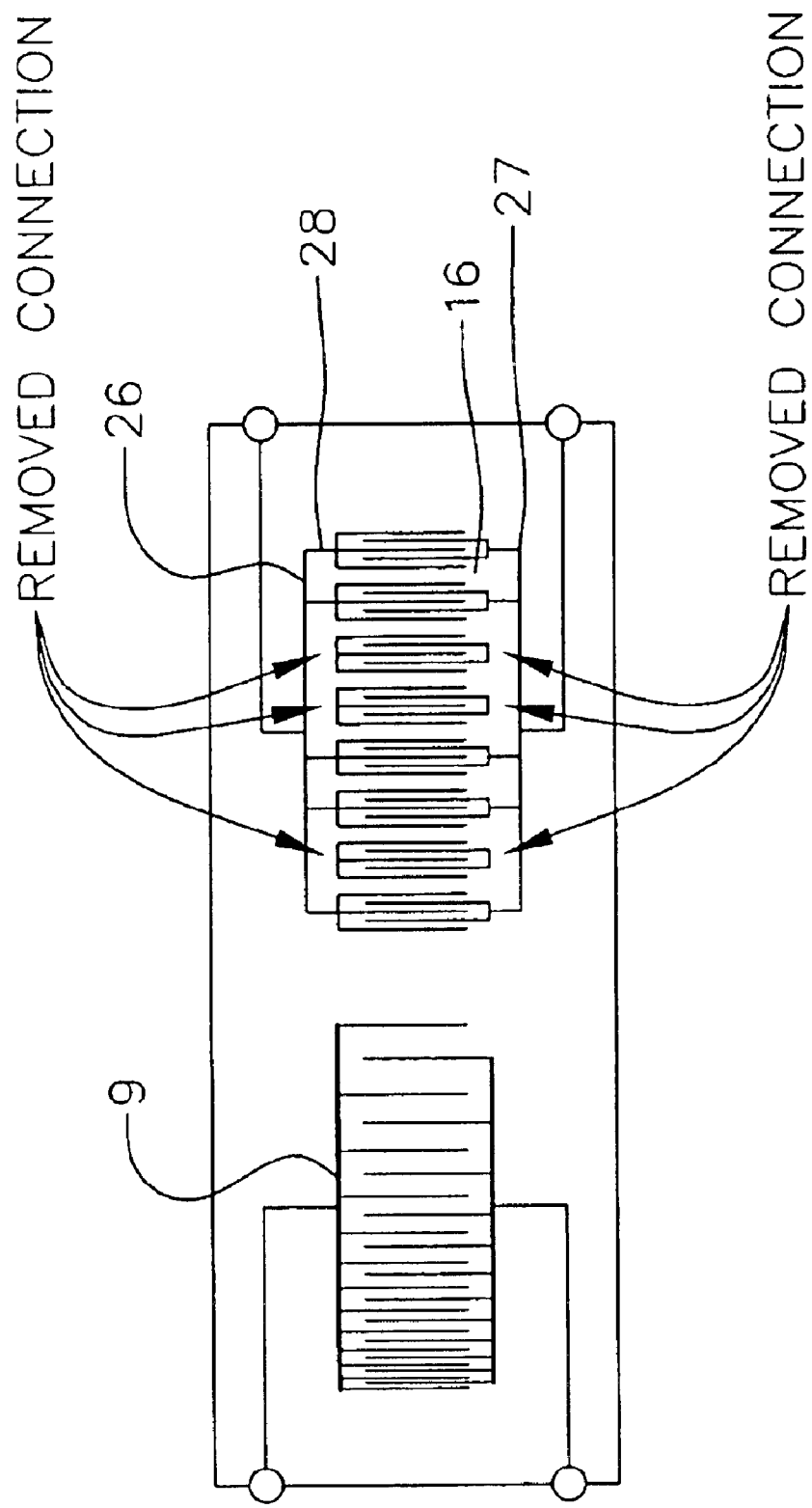

FIG. 14b shows the arrangement according to FIG. 14a, but now with a coded/programmed non-dispersive transducer arrangement. The coding/programming consists here, in a concrete example, in that the connecting leads between the electrodes and the bus lines of the second, fifth and sixth transducers have been removed or broken. When excited with an SAW pulsed signal—generated from the dispersive transducer 9—these transducers therefore cannot output an electrical signal onto the bus line, such that a pulse sequence arises corresponding to a code of "10110011". The removal or breaking-off of existing electrode—bus line connections is a first, preferential type of programming. The removal or breaking-off of connecting lines between the positive and negative electrodes can be carried out by any technology, advantageously by laser cutting or etching.

FIG. 15 shows a further embodiment of the surface wave transducer device already illustrated in FIG. 14b, in which the positive electrode 22 of the dispersive transducer 9 is electrically cut off from the positive bus line 26. The same also goes for the negative electrode 24 of the dispersive transducer and the negative bus line 27 of the non-dispersive transducer. As can be seen in FIG. 15, the pair of electrodes of the dispersive transducer, as well as the bus lines of the non-dispersive transducer device, are then connected to an antenna (30 and 33 respectively). The antenna 33 consists of two parts 31 and 32; the first part 31 is connected to the positive electrode and the second part 32 is connected to the negative electrode of the dispersive transducer 9.

When the surface wave transducer device illustrated is excited with an input chirp signal 14, the transducer device, as already described, reacts at the output with a pulse sequence having the logical significance "10110011". This exemplary identification code has already been described in connection with FIG. 14. It is seen that, at the points at which the second, fifth and sixth transducers of the transducer device 16 are not connected to the positive and negative bus lines, no pulse will therefore be produced, which allows for easy reading, detection and evaluation in the interrogator. It can also be seen that the output signal is a signal with two logic states, namely the "pulse" state equivalent to a logic "1", and the "no pulse" state equivalent to a logic "0" state. In FIG. 15 an identification "TAG Card" is shown at the top by way of example, on which the SAW transducer device is arranged and on which it can be seen that the two antenna arrangements—a receiving antenna 30 and transmitting antenna 33, are arranged on the card in a cross.

FIG. 16 shows, in FIG. 16c, a surface wave transducer device in which the positive electrode of the dispersive transducer 9 is connected with the positive electrode of the non-dispersive transducer 16 and the negative electrode of the dispersive transducer 9 is connected with the negative electrode of the non-dispersive transducer 16.

A chirp signal output by the pulse generator then arrives simultaneously on the dispersive transducer 9 as well as on the non-dispersive transducer 16. Hence the dispersive transducer 9 compresses the chirp signal and produces a first pulsed surface wave in the direction—see also FIG. 16a—of the non-dispersive transducer, while, simultaneously, the non-dispersive transducer produces an oppositely-directed second surface wave, which propagates—see also FIG. 16b—towards the dispersive transducer. This second surface wave displays a chirp-type characteristic corresponding to the received signal.

The first pulsed SAW, upon arrival at the non-dispersive transducer, is also converted into a pulsed electrical signal, while the second chirp-type SAW, upon arrival at the dispersive transducer, is compressed and is converted into a similarly pulsed electrical signal, which appears on the bus lines of the electrodes simultaneously and exactly in phase with the pulsed electrical signal from the non-dispersive transducer. FIG. 16 thus symbolically provides a demonstration, according to which the arrangements according to 16a and 16b can be superposed, in order to arrive at 16c.

Because the excitation signal and the response signal of the arrangement occur with a time delay, the two signals cannot therefore mutually influence each other, and this arrangement makes it possible not only to make use of a common bus line but also a common antenna, which is simultaneously the receiving and transmitting antenna of the TAG.

Figure 17:
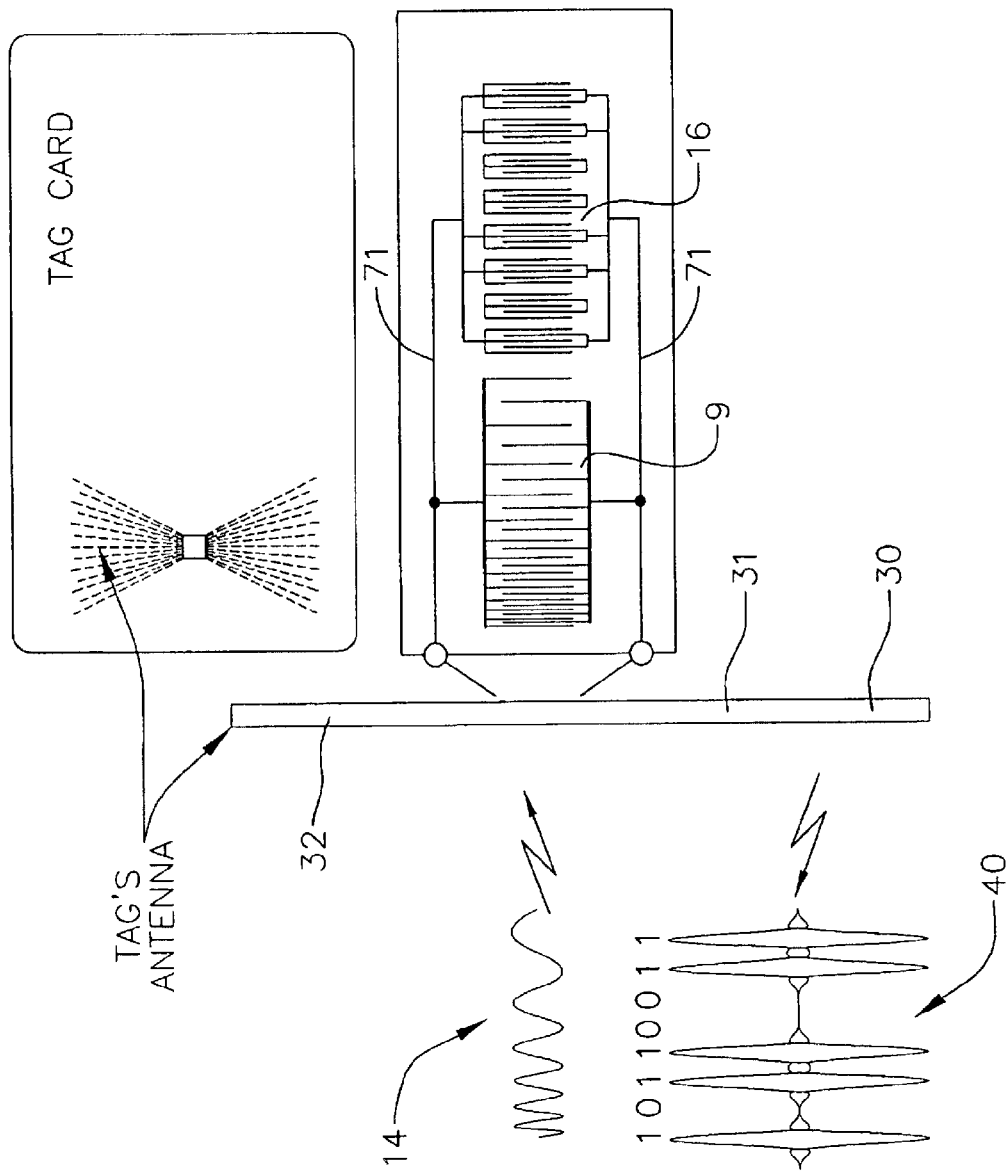

FIG. 17, by way of example, shows the structure of a TAG card with the arrangement presented in FIG. 16c, in which the electrodes of the dispersive transducer are connected with the common bus lines 71 of the non-dispersive transducer. The transducer device shown reacts to an electromagnetic chirp signal 14 as input signal with a pulse sequence 40, which has the logical significance of a binary sequence of "10110011". It goes without saying that the number n of the non-dispersive transducers 16 can very easily be raised, for example to more than 30, and that this gives rise to a very large number of programming possibilities; in fact to more than $2^{30}$.

FIG. 18 shows a further alternative embodiment of the invention. FIG. 18a shows the known structure of a transducer arrangement according to the invention with a dispersive transducer 9 and n=8 non-dispersive transducers 16. However, the second to the eighth non-dispersive transducers now have their positive and their negative electrode connected at the same time to the negative and positive bus lines. Only the first non-dispersive transducer 37, the one lying next to the dispersive transducer, has its positive electrode connected to the positive bus line and its negative electrode connected to the negative bus line. This first transducer element 37 serves—as will be explained later on—as a reference element for the other non-dispersive transducers. FIG. 18b shows the structure from FIG. 18a, but now with a coded/programmed non-dispersive transducer arrangement. In this case it can be seen that, by way of example, the second transducer 38, which lies next to the reference element 37, has its negative electrode connected only to the positive bus line and its positive electrode connected only to the negative bus line. All other originally available connections to a bus line are cut off by the coding. The same is true for the fifth and sixth transducers. The third, fourth, fifth and sixth transducers of the non-dispersive transducer arrangement are normal, and thus have the positive electrode connected to the positive bus line and the negative electrode to the negative bus line. Now if a TAG with a transducer structure as illustrated in FIG. 18b is excited with a chirp signal, for example a down chirp signal, the TAG system then answers with a pulse sequence, consisting of eight pulses. The first pulse—see FIG. 18c—is the reference pulse, produced by the reference element 37. All further pulses, which arise from the non-dispersive transducer elements, which are still connected to the positive and negative bus lines like the reference member, are in phase with the reference pulse. The second, fifth and sixth non-dispersive transducer elements however, because of their transposed connections to the positive and negative bus lines, produce pulse signals which are not in phase with the reference pulse. FIG. 18d shows this context, in which a pulse which is in phase with the reference pulse is interpreted as a 1 bit, and a pulse which is out of phase with the reference pulse is interpreted as a 0 bit.

FIG. 18e shows, once again magnified, the structural arrangement of the positive and negative electrodes to the positive and negative bus lines of the reference element 37, an out of phase transducer 38 and an in-phase transducer 39. For reasons of space, the accompanying antenna 30 with its parts 31 and 32 is not shown in FIG. 18b.

FIG. 19, in a further advantageous embodiment, shows a "quasi" interconnection of the structures which have already been described in connection with FIGS. 17 and 18. FIG. 19a once again shows the SAW transducer device in the "uncoded/unprogrammed" state, such that the positive and negative electrodes of the non-dispersive transducers are therefore still connected to the positive and negative bus line. FIG. 19b shows a coding, in which now single, non-dispersive transducer arrangements are connected either in phase to the bus line or are connected out of phase to the bus line, or are not connected at all to the bus line. This is illustrated in FIG. 19c, once again in a magnified view. From left to right, here again, can be seen the reference member 37, the out of phase transducer 38, the in-phase transducer 39, as well as the unconnected transducer 40. FIG. 19d, in the legend, shows the interpretation of the pulse signals which are produced by the various transducers. Transducer 37 again produces the reference pulse signal, transducer 38 a pulse signal, which is out of phase with the reference pulse signal, transducer 39 a signal which is in phase with the reference pulse signal, and transducer 40 produces no pulse signal, because it is not connected to the bus line. When the transducer device is excited with a chirp signal, the dispersive transducer again makes a pulse signal available, to which the non-dispersive transducer arrangement 16 responds with the pulse sequence 41. Because the output signal can exhibit at least three logic states, the coding capacity and the programming capacity are correspondingly high, since, while in a system with two possible states and (as in the example) eight transducers including a reference transducer, the maximum code capacity amounts to $2^{(8-1)}$= 128, now $3^{(8-1)}$=2187 different possibilities are offered, which allows a further step increase in efficiency and, by comparison with the solution illustrated in FIG. 18, has a capacity increased by a factor of 17, so by 1700%, as a consequence.

FIG. 20 shows a transducer arrangement, which from the signal processing point of view is identical to the surface wave transducer device shown in FIG. 19. However, here, at the initial stage before programming/coding, the second to eighth (i.e. n–1) non-dispersive transducers are connected neither to the positive nor to the negative bus lines. Each electrode of the individual non-dispersive transducers features two connection points 73a, 73b, for which a connection point 73a of the positive 71a and a connection points 73b of the negative bus connection 71a is assigned, or is arranged in the vicinity thereof. The same programming as for the solution shown in FIG. 19 is now applied by means of the appropriate connections 72 of the connecting electrodes with the bus line required in each case. These connections can also preferably be formed by bonding, as is known from chip fabrication for connecting to a silicon chip. FIGS. 20b and 20c show bonded connections 72 of the respective electrode links to the bus line. It is obvious that, with bonding, any desired programming can very easily be carried out and that in this case it is particularly advantageous that the basic structure of the transducer device—see FIG. 28—remains unchanged. This allows for cost-effective manufacture.

FIG. 21 shows an alternative option to that of FIG. 20 for connecting the electrodes to the bus line of the non-dispersive transducers 16. In this case the surface wave transducer structure (SAW structure) as illustrated in FIG. 20a is applied to a lower "plate". This can be a mass-produced article, which can be manufactured very cost effectively. For programming, an upper plate 43, for example a silicon chip 24, can now be laid on top of the lower plate 42. This upper plate already features, on its underside, pre-prepared "code forming" connections, so that just by laying the upper plate 43 on the lower plate 42 the desired respective connections are formed from the non-dispersive transmitters to the positive and negative bus lines. The preparation of "connecting plates"—such as plate 43—can also be carried out very cost-effectively. The connecting of the two plates can be performed by various connecting techniques, for example by means of adhesives, flip-chip technology, etc. Thanks to the use of the two plates, the SAW structure is automatically protected and no longer needs to be separately protected by a protecting film. If the connecting of the plates is carried out by the end customer, the customer decides on the identification and the activation of the SAW structure and hence of the TAG.

Figure 22:
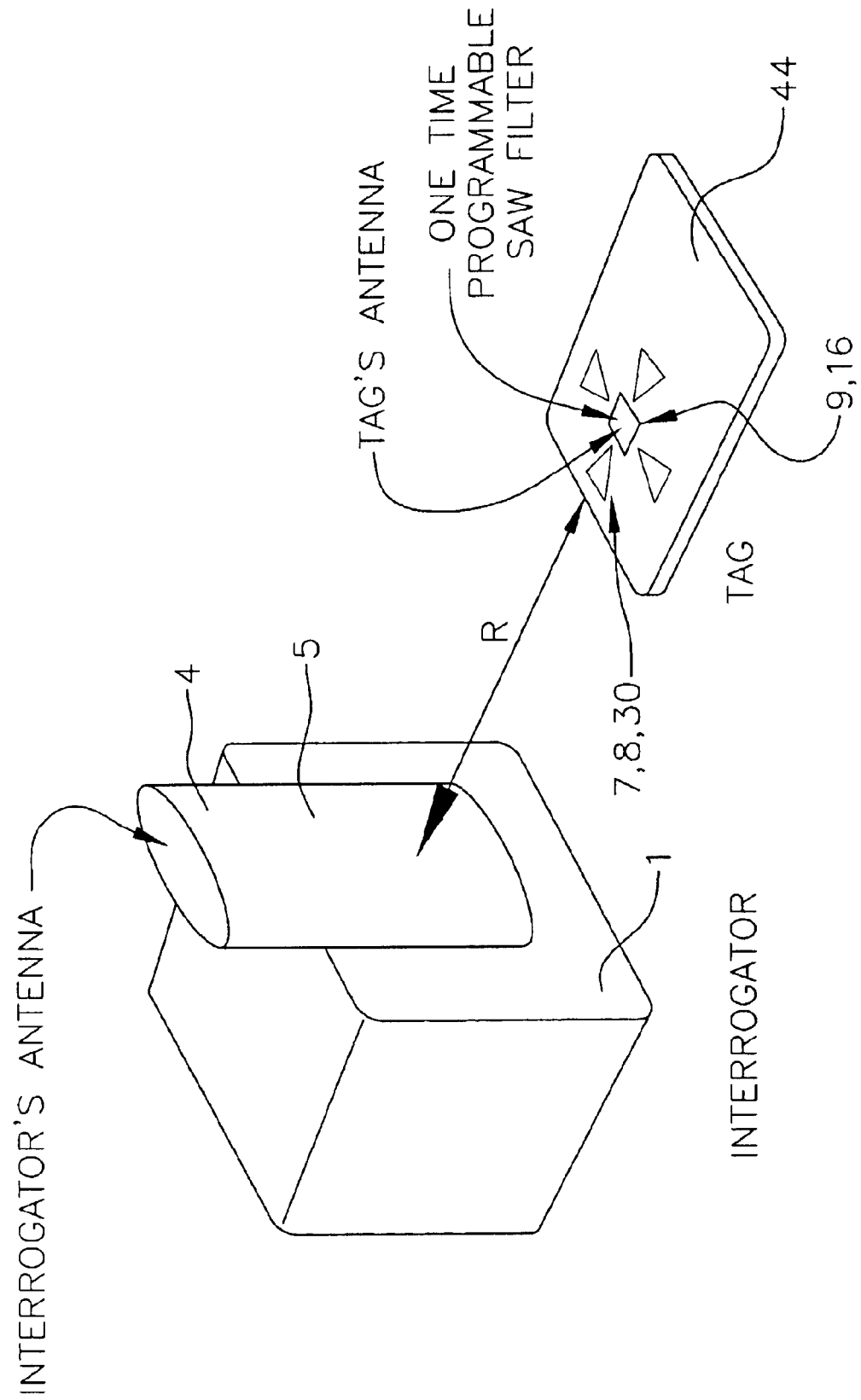
FIG. 22 shows an illustration of an identification system with an interrogation unit and a TAG (passive TAG) according to the invention.

FIG. 22, in a simplified illustration, shows an identification system consisting of the interrogator unit 1 and a TAG 44, on which are formed the SAW structures as shown on the Figures described. In the example illustrated, the TAG is one-time programmable only, for example by putting on the plate—as already shown by FIG. 21—or by bonding—as already shown by FIG. 20—or by removal of connecting leads—as already shown by FIG. 19. It can be established that the maximum distance between the TAG and the interrogator unit 1 at which reliable interrogation communications are guaranteed with the available field strength $H_{max}$ of the interrogator unit can reach 2.7 m. The interrogation range of 2.7 m was achieved when the interrogator unit transmitted a chirp signal as interrogation signal. When a chirp signal was transmitted and the number of interrogations was raised, for example to 100 ($N_r$=100), then under the same circumstances the interrogation range r rose to 8.7 m. By using a chirp signal as interrogation signal and using 2000 interrogations ($N_r$=2000), the interrogation range r reaches as much as 18 m. It is easily possible with the TAG to have more than $10^9$ different codes for programming, so that the identification system has a very high variability/capacity available.

Figure 23:
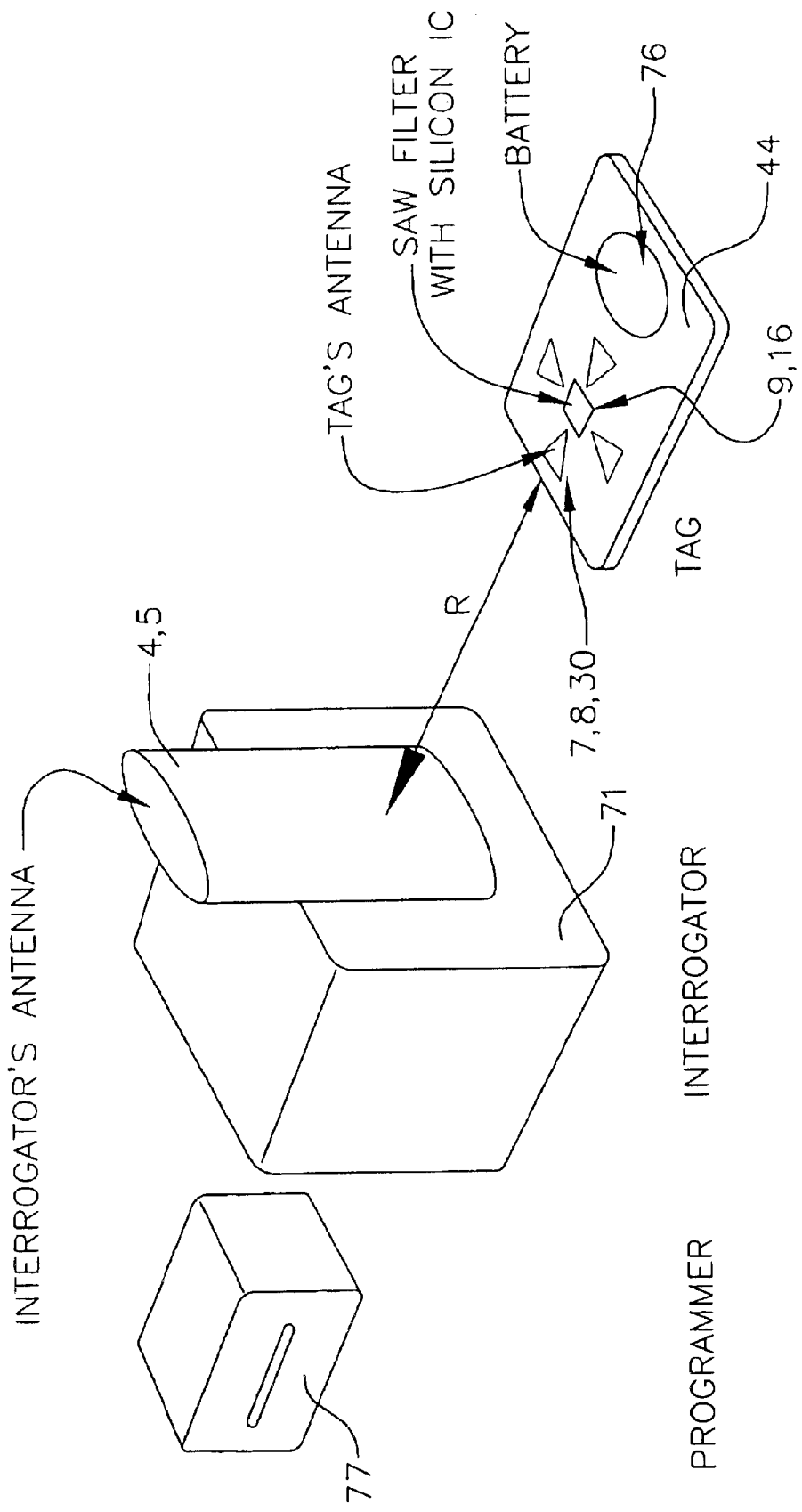
FIG. 23 is as FIG. 22 but with a reprogrammable passive TAG.

FIG. 23 shows the arrangement shown in FIG. 22 of an identification system consisting of an interrogator unit 1 and a TAG 44. However, here the TAG 44 illustrated is reprogrammable (RP). This re-programming can be achieved if—see also FIG. 19a—the positive and negative electrodes of the non-dispersive transducers 16 are simultaneously connected respectively to the positive and negative bus lines. In this case, for reprogrammability, fixed links such as bonding wires are not used for the connecting path, but switching elements, which are preferably field-effect transistors, are interposed, which are linked to a switching driver. The switching driver controls the "open" or "closed" setting of the switching transistors. The transistors can now be controlled in a very simple circuit. The energy required to run the circuit can be supplied from a battery 76 on the TAG, in which case this battery is preferably a foil battery. A drastic increase in the program code capabilities can also be achieved, in that, as an example, between the successive interrogations with the interrogation signal, a code is switched over, such that, with reference to a specific unit of time—for example the unit of time of two chirp signals—k (=2) different codes are programmed. In this way it is possible for the total number of possible codes, by means of automatic coding by programming 77, of the number of available codes to be substantially increased, for example in a range of $2^{9k}$ in which $k \geq 1$. If k=3, then up to $2^{27}$ programme code options exist, which represents a large programming capability and allows for an identification system within as many identification tags as desired. Theoretically, the total number of variants then depends only on the storage capacity of the IC and on the time taken for the transmission.

Figure 24:
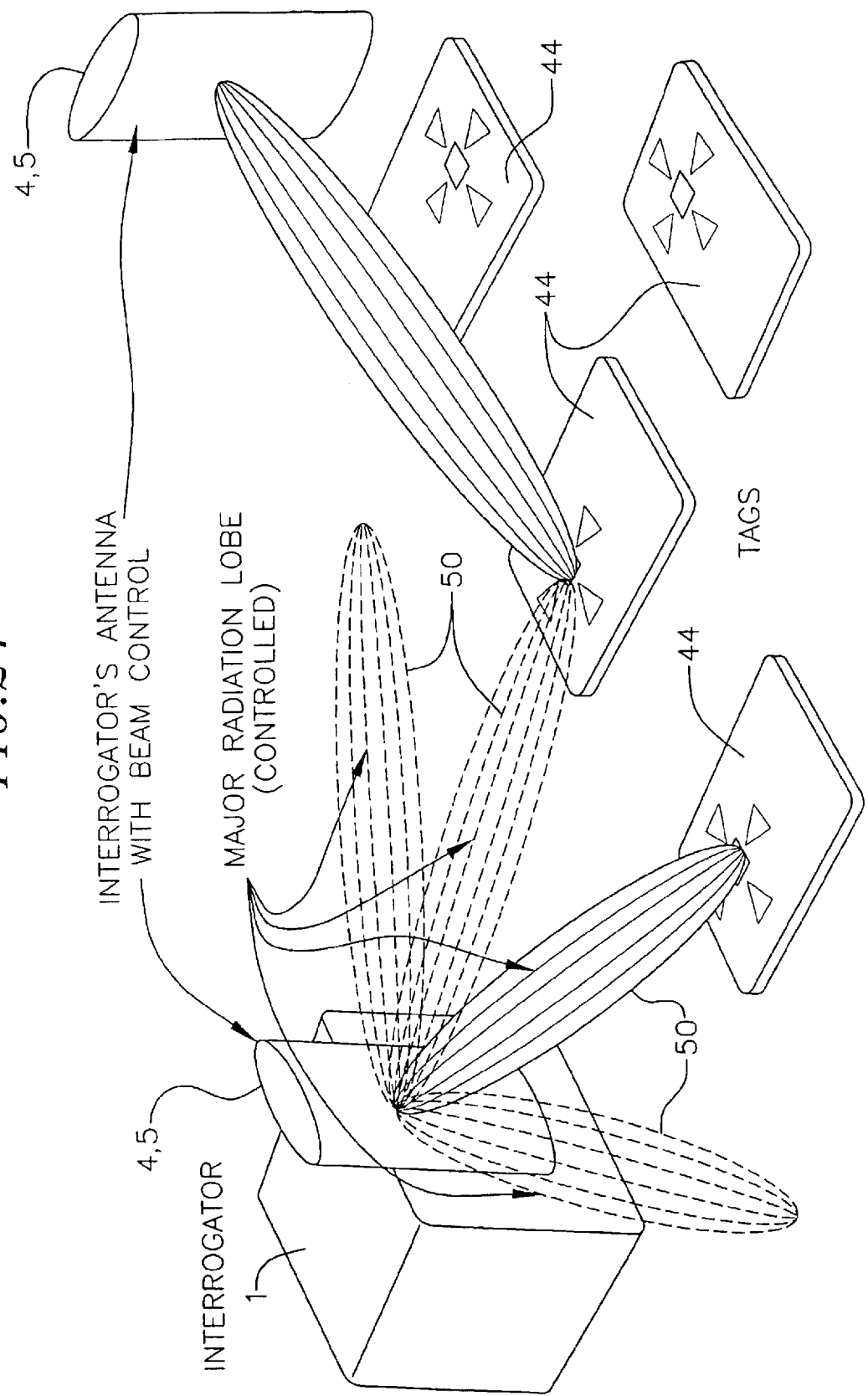
FIG. 24 shows an illustration of an identification system according to the invention with a number of interrogation units and a number of TAGs.

FIG. 24 shows an arrangement of an interrogator unit 1 with several antennae 5, in which each antenna makes use of a major lobe 50 and so can only identify TAGs which lie within a defined spatial angle of the antenna. The major lobes can be set to the desired direction, which means great selectivity of the interrogation in connection with the respective geographical location of a TAG. If a TAG is simultaneously interrogated by two antennae, it is also possible in this way accurately to establish the exact geographical location of the TAG.

Figure 25:
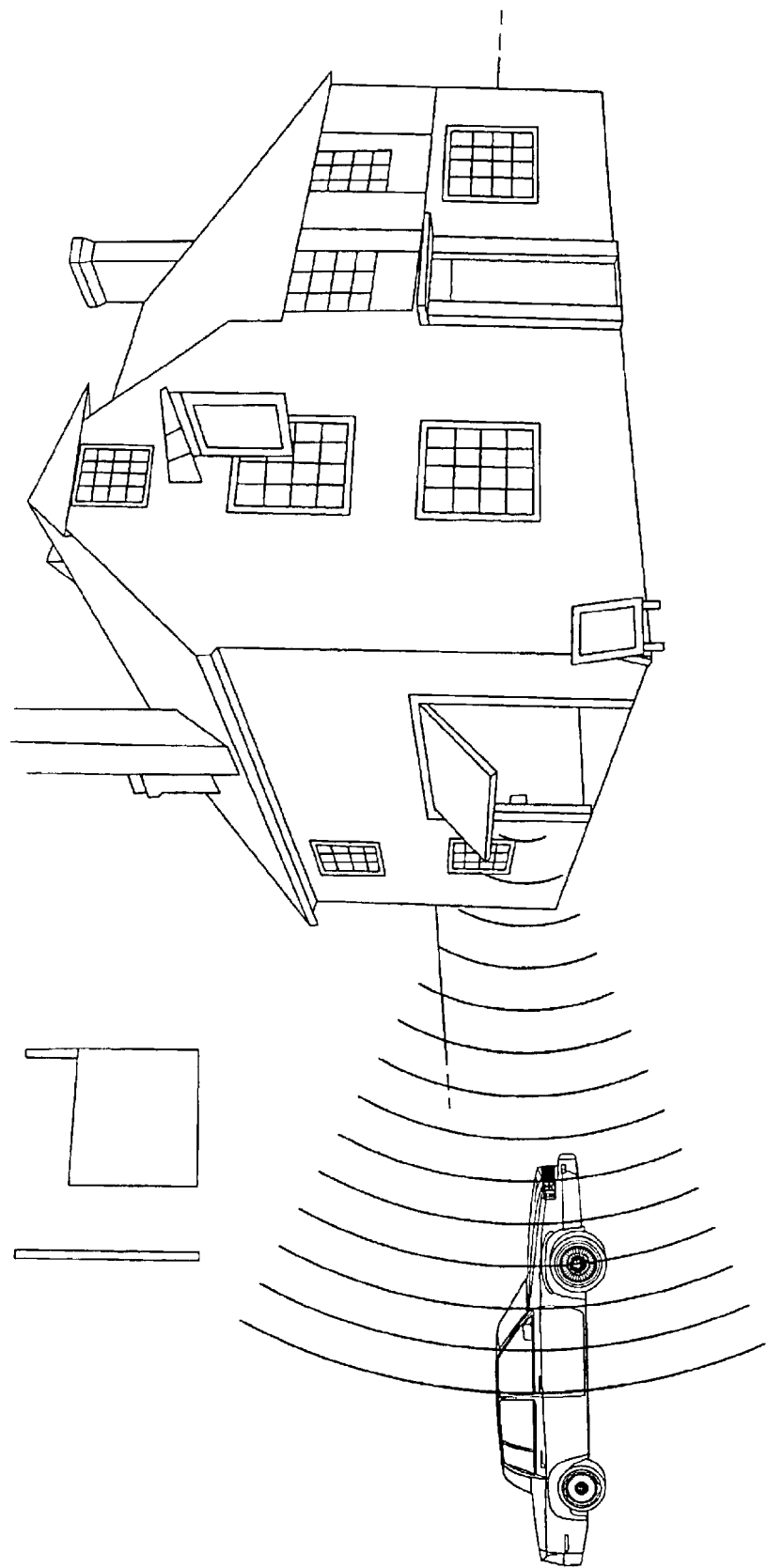
FIG. 25 shows an illustration of an exemplary application of an identification system according to the invention.

FIG. 25 shows a typical example of an application of the TAG in accordance with the invention. In this case it is assumed that the interrogation unit is set up in the garage of a house. The TAG in this case is fixed in the car, or better is an integral part of the motor car, for example in the windscreen glass, so that it cannot easily be removed. As the motor car approaches the house, at some point it will reach the range at which the interrogation unit, after sending out an interrogation signal, receives a TAG coded signal and identifies it. If the TAG code corresponds, upon analysis, with the code which an analysis unit of the interrogator is expecting, then the garage is opened by a command signal to an automatic garage door actuator. It goes without saying that it would be advantageous in this case for the garage only to be opened when TAG code signals are received which originate from motor cars whose owners also have the right of access to the garage. The solution illustrated is very advantageously for a hotel garage, such that the hotel guest after checking into the hotel then receives a TAG and can drive his car into the garage without having to obtain a conventional key in order to do so. The TAG in this case may simultaneously also be the room key, when the room door operates by means of a corresponding interrogation unit and an opening mechanism which is controlled by the interrogation device. After the guest checks out, this identification will be set to "non-valid", such that neither the hotel door nor the hotel garage can then be opened. This system presupposes a simple data network connection, which can be installed with no problem.

Figure 26:
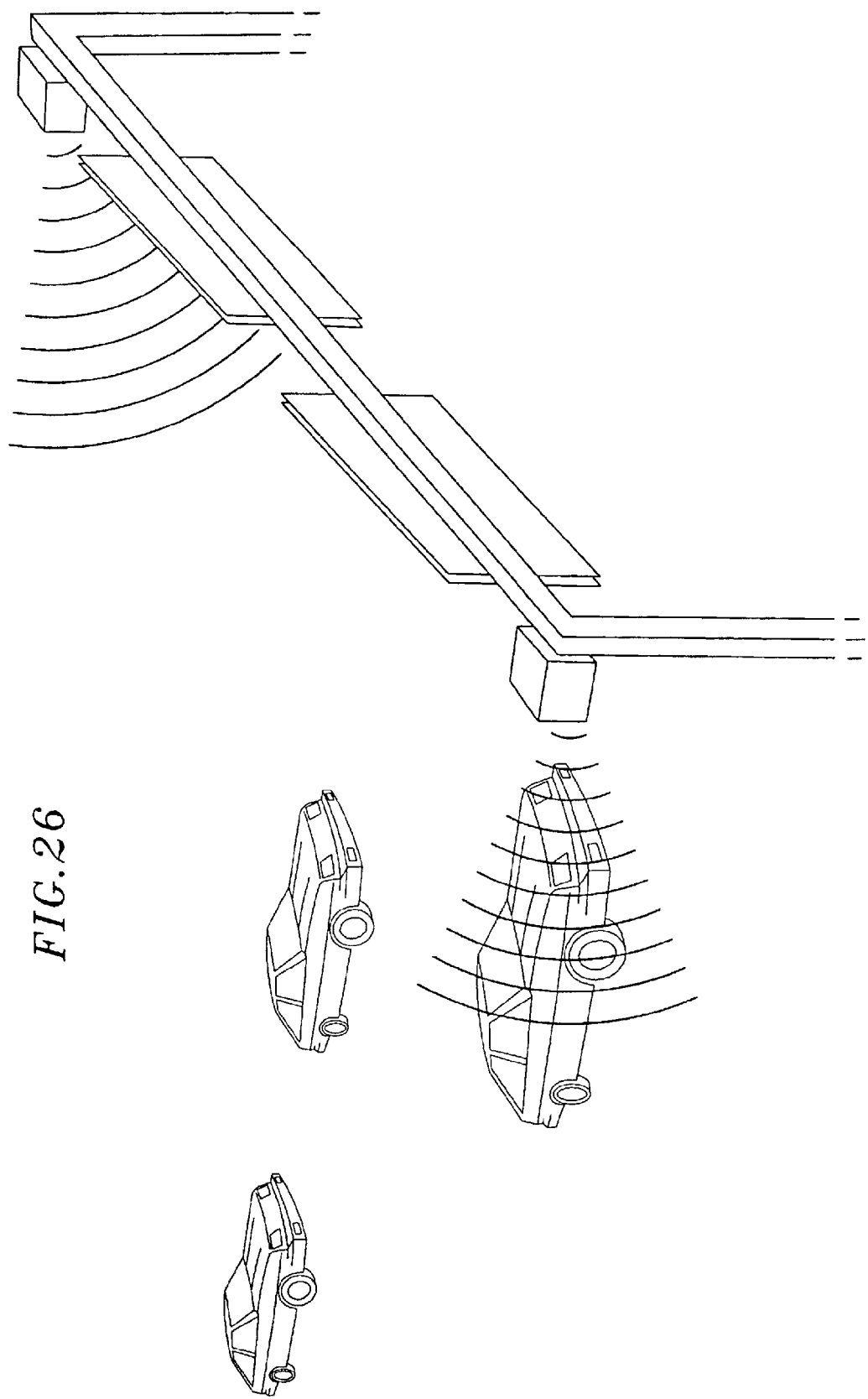
FIG. 26 shows an illustration of a further exemplary application of an identification system according to the invention.

FIG. 26 shows a further example application. In this case a normal situation on a motorway is shown, in which several vehicles are driving through under a road sign gantry. Two interrogation units are installed on this road sign gantry, left and right on the gantry. As the motor car approaches and comes within the maximum range, the interrogation unit can process the code signal sent back by the TAG—the TAG is again in the motor car, on the motor car or an integral part of the motor car, for example in the windscreen glass—and send it back to a central data unit. In this way it is possible not only to monitor the flow of traffic, but it is also easy to identify individual motor cars. If an identified motor car is stolen, for example, the corresponding Police monitoring unit will know very quickly where the motor-car is and in which direction it is travelling. In this way a very quick apprehension is possible.

It goes without saying that the surface wave transducer device according to the invention, and thus the TAG according to the invention, can be fitted in all possible products, be it as a card, as adhesive film or the like. It is suitable for use as anti-theft protection of products, when the TAG is an integral part of the product, which is also achieved when it is bonded to the product or firmly fixed to it in any other way.

Figure 27:
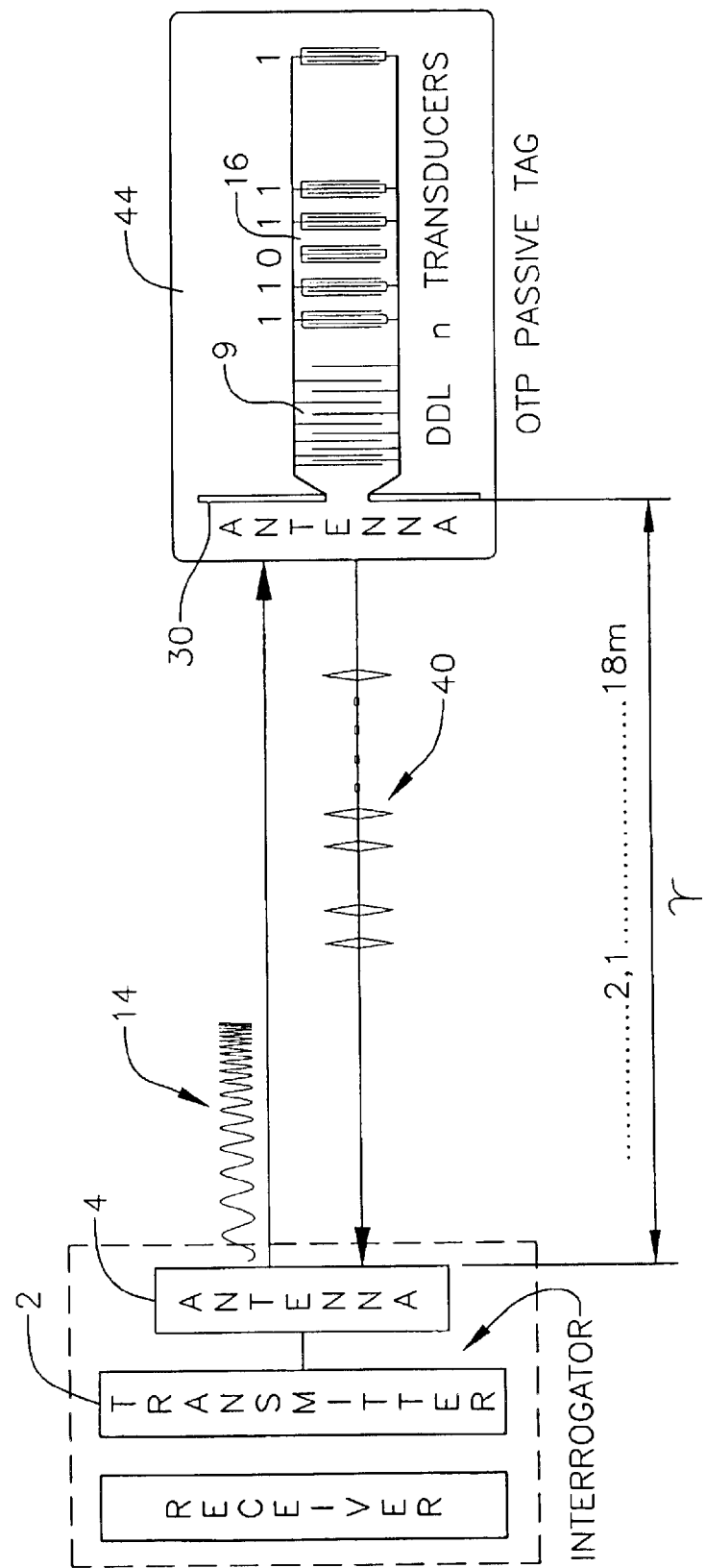
FIG. 27 shows an illustration of an identification system according to the invention with a passive TAG.

FIG. 27, once again in a functional and structural overview, shows the TAG in accordance with the invention, which in the example illustrated is once again a programmable TAG. The still reasonable distance between the TAG and the interrogation unit depends in this case essentially on the number of the interrogations, but above all also on the interrogation signal, which advantageously is a chirp signal, but can also be a radio frequency pulse. As the response to the interrogation signal, when it is a chirp signal, the TAG sends back a pulse sequence, whose amplitude and/or phase depends on the programming of the non-dispersive transducers.

Figure 28:
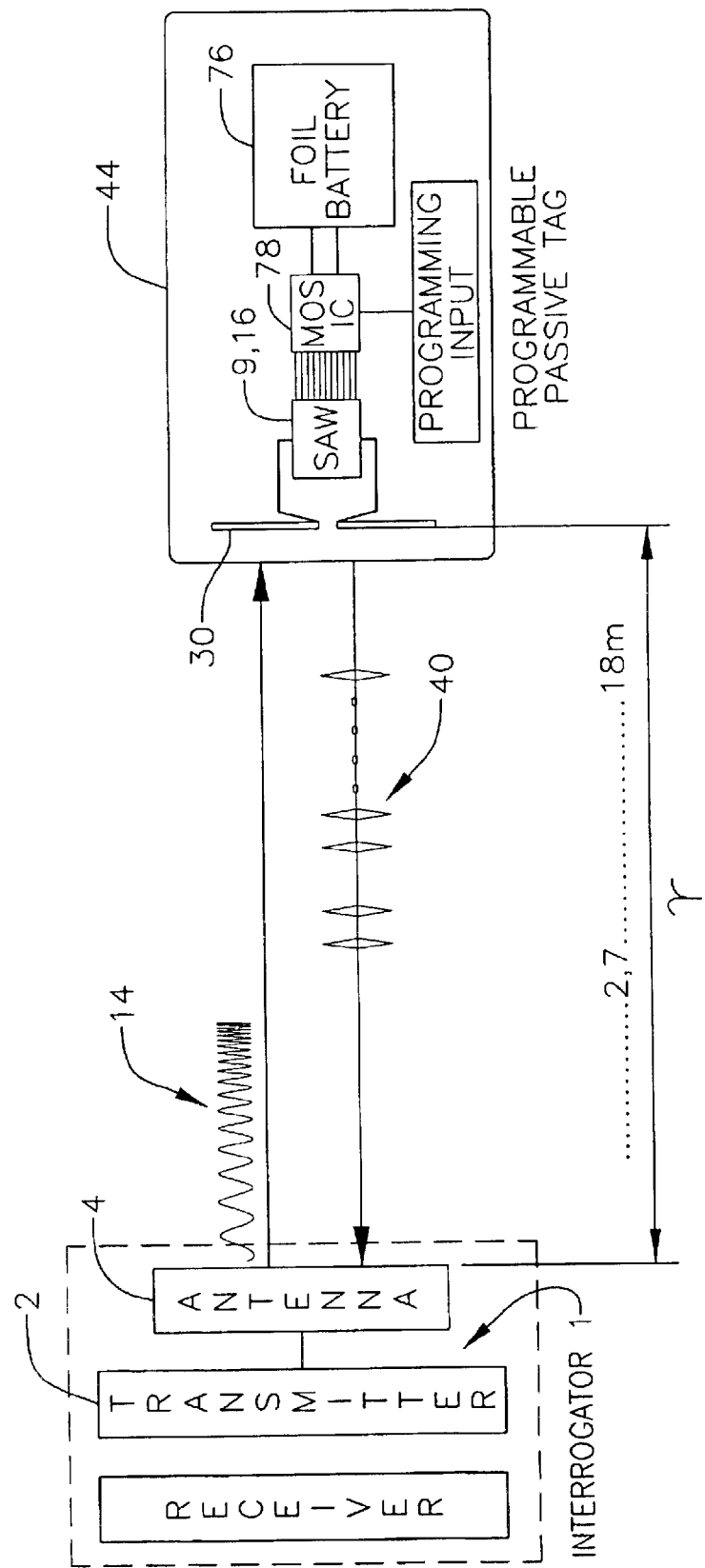
FIG. 28 shows an illustration of an identification system according to the invention with a reprogrammable passive TAG.

FIG. 28 shows the structure of an identification system according to the invention with a reprogrammable TAG according to the invention. In this case it can be seen that the SAW filter structure 9, 16 is connected with an MOS IC 78, with which the transistors which lie on the connecting lines between the positive electrodes and the bus lines of the non-dispersive transducers will be switched. The programming can be altered at any time via a programming input. As energy sources, a foil battery 76 for example (pre-loaded capacitor, solar cell, etc) is provided, so that the reprogrammable TAG 44 has the longest possible life expectancy. Obviously, with a battery, the endurance of such a TAG can be pre-set, which, for example with card systems, is an advantage, such that a card with a TAG in accordance with the invention is only valid for a given length of time. To that end, it is advantageous for the TAG also to have a timer switch available.

Figure 29:
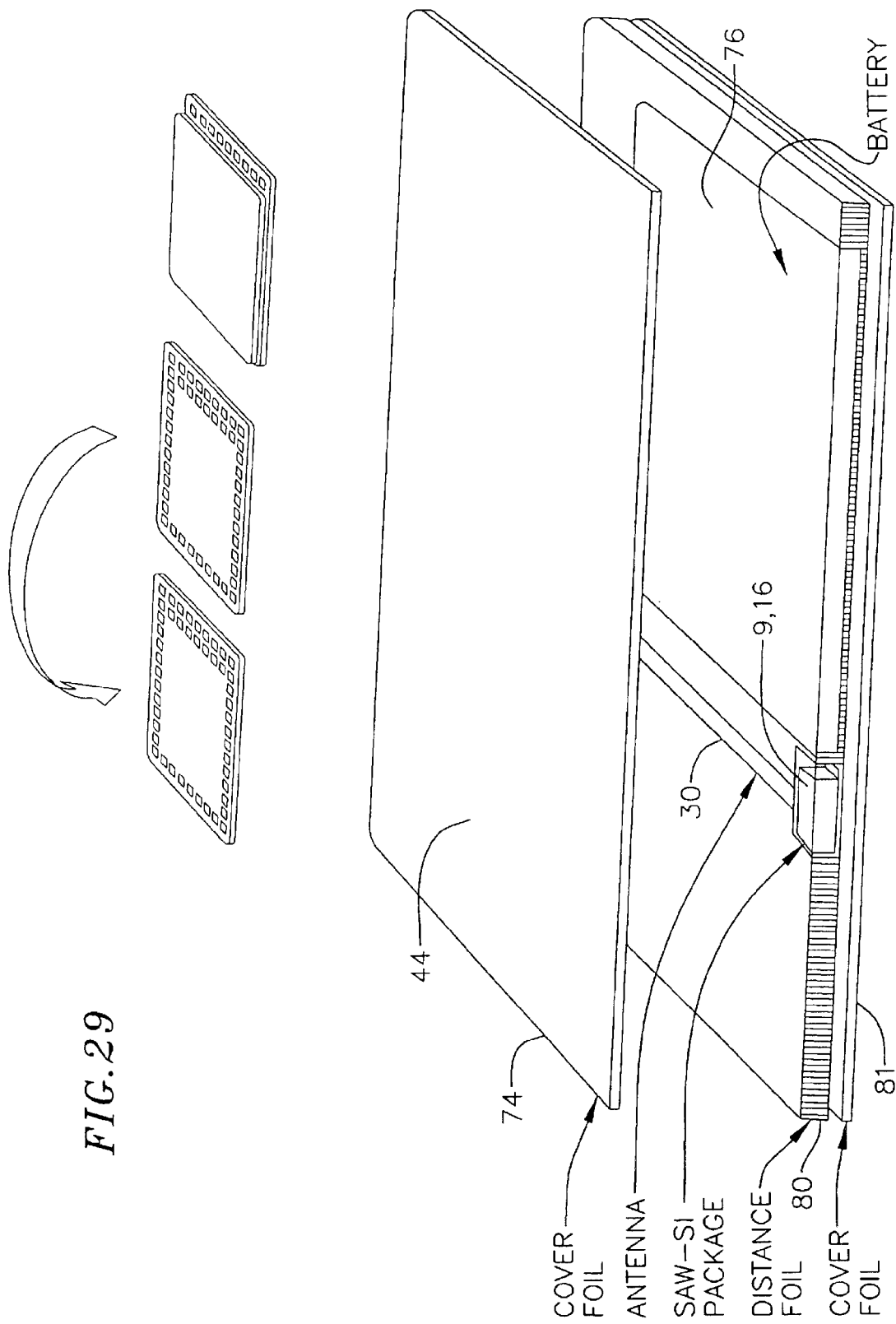
FIG. 29 shows a diagrammatic illustration of a TAG according to the invention.

FIG. 29 shows the production of a TAG in accordance with the invention, in which the TAG consists of three layers 79, 80 and 81; the first and third layers 79, 81 represent a protective layer, and the middle layer 80 is formed from distance foil, within which the surface wave transducer structure (SAW) together with the antenna and the foil battery are arranged.

FIG. 30 shows various possibilities for connecting an SAW (surface acoustic wave) chip and a silicon connecting chip, in which the respective connections are arranged on the silicon connecting chip, such that programming/coding of the SAW is assured. The connecting can again be done as illustrated by bonding—FIG. 30a—or by a technology known as flip-chip technology—see FIG. 30b—in which the silicon connecting chip is turned over onto the SAW chip in a similar way to flip-chip technology. It is also possible to arrange the SAW structure above the silicon connecting chip structure—FIG. 30c—or to provide for the SAW structure and the respective connections at the same time in a production process on a silicon wafer.

If the programming/coding of an SAW structure is carried out by applying a connection, for example by applying a flip-chip technology silicon connecting chip—see FIG. 30b—first the TAG is itself activated by the programming, since without the connection the TAG has as yet absolutely no function as a surface wave transducer. Such a system therefore practically has the function of a "key", which simultaneously programs and activates the "lock". Upon excitation with a chirp signal, a TAG programmed/activated/coded in this way thus sends out the desired pulse sequence, which is identified or recognised precisely as an identifying key-lock-setting of the TAG. It is then solely up to the operator of the identification system as to whether duplicate identifiers can occur. Duplicate identifiers are useful, for example, for groups of objects and persons which are related in any way.

FIG. 31 shows the connection between an SAW circuit 83 and a silicon chip 82, in which the SAW structure is arranged on the lower plate 42 and the silicon chip is arranged on the upper plate 43. The lower plate 42 with the SAW structure features power supply connection regions 51 and 52 as well as programming connections 53. The upper plate, which only 35 partly covers over the lower plate, so that a part of the power supply connections 51 and 52 still remains uncovered, likewise features programming connections 54 and power supply connections 55. The upper plate further features a silicon chip 82, the structure of which is further explained in connection with FIG. 45.

With the upper plate lying on the lower plate, their respective programming connections 53 and 54, as well as the power supply connections 51, 52 and 55 come together, in such a way that a part of the power supply connections 51 and 52 of the plate remains uncovered. It is then very simple, by means of a suitable power supply, which is applied to the power supply connections, and corresponding programming by means of the antenna connections 57, to program the silicon chip 82 and likewise the SAW structure, and hence the TAG 44. In this case re-programming is possible at any time.

FIG. 32 shows the layout of a non-dispersive transducer arrangement in the middle of the SAW substrate. When the dispersive transducer 9 receives a chirp pulse produced by a chirp pulse generator, it produces two surface acoustic waves, namely a compressed surface wave pulse signal 13 and an expanded chirp pulse 58. In FIG. 32 it can be seen that the compressed pulse 1 moves to the left and the expanded chirp pulse signal moves to the right (on the Figure). The respective signals then encounter a non-dispersive transducer arrangement, so that at the output the signals $U_{COM}(t)$ and $U_{EXP}(t)$ will be produced as electrical signals. The respective signal profile of the compressed as well as the expanded signal are illustrated in FIGS. 32b and 32c. Such an arrangement has the advantage of sending first up chirps and then down chirps from the interrogator unit In such a way as to increase the programming capacity or to switch between various interrogation hierarchies.

FIG. 33 shows a further alternative embodiment of the invention. In this case the non-dispersive transducers are implemented as already explained in connection with FIG. 20. However, the dispersive transducer 9 is implemented in several parts; in the example illustrated it consists of three parts 84a, 84b, 84c, of which the first part is suitable for high-frequency signals, the second part is suitable for medium-frequency signals and the third part is capable of processing low-frequency signals and producing appropriate surface wave signals. FIG. 33a shows that the three parts of the dispersive transducer 9 are not connected to the respective positive and negative bus lines. The respective positive and negative electrodes of the respective dispersive transducer parts feature connecting areas, which are arranged to lie adjacent to the negative and positive and bus lines.

FIG. 33b shows the bonding of the first two dispersive transducer parts 9, such that these are connected to the respective positive or negative buses. The third part, in the example illustrated the low-frequency dispersive transducer part, is not connected to the bus line. Hence the dispersive transducer device 9 is also programmable, which increases the overall programming or coding capacity of the system. The TAG represented in FIG. 33b must therefore be excited with a chirp signal, the frequency bandwidth of which is tuned to the bandwidth of the high-frequency and medium-frequency dispersive transducer parts. For any other programming of the dispersive transducer device another interrogation signal would have to be used, so that the interrogation signal can always be answered with a TAG signal.

FIG. 34 shows the programming of the TAG as already described in FIG. 33, with a programmable dispersive transducer device, in which the programming is done by overlaying an upper plate on the lower plate, which has already been explained in connection with FIG. 33a. The upper plate features the desired connecting surfaces, corresponding to the programming, which fit onto the respective connecting terminals of the positive and negative electrodes of the dispersive and non-dispersive transducers.

FIG. 35 shows a further alternative embodiment of the invention. In this case non-dispersive transducer devices 16a and 16b are arranged left and right of the programmable dispersive transducer device 9. Each of these transducer devices 16a, 16b can be programmed with a different code. As already explained in connection with FIG. 32, the dispersive transducer device, upon receiving a chirp signal, produces a time-compressed pulse signal and an expanded chirp pulse signal. In the example illustrated, the time-compressed pulse signal diffuses to the left and the expanded chirp pulse signal diffuses to the right. In the example illustrated a pulse sequence is produced only from the non-dispersive transducer device to the left of the dispersive transducer device, when the TAG is excited with a down-chirp signal. Upon excitation with an up-chirp signal, the coding of the pulse sequence is determined by the transducer device 16 to the right of the dispersive transducer device 9. In this way one particular code is determined by the up-chirp signal and another code by the down-chirp signal.

The structure for the up-chirp signal and down-chirp signal is shown in FIG. 36, which is complementary to FIG. 35.

FIGS. 37 and 38 show a structure similar to FIGS. 35 and 36 with a programmable dispersive transducer device 9 and, arranged on both sides of it, non-dispersive transducer devices 16. In the example illustrated according to FIG. 37 and 38, the TAG is not programmed and it is in the pre-programming condition. The programming can be done, as already explained in connection with FIG. 14, by cutting off or removing particular connecting lines between the electrodes and the respective bus lines 71a, 71b.

FIGS. 39 and 40 show the arrangement of a "one-piece" dispersive transducer device 9, which is again enclosed on both sides by a non-dispersive transducer device 16, in which both non-dispersive transducer devices can be programmed differently. FIG. 39 shows the arrangement for a down-chirp pulse as interrogation signal, FIG. 40 shows the case for an up-chirp pulse as interrogation signal. The programming can again be done by removing the connecting lines.

FIG. 41 shows the pulse signal sequence upon excitation with a down-chirp signal, as well as an up-chirp signal. The code for the down-chirp signal in this case is set as the sequence of letters "RBACBBCA" and the code for the up-chirp signal is set as the sequence of letters "RCBACBAB". The programming necessary to this end can be ascertained directly from FIG. 41. The respective pulse signal sequences for the down-chirp signal and the up-chirp signal as interrogation signal are illustrated respectively in FIGS. 41b and 41c. Thus it can be seen that the signal sequences of the compressed pulses will be overlaid on the expanded chirp signals, but that the amplitude of the expanded chirp signals lies far below the maximum amplitude of the time-compressed pulses, and so a perfectly good distinction can be made between the time-compressed pulse signals and the expanded chirp signals.

FIG. 42 shows a further alternative embodiment of the invention. In this case two dispersive transducer devices are arranged on the TAG, which enclose a non-dispersive transducer device. Upon excitation with a down-chirp pulse signal, the first dispersive transducer device 9a produces an expanded chirp pulse signal, and the second dispersive transducer device 9b produces a time-compressed pulse signal. The complementary case to this is illustrated in FIG. 43, so that with an up-chirp pulse signal as interrogation signal the first transducer device 9a generates take time-compressed pulse signal and the second of dispersive transducer device 9b generates an expanded chirp signal.

FIG. 44 shows the signal structure of the SAW-structure illustrated in FIGS. 42 and 43 upon excitation with an up-chirp signal and upon excitation with a down-chirp signal. Thus it can be seen that the respective pulse code sequences 40 for the up- and down-chirp signals are reciprocal to each other, so that an interrogation unit, by means of a time-shifted generation of an up-chirp and down-chirp signal, can check the reciprocal pulse signal sequence for its (reciprocal) integrity, which leads to an increase in the interrogation security and thus allows only permissible results, when the TAG is structured in the way illustrated. Thus, for example, should the TAG be lacking the second dispersive transducer device, then the interrogation unit would receive no pulse signal seconds on the down-chirp signal, and could possibly regard the analysis as "non-valid".

FIG. 45 shows the structure of our reprogrammable passive TAG. Here the TAG features the already described SAW structure 60, an antenna device 61 as well as a silicon chip 62. The silicon chip features a switching matrix 63, a microcontroller 64, a reprogrammable memory 65, a programmable interface 66 as well as a low-pass filter 67. The silicon chip also has access, via a connection, to an energy source 68, for example a battery, a solar cell, a storage capacitor, etc. The low-pass filter 67 is connected to the antenna parts of the antenna 61. The SAW structure 60 is further connected to the switching matrix 63, which for its part is also connected to the microcontroller 64, which is connected to the memory 65 and the interface 66.

A further embodiment of the TAG according to FIG. 45 is illustrated in FIG. 46. Here the microcontroller features a further interface to a data source 69, which in the example illustrated is formed by a sensor, via which data or program data, e.g. temperature, environmental data, biometric data (e.g. fingerprints) can be input into the microcontroller, so that the SAW structure can be programmed accordingly.

FIG. 47 shows the principle of the programming. Here it can be seen that the TAG already described in FIG. 46 is coupled to a programming device 90, which makes use of programming antennae 91 and 92. The programming device 90 can, for its part, have a data connection to an external apparatus, for example a computer, a network, etc. For programming, the programming data is transmitted via the antennae of the programmer 90 onto the tag 44 and it is possible to load several programs or several different codes into the code memory 65, and to programme the SAW structure via the microcontroller correspondingly. The various codes in this case can be selected via the data source 69.

The programming of the reprogrammable TAG is explained further in the system illustration according to FIG. 48. Here it can be seen that the TAG is inserted into a programmer device 90, in which a single identification code or a number of identification codes are loaded into the code memory of the TAG. The programming data is transmitted in the low-frequency band, so that it can be taken off from the low-pass filter. The data processing of the programming data is done in the programmer interface. It can be seen in FIG. 48 that the antennae 91, 92 of the programmer 90 are arranged to be very cross to the TAG antennae, so that the high transmission power required for the programming can be made available.

If the TAG is arranged in a measurement device, for example an environmental measuring device, it is expedient for measurement data to be transferred to the TAG via a data input, so that, upon a corresponding interrogation, the TAG sends out a pulse code sequence which represents the respective measurement signal. It is thus possible with simple means to retrieve measurement signals from a measurement apparatus by wireless means, without the measurement apparatus having its own active transmitting device available. By appropriate control of the data input, it is also possible for all the measurement signal sequences, upon an appropriate interrogation of the TAG, to be transferred to the interrogation unit.

For the above-described measurement signal retrieval by means of the TAG it is appropriate for each measurement signal to contain a particular identification code, which identifies the respective TAG and hence the corresponding measurement device. The additionally coded data then represent the desired measurement signal to be retrieved. Instead of the measurement device described, the TAG can be coupled with any other imaginable data source, which transfers data into the TAG, the data for its part being retrievable by the interrogator. Such a data source could also be a medical technology appliance or a data processing device.

With the invention it is obviously also possible for the TAG to feature one-time programmable non-dispersive transducers and reprogrammable non-dispersive transducers, so that only a part of the pulse signal sequence is freely programmable.

It is also possible to replace the dispersive transducer device with a non-dispersive transducer device. In this case it is then appropriate for a conventional pulse signal to be used as interrogation signal, so that the TAG can reply with the desired pulse signal sequence to the interrogation signal.

It is also possible for the interrogator to send out an identifying pulse sequence, to which only one TAG, which is programmed so as to correspond to the identification pulse sequence, reacts with a desired response signal. It is thus possible selectively to determine the presence of particular ident TAGs among a large number of other TAGs.

It is also possible for the interrogator firstly to send out a chirp signal and, following that, an identification pulse sequence, so that, for the TAG which is being sought, a very reliable interrogation can ensue.

It can also be seen from the foregoing description that a large number of dispersive transducer devices can be combined with a further large number of non-dispersive transducer devices, such that the non-dispersive transducer devices can even feature a variable number of non-dispersive individual transducers.

The illustrations described show only a principal structure, in which the method of operation of the arrangement according to the invention is explained. Many variations based on switching technology can be envisaged, which incorporate the same functions. Thus cascade connection of inter-digital-transducers (IDT) should be expressly mentioned. These can be installed in order to keep the capacity of the transducer arrangements low.

In particular the layout of the metal electrodes of the SAW filter can take many forms (e.g. split finger technology), of which the illustrated embodiments describe only the principal operating modes. Furthermore, the geometric layout of the transducers is not limited to the straight-line propagation of the SAW. For better utilisation of the chip surface, the SAW can be deflected by means of high-performance reflectors. The reflection losses arising thereby are small, since maximum reflection by means of periodic structures can easily be achieved.

Furthermore it is possible, in changing the direction of the SAW by means of reflectors, to achieve compression of the signals, in that the reflector structure features a chirp characteristic. In this way it is also possible to form the dispersive IDT from a linear IDT, in that a dispersive reflector is in circuit downstream, such that it compresses the SAW and reflects from the coded arrangement of the non-dispersive IDTs.

We claim:

1. Surface-wave transducer device comprising a combination of a first transmitter device of a dispersive type and a second transmitter device of a non-dispersive type, comprising a multiplicity of n non-dispersive transducers which can be coded or are coded with an identification code, characterized in that at least one of the transducers of the non-dispersive type has a positive electrode, a negative electrode, and first connection lines which connect the positive electrode and the negative electrode to respectively two bus lines, further characterized in that at least one electronic switch is situated in at least one of the connection lines.

2. Surface-wave transducer device according to claim 1, characterised in that the n non-dispersive transducers are connected such that, when excited by a signal, they transmit a signal which identifies the surface-wave transducer device.

3. Surface-wave transducer device according to claim 1, characterised in that the distance between adjacent non-dispersive transducers is the same.

4. Surface-wave transducer device according to claim 1, in which the device reacts to an electromagnetic input signal with an output signal, and the output signal is such that it has at least three different logic states.

5. Surface-wave transducer device according to claim 1, characterised in that on receiving a chirp signal the device produces a multiplicity of pulses which are transmitted as output signals successively in time.

6. Surface-wave transmitter device according to claim 1, characterised in that on receiving a chirp signal the device transmits m pulse signals, where n>=m and m corresponds to the number of n non-dispersive transducers which do not provide any pulse signal.

7. Surface-wave transducer device according to claim 1, characterised in that all the transducers are electrically connected in parallel by means of a programming circuit.

8. Surface-wave transducer device according to claim 1, characterised in that at least one of the n non-dispersive transducers is used as a reference element.

9. Surfacewave transducer device according to claim 1, characterised in that the non-dispersive transducers are arranged only on one side or on both sides of the first transmitter device of the dispersive type.

10. Surface-wave transducer device according to claim 1, characterised in that when an input signal which is a short radio-frequency pulse is received, the dispersive transmitter device converts the signal into a first chirp-type surface wave which propagates in a first direction of the n non-dispersive transducers and, when passing through the non-dispersive transducers, initiates electrical chirp pulses whose superimposition on the two bus lines represents programmed code, whilst over the same period of time the non-dispersive transducers which are likewise excited by the input signal produce a sequence, representing the programmed code, of surface waves whose characteristic is the same as that of the input signal and which propagate in a second direction of the dispersive transmitter device and are converted there into electrical pulses with a chirp-type characteristic which are transmitted synchronously and in phase with the electrical chirp pulses produced by the first chirp-type surface wave of the non-dispersive transducers.

11. Surface-wave transducer device according to claim 1, characterised in that the surface-wave transducer device generates signals which can still be received satisfactorily even at a range of more than 2 m.

12. Surface-wave transducer device according to claim 1, characterised in that a chirp signal, as an input signal, has an approximate duration of 0.5 to 1.5 µs, and in that the chirp signal has an approximate frequency bandwidth of 50 to 250 MHz.

13. Surface-wave transducer device according to claim 1, characterised in that a pulse signal which is generated by the first transmitter device of the dispersive type when a chirp signal is received, has a main pulse duration $T_{SC}$, wherein $$T_{SC} = \frac{2}{B_3}$$

where B is a bandwidth of the chirp signal.

14. Surface-wave transducer device according to claim 1, characterised in that a time between successive pulse signals from the second transmitter device of the non-dispersive type is at least as great as half a duration of a pulse signal generated by the first transmitter device of the dispersive type.

15. Surface-wave transducer device according to claim 1, characterised in that the first transmitter device and the non-dispersive transducer devices are interdigital transducers.

16. Surface-wave transducer device according to claim 1, characterised in that the non-dispersive transducers, when excited by a signal, either produce a signal which is in phase with a reference pulse, or produce a signal which is out of phase with the reference pulse, or produce no signal.

17. Surface-wave transducer device according to claim 1, characterised in that the non-dispersive transducers are programmed or coded by providing a second connection line from one of the two bus lines to a positive or negative electrode of a second non-dispersive transducer, wherein the connection line is bonded.

18. Surface-wave transducer device according to claim 1, further comprising a circuit driver with a memory for controlling the switch, and a power supply device for supplying the circuit driver, the switch, or both the circuit driver and the switch, with energy.

19. Surface-wave transducer device according to claim 1, further comprising a housing including a first, second and third layer arranged one above the other, the first layer and the third layer being a protective layer which has the second layer situated between the first layer and the second layer, the first transmitter device, the non-dispersive transducer devices, and an antenna being formed within the said second layer.

20. Surface-wave transducer device according to claim 1, characterised in that a first set of p non-dispersive transducers is arranged on a first side of the first transmitter device and a second set of q non-dispersive transducers is arranged on a second side of the first transmitter device, in that the first set of p transducers is programmed using a first code and the second set of q transducers is programmed using a second code.

21. The surface-wave-transducer of claim 20, wherein the first code is different from the second code.

22. Surface-wave transducer device according to claim 1, characterised in that the transmitter device of the dispersive type has a programmable length.

23. Surface-wave transducer device according to claim 1, characterised in that the device is coupled to a silicon substrate.

24. Surface-wave transducer device according to claim 1, characterised in that one of the n non-dispersive transducers nearest to the first transmitter device of the dispersive type forms a reference transducer whose first signal is transmitted as a reaction to a second signal from the first transmitter device.

25. Surface-wave transducer device according to claim 1, wherein n>30.

26. Surface-wave transducer device according to claim 1, characterised in that n-k transducers of the n non-dispersive transducers are programmable or programmed, where k<=n.

27. Surface-wave transducer device according to claim 1, characterised in that the surface-wave transducer device can be programmed once or a number of times.

28. Surface-wave transducer device according to claim 27, further comprising a control device coupled to a switching matrix for programming the surface-wave transducer device, a program interface, and a storage device which can store one or more identification codes or any desired data sequence, and in that the surface-wave transducer device can be programmed using the stored data.

29. Surface-wave transducer device according to claims 28, characterised in that the first transmitter device of the dispersive type is formed by a combination of a non-dispersive transducer and a dispersive reflector, wherein a surface wave is reflected onto the non-dispersive transducer device, which comprises a number of transducers.

30. Use of a surface-wave transducer device according to claim 1 for remotely identifying goods, people or animals.

31. A surface-wave transducer device according to claim 1, comprising a data source coupled thereto and which transmits data to the device for the said data to be interrogated by an interrogation unit.

32. The surface-wave transducer device of claim 1, wherein a first of the two bus lines is a positive bus line and a second of the two bus lines is a negative bus line.

33. Surface-wave transducer device according to claim 32, characterised in that each non-dispersive transducer has a positive and a negative electrode and that the positive electrode of the n transducers is locally allocated the positive bus line and the negative electrode of the n transducers is locally allocated the negative bus line, and that a desired coding of the surface-wave transducer device is carried out by selecting a second connection line between the positive electrode of the n transducers and the positive bus line, or a third connection line between the negative electrode of the n transducers and the negative bus line.

34. Surface wave transducer device according to claim 32, characterised in that a positive electrode of the transmitter device of the dispersive type is connected to the positive bus line and a negative electrode of the transducer of the dispersive type is connected to the negative bus line.

35. Surface-wave transducer device according to claim 32, characterised in that the device has an antenna device comprising two parts, the first part of the antenna being connected to the positive bus line and the other part being connected to the negative bus line.

36. Surface-wave transducer device according to claim 32, characterised in that the non-dispersive transducers react to a pulse signal with a dual-phase pulse signal, a phase angle of a particular dual-phase pulse signal depending on whether a positive or negative electrode of an appropriate non-dispersive transducer is connected to the positive or negative bus line.

37. Surface-wave transducer device according to claim 32, characterised in that all activated non-dispersive transducers are connected to the positive bus line by a positive electrode of the activated non-dispersive transducers and to the negative bus line by a negative electrode of the activated non-dispersive transducers.

38. Surface-wave transducer device according to claim 32, characterised in that the non-dispersive transducers are programmed or coded by cutting a second connection line between the positive bus line and either a positive or negative electrode of a second non-dispersive transducer, or a third connection line between the negative bus line and either the positive or negative electrode of the second non-dispersive transducer.

39. Surface-wave transducer device according to claim 32, characterised in that each electrode of a non-dispersive transducer has a second and a third connection, wherein the second connection is arranged close to the positive bus line and the third connection is arranged close to the negative bus line.

40. Surface-wave transducer device according to claim 39, characterised in that the transducers of the non-dispersive type are programmed or coded by arranging the non-dispersive transducers to be unconnected to the two bus lines on a bottom plate, and in that the bottom plate has a top plate arranged on it whose side associated with the bottom plate has second connection lines arranged on it which, as desired, connect positive or negative electrodes of the non-dispersive transducers to the positive or negative bus line.

41. The surface transducer of claim 1, wherein the switch is a transistor.

42. The surface-wave transducer of claim 1, wherein the non-dispersive transducers are coded by controlling the switch.

43. Surface-wave transducer device according to claim 1, characterized in that a time between successive pulse signals from the second transmitter device of the non-dispersive type is a multiple of the duration of an individual pulse generated by the first transmitter device of the dispersive type.

44. An identification system comprising:
  an interrogator having a receiver unit and a transmitter unit; and
  a surface-wave transducer device in communication with the interrogator, the surface-wave transducer device comprising a combination of a first transmitter device of a dispersive type and a second transmitter device of a non-dispersive type, comprising a multiplicity of n non-dispersive transducers which can be coded or are coded with an identification code, characterized in that the surface wave transducer device has a first set of p non-dispersive transducers on a first side of the dispersive transmitter, and a second set of q non-dispersive transducers on a second side, electrodes of the dispersive transmitter being connected to an antenna and to the two bus lines of the first and of the second set of non-dispersive transducers, in that the first set of non-dispersive transducers is programmed using a first code and the second set of non-dispersive transducers is programmed using a second code, also characterized in that both the transmitter and receiver units of the interrogator contain a first stage with a same characteristic as the dispersive transmitter, and a second stage with an appropriately inverse characteristic, further characterized in that the transmitter unit transmits an interrogation signal comprising an up-chirp signal or a down-chirp signal which is received via the antenna and converted by the dispersive transmitter into two surface waves which propagate in opposite directions, one of which surface waves, depending on the chirp characteristic of the interrogation signal, contains a compressed pulse signal, so that only one of the two sets of non-dispersive transducers is excited, whilst, over a same period of time, both sets of non-dispersive transducers, excited by the interrogation signal, each transmit a surface-wave signal, comprising a series, identifying the relevant code, of surface waves, in a direction of the dispersive transmitter, one of the surface-wave signals being compressed in the dispersive transducer and converted into an electrical code signal, which produces an output signal on the two bus lines which, depending on the chirp characteristic of the interrogation signal, either represents the first code or the second code, and is transmitted via the antenna to the receiver unit of the interrogator.

45. The system according to claim 44, characterised in that the interrogator transmits the interrogation signal and receives and analyses a response signal returned by the surface-wave transducer device.

46. The system according to claim 44, characterized in that the interrogator is connected to a data processing system and outputs codes in the output signal received from the surface-wave transducer device at its output.

47. The system according to claim 44, characterized in that the interrogator has means for phase discrimination.

48. The system according to claim 44, characterized in that the interrogation signal is a chirp signal or a radio-frequency pulse.

49. The system according to claim 44 wherein the interrogation signal from the interrogator is a short radio-frequency pulse so that the interrogation signal transmitted by the interrogator and received via the antenna is converted by the dispersive transmitter into two chirp-type surface waves which propagate in opposite directions, have complementary characteristics and which each initiate a code signal having different codings and likewise different chirp characteristics when the first or second set of p or q transducers is reached, so that both sets of non-dispersive transducers each transmit a series, carrying a relevant code, of surface waves in a direction of the dispersive transmitter as a reaction to the interrogation signal, these surface waves being converted by the dispersive transmitter into code signals having different chirp characteristics, which produces an output signal, carrying the two codes, on the two bus lines, which comprises up-chirp pulses, which represent the first code, and down-chirp pulses, which represent the second code, and in that the output signal produced on the two bus lines is transmitted via the antenna to the receiver unit of the interrogator and is converted at the receiver unit by the dispersive stages having complementary characteristics into a first sequence representing the first code, a second sequence representing the second code, or both, of radio-frequency pulses.

50. The system according to claim 44, characterised in that the surface-wave transducer device is an integral component of the system.

51. An identification system comprising:
an interrogator having a receiver unit and a transmitter unit; and
a surface-wave transducer device in communication with the interrogator, the surface-wave transducer device comprising a first transmitter device of a dispersive type, and a second transmitter device of a non-dispersive type comprising a multiplicity of n non-dispersive transducers which are coded with an identification code, characterized in that at least one of the transducers of the non-dispersive type has a positive electrode, a negative electrode, and first connection lines which connect the positive electrode and the negative electrode to respectively two bus lines, further characterized in that at least one electronic switch is situated in at least one of the connection lines.

52. The system of claim 51, wherein the n non-dispersive transducers are configured to transmit a signal which identifies the surface-wave transducer device when excited by a signal.

53. The system of claim 51, wherein a first of the two bus lines is a positive bus line and a second of the two bus lines is a negative bus line.

54. The system of claim 53, wherein each non-dispersive transducer has a positive and a negative electrode and that the positive electrode of the n transducers is locally allocated the positive bus line and the negative electrode of the n transducers is locally allocated the negative bus line, and that a desired coding of the surface-wave transducer device is carried out by selecting a second connection line between the positive electrode of the n transducers and the positive bus line, or a third connection line between the negative electrode of the n transducers and the negative bus lines.

55. The system of claim 51, characterised in that when an input signal which is a short radio-frequency pulse is received, the dispersive transmitter device converts the signal into a first chirp-type surface wave which propagates in a first direction of the n non-dispersive transducers and, when passing through the non-dispersive transducers, initiates electrical chirp pulses whose superimposition on the two bus lines represents programmed code, whilst over the same period of time the non-dispersive transducers which are likewise excited by the input signal produce a sequence, representing the programmed code, of surface waves whose characteristic is the same as that of the input signal and which propagate in a second direction of the dispersive transmitter device and are converted there into electrical pulses with a chirp-type characteristic which are transmitted synchronously and in phase with the chirp pulses produced by the first surface wave of the non-dispersive transducers.

56. The system of claim 51, characterised in that a first set of p non-dispersive transducers is arranged on a first side of the transmitter device of the dispersive type and a second set of q non-dispersive transducers is arranged on a second side of the transmitter device of the dispersive type, in that the first set of p transducers is programmed using a first code and the second set of q transducers is programmed using a second code.

57. The system of claim 56, wherein the first code is different from the second code.

* * * * *